US008075810B2

(12) United States Patent  (10) Patent No.: US 8,075,810 B2
Kawasaki  (45) Date of Patent: Dec. 13, 2011

(54) PROCESS FOR PRODUCING MICROLENS

(75) Inventor: Takayuki Kawasaki, Matsubara (JP)

(73) Assignee: Sharp Kabushiki Kaisha, Osaka (JP)

( * ) Notice: Subject to any disclaimer, the term of this patent is extended or adjusted under 35 U.S.C. 154(b) by 378 days.

(21) Appl. No.: 12/227,190

(22) PCT Filed: Mar. 6, 2007

(86) PCT No.: PCT/JP2007/054275
§ 371 (c)(1),
(2), (4) Date: Nov. 10, 2008

(87) PCT Pub. No.: WO2007/132584
PCT Pub. Date: Nov. 22, 2007

(65) Prior Publication Data
US 2009/0121371 A1 May 14, 2009

(30) Foreign Application Priority Data
May 12, 2006 (JP) ................. 2006-134075

(51) Int. Cl.
B29D 11/00 (2006.01)
(52) U.S. Cl. ............... 264/1.7; 216/26; 264/2.7
(58) Field of Classification Search ............ 264/1.1, 264/1.7, 2.7; 425/808; 216/24, 26
See application file for complete search history.

(56) References Cited

U.S. PATENT DOCUMENTS

| 5,321,297 | A | 6/1994 | Enomoto | |
| 6,950,140 | B2* | 9/2005 | Fukuyoshi et al. | 348/340 |
| 6,979,588 | B2 | 12/2005 | Jeong et al. | |
| 7,259,915 | B2 | 8/2007 | Kwon et al. | |
| 2001/0009442 | A1* | 7/2001 | Fukuyoshi et al. | 348/335 |

FOREIGN PATENT DOCUMENTS

| JP | 05-21770 | 1/1993 |
| JP | 07-113983 | 5/1995 |
| JP | 08-288481 | 11/1996 |
| JP | 2000-260970 | 9/2000 |
| JP | 2002-033466 | 1/2002 |
| JP | 2004-235635 | 8/2004 |
| JP | 2005-115175 | 4/2005 |
| JP | 2005-346065 | 12/2005 |

* cited by examiner

Primary Examiner — Mathieu D. Vargot
(74) Attorney, Agent, or Firm — Edwards Wildman Palmer LLP; David G. Conlin; David A. Tucker

(57) ABSTRACT

In a microlens formation step, the portions of a lens material film (32) supported on elevations (BG) are melted by heat so that part of the lens material film (32) flows into trenches (DH); thus, the shape of the portions of the lens material film (32) supported on the elevations (BG) is so changed as to be formed into microlenses (MS).

11 Claims, 34 Drawing Sheets

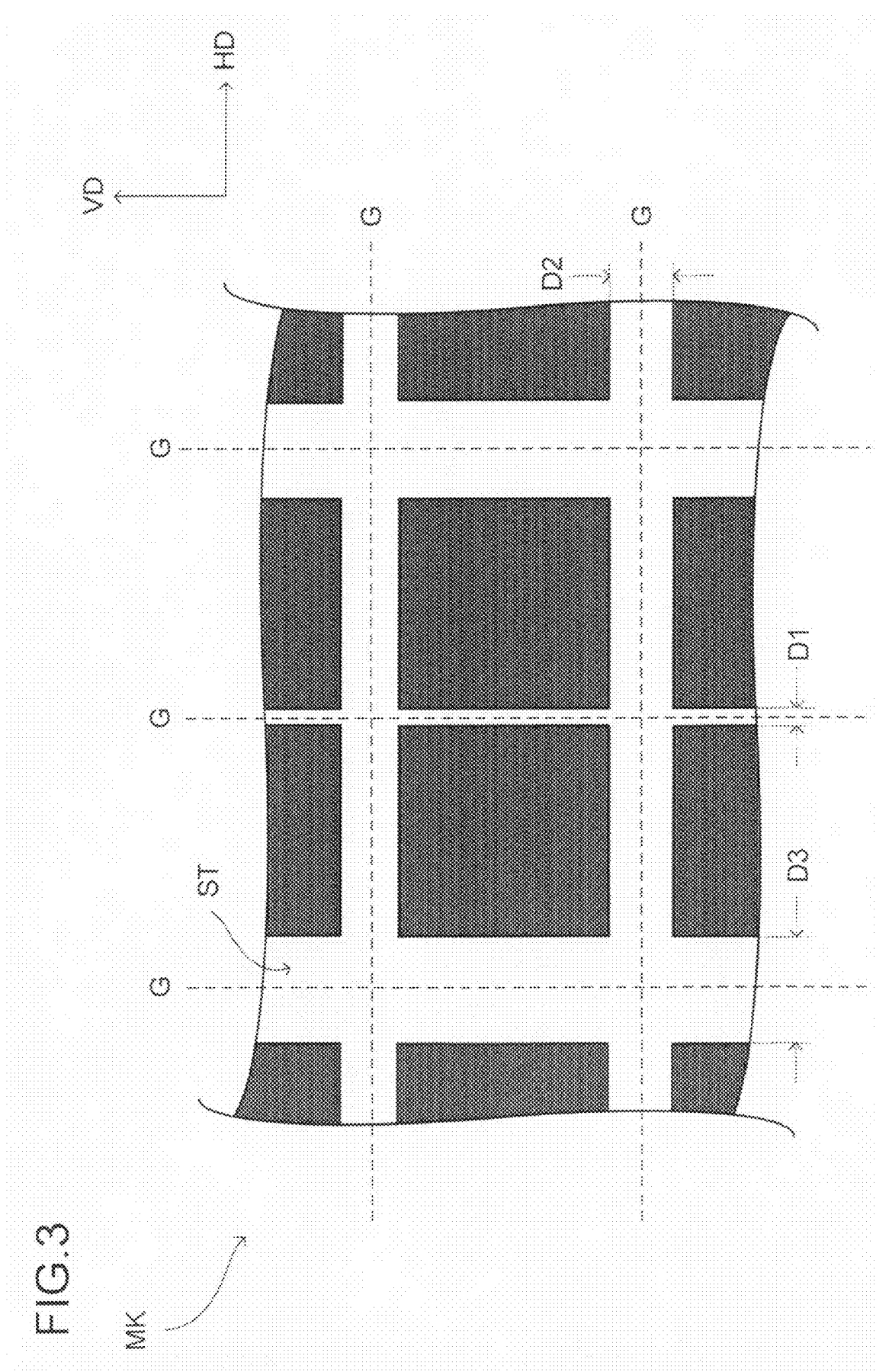

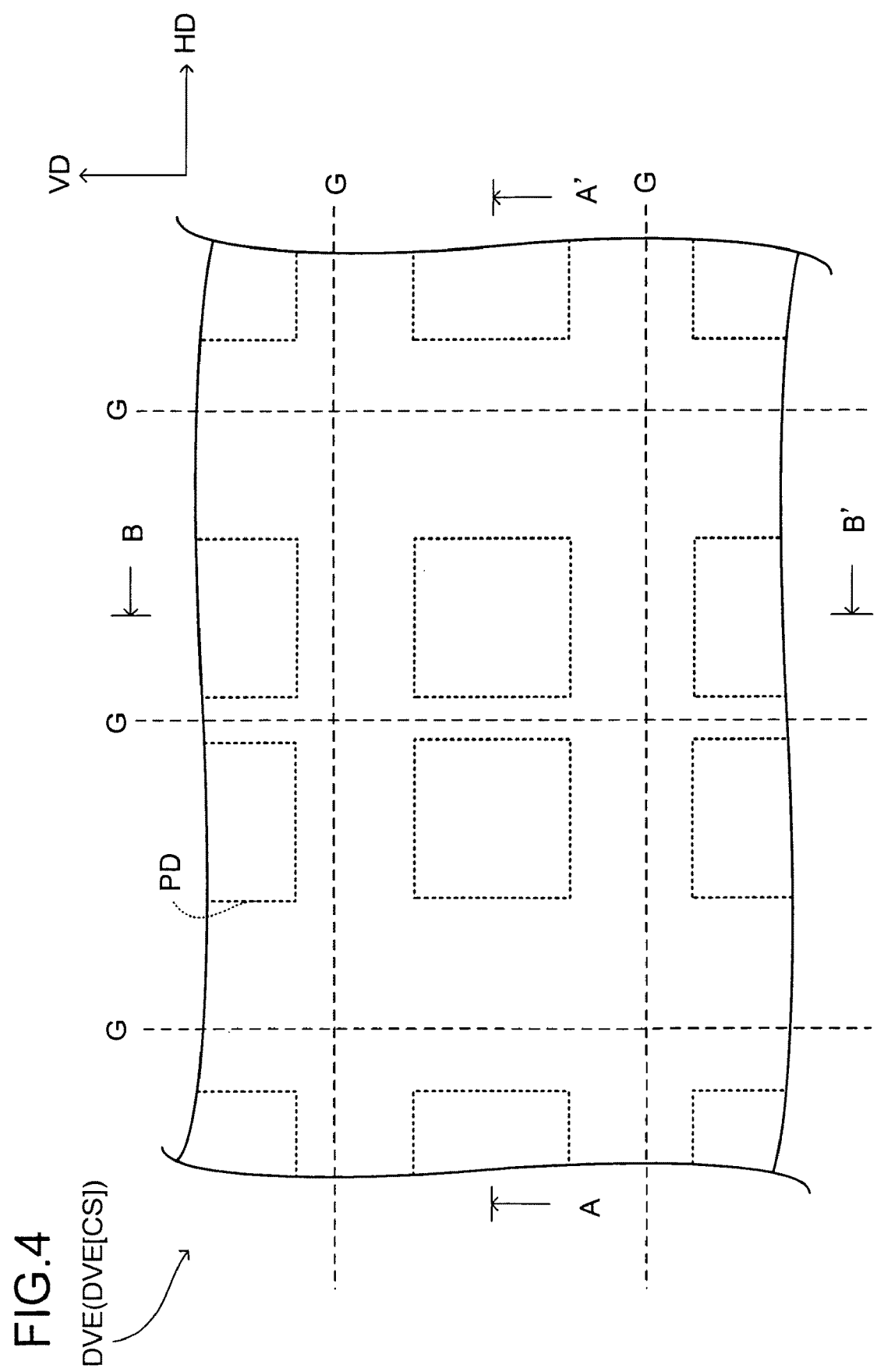

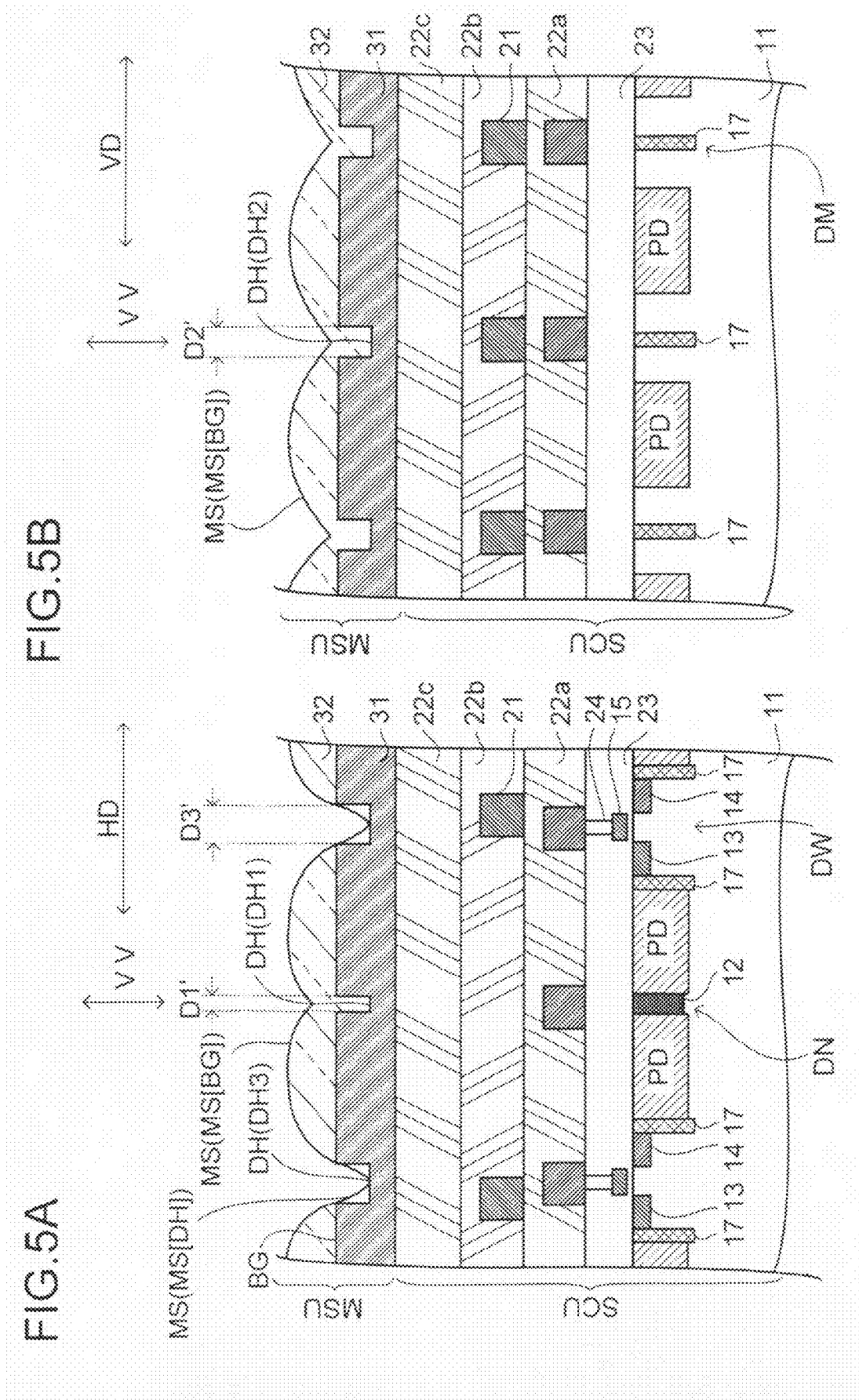

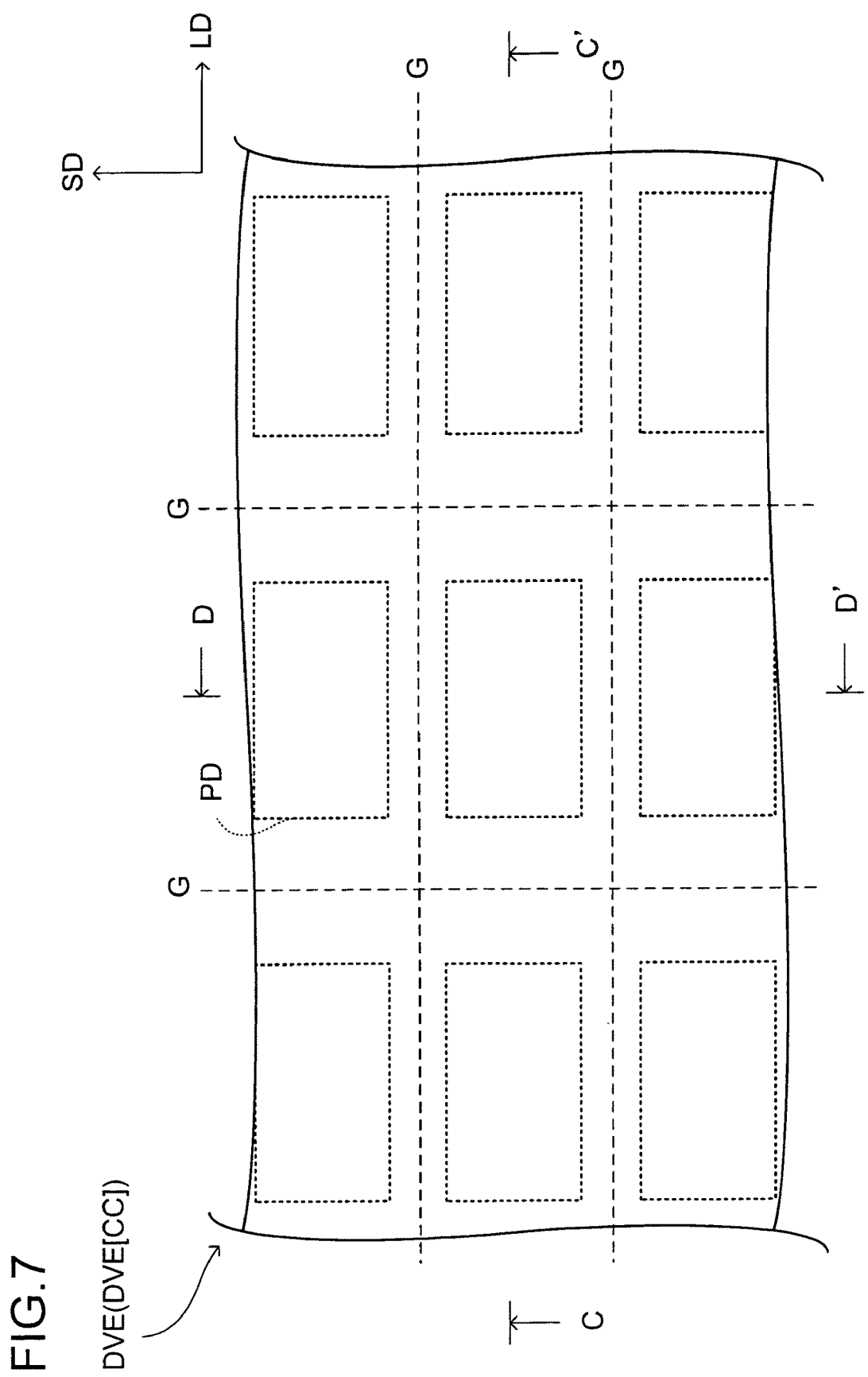

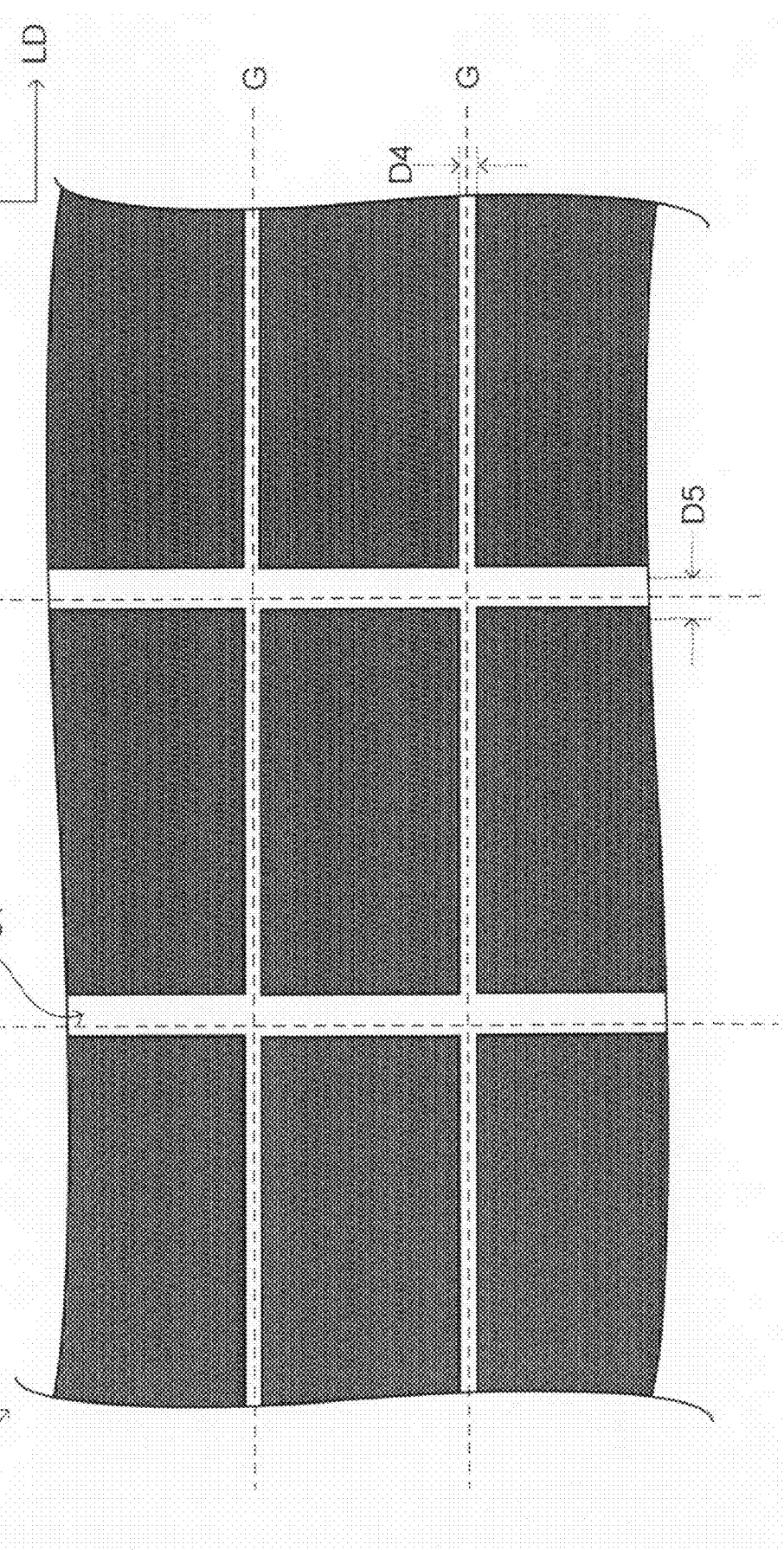

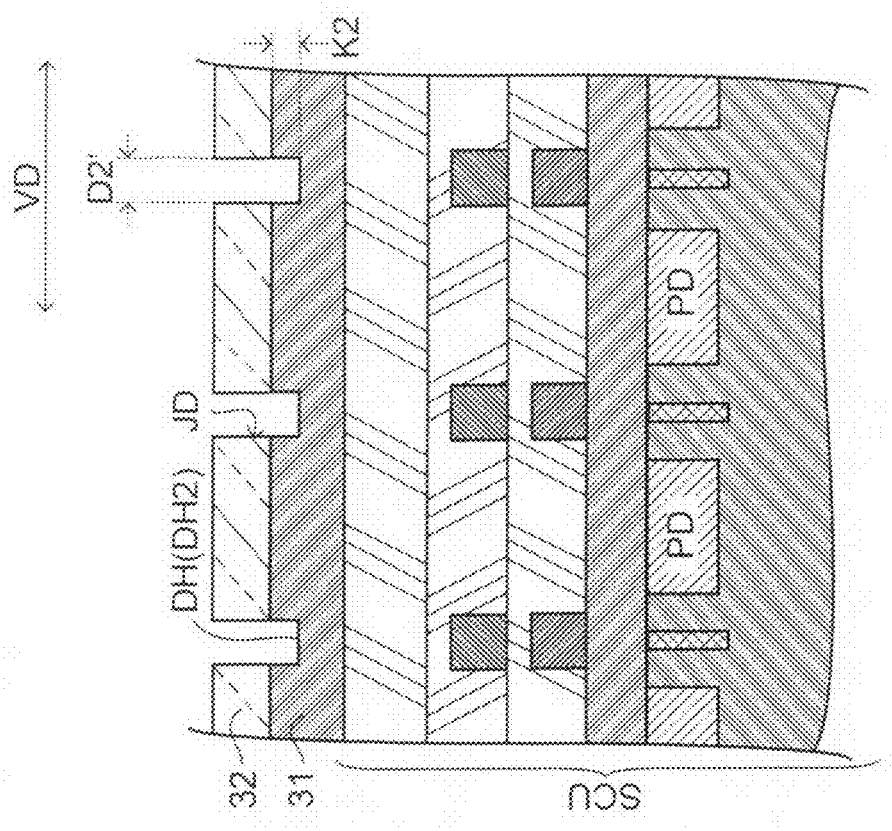
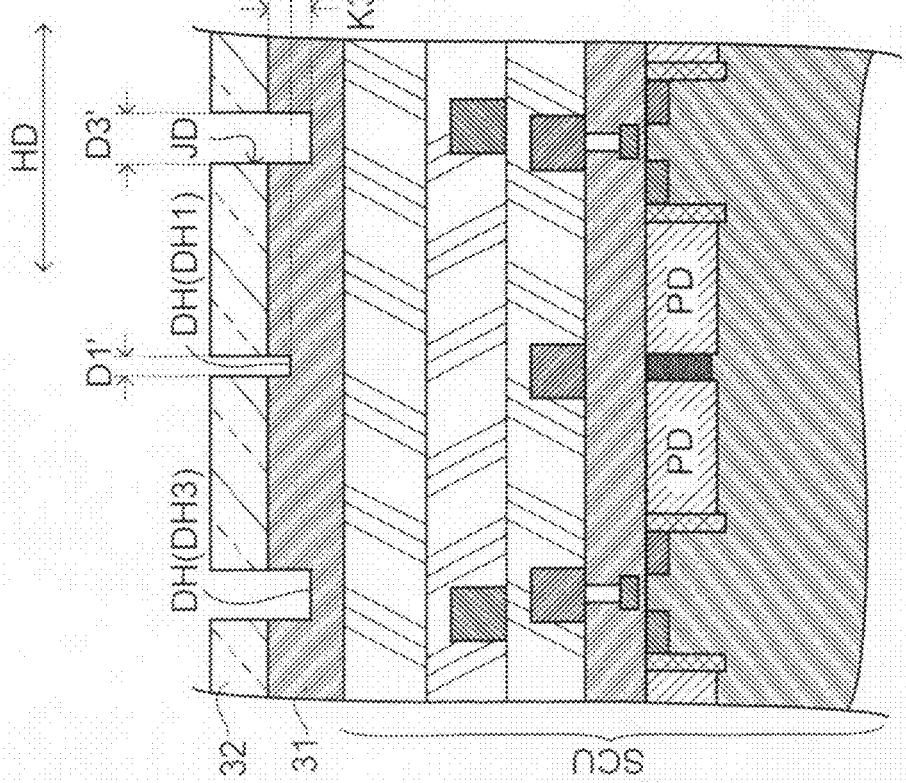

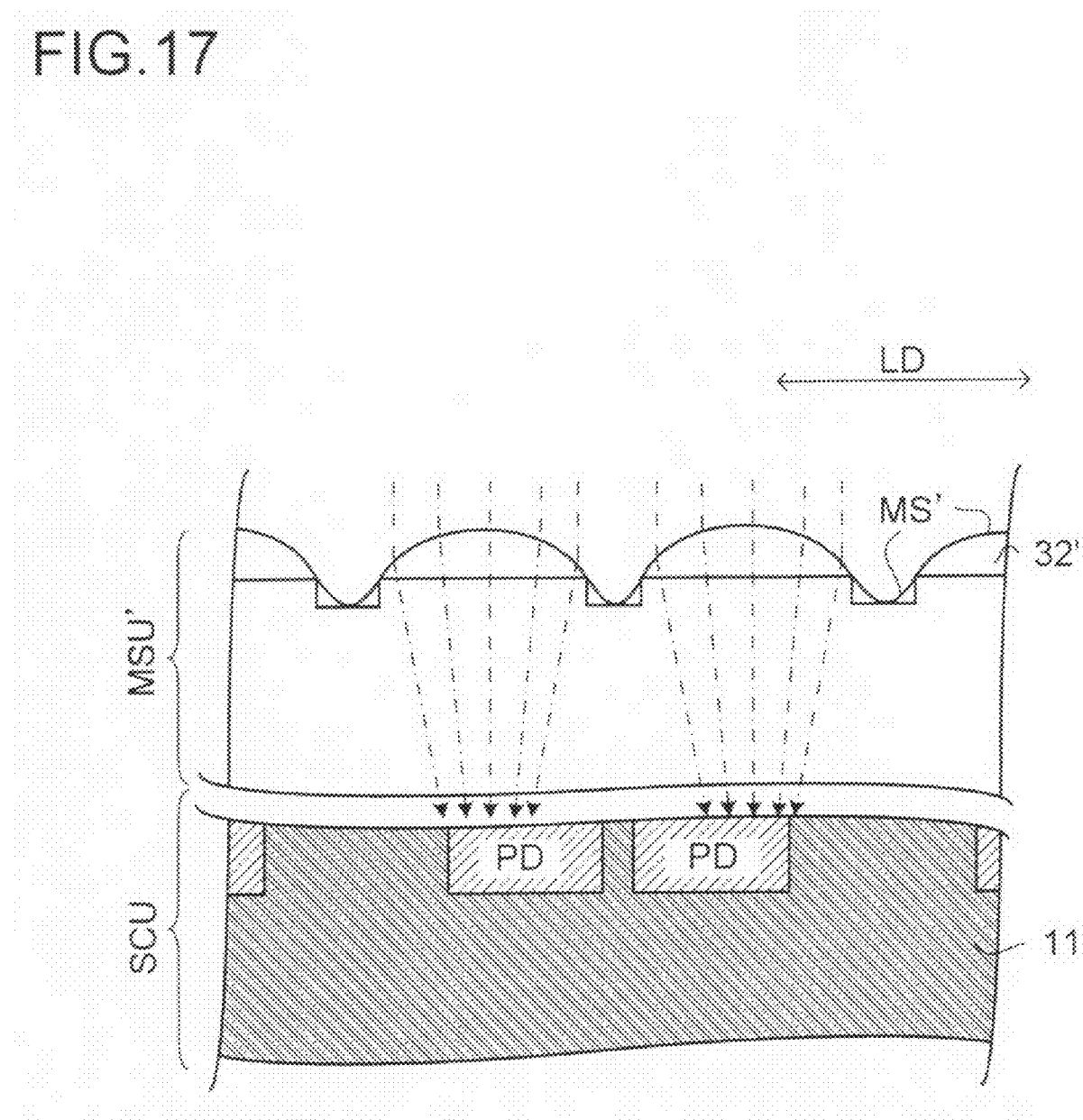

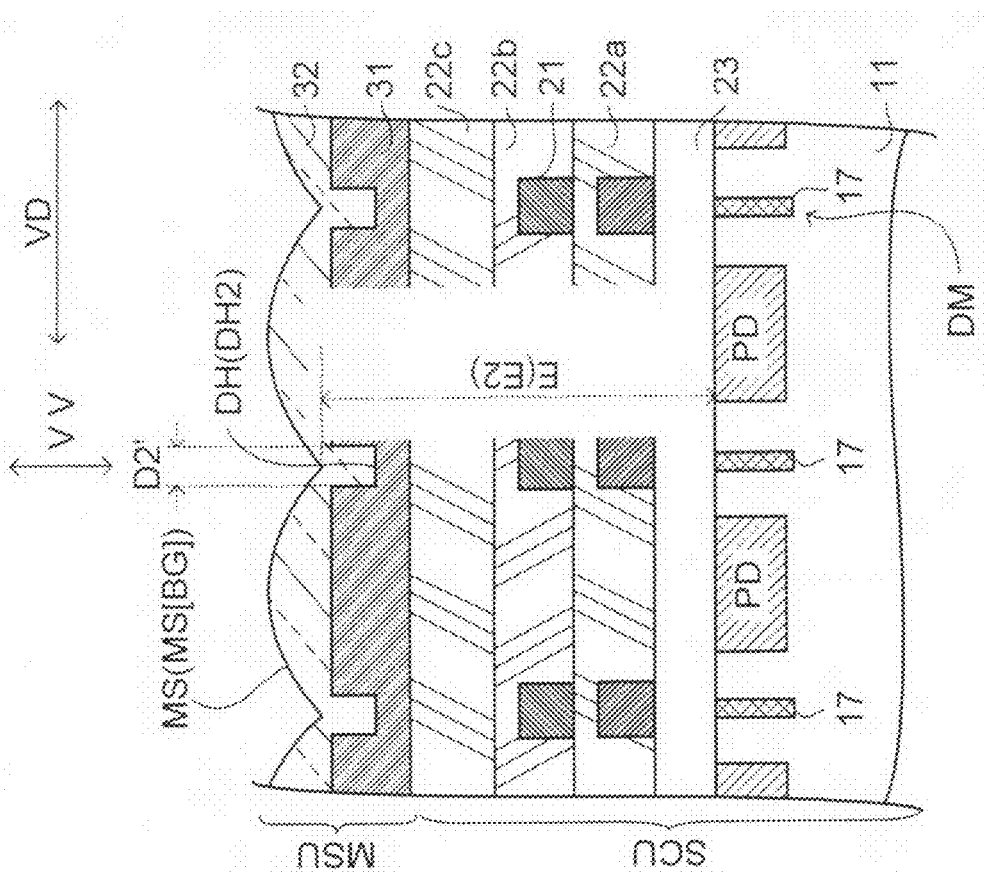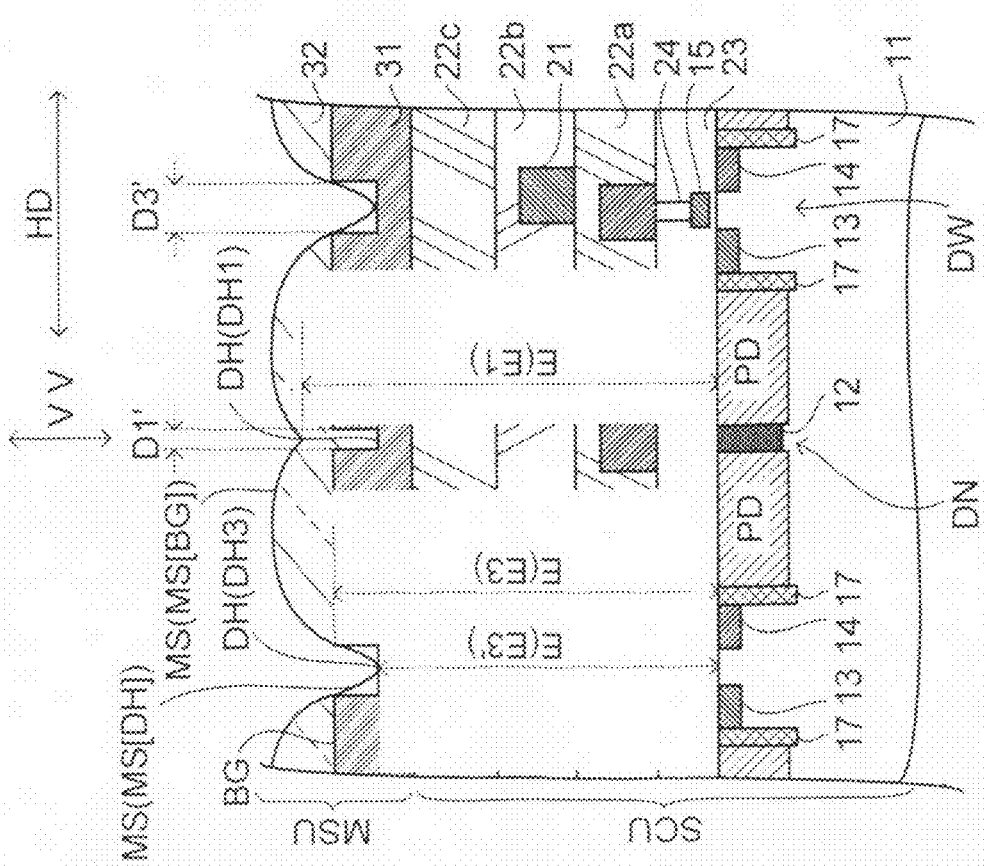

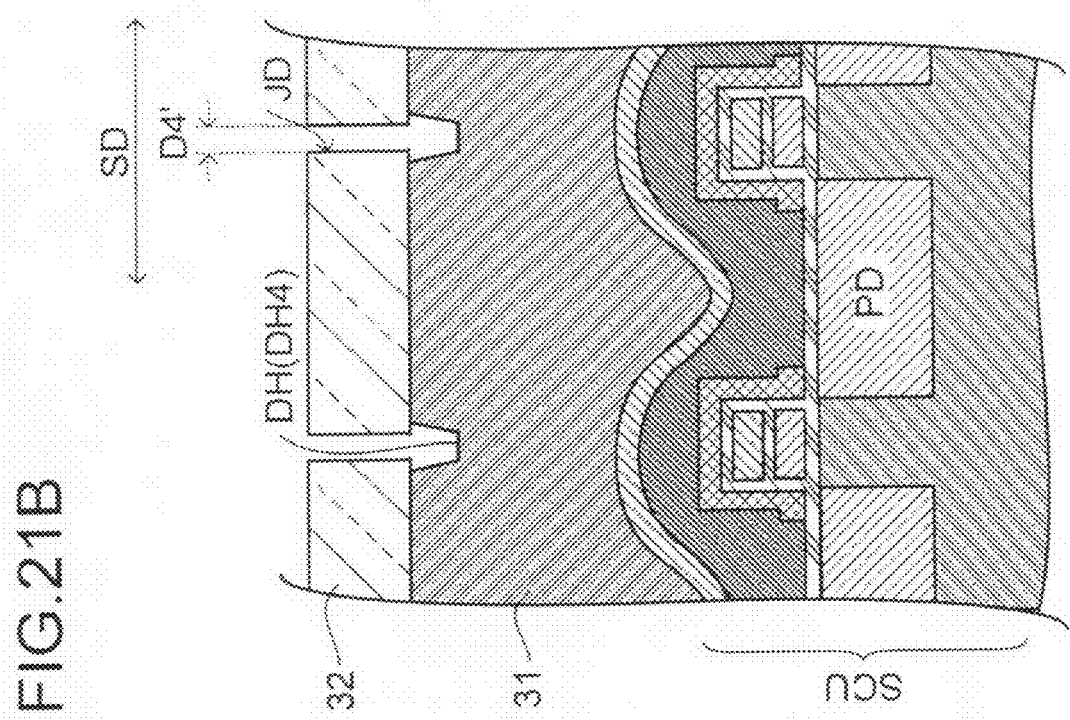
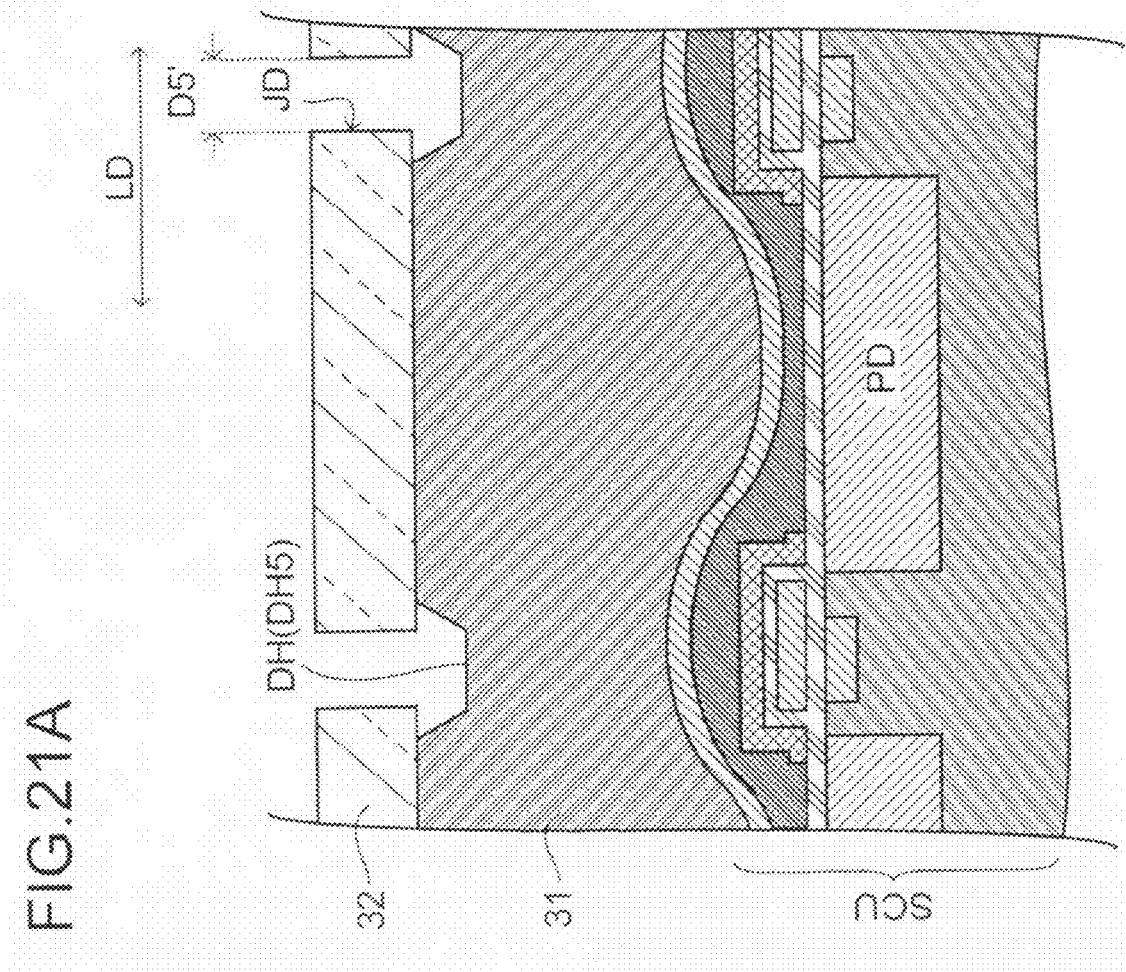

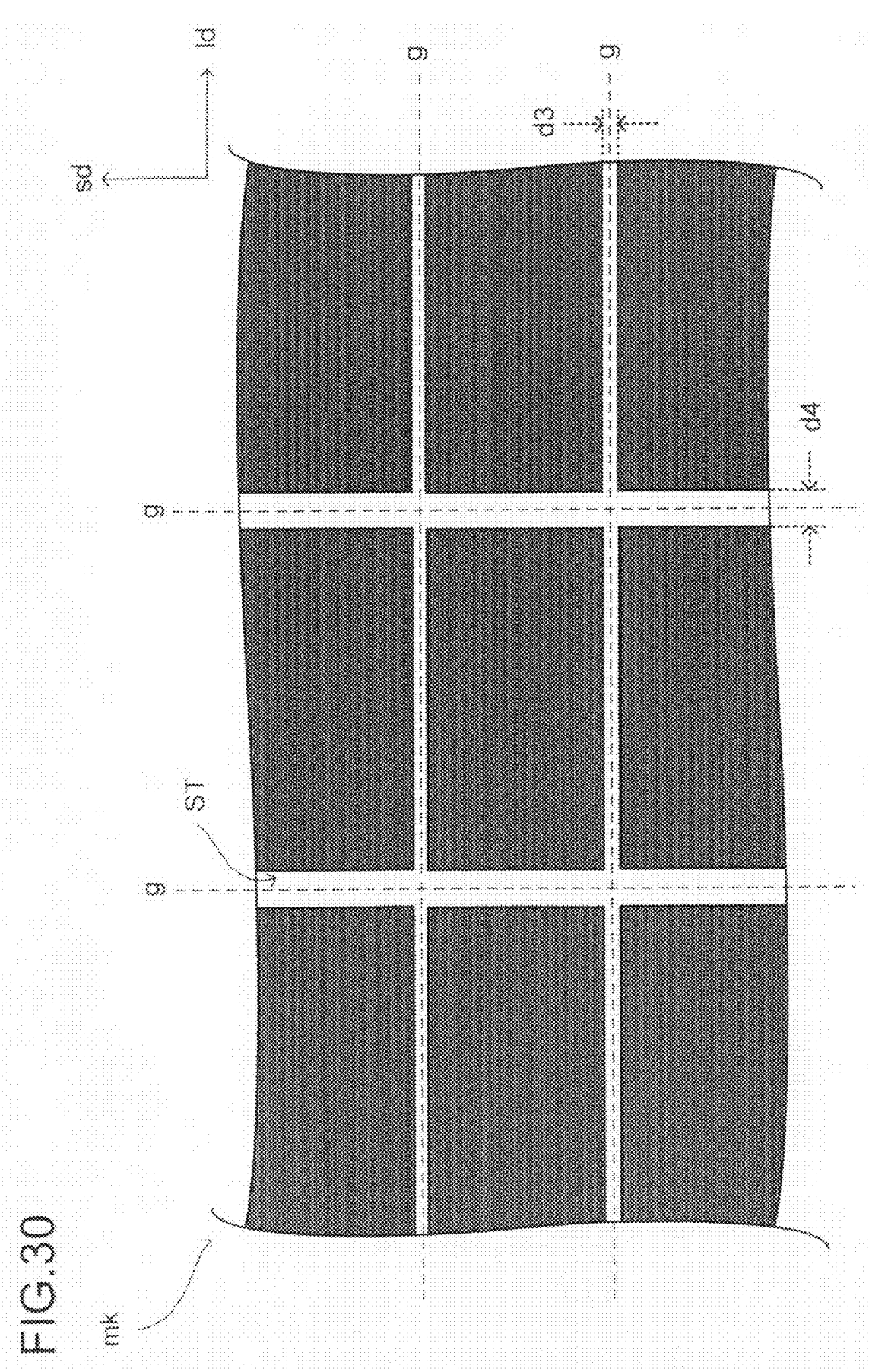

PROCESS FOR PRODUCING MICROLENS

TECHNICAL FIELD

The present invention relates to an image sensor or the like provided with a lens layer having microlenses. More specifically, the invention relates to a method for forming a lens layer included in an image sensor or the like into microlenses (a method for fabricating microlenses).

BACKGROUND ART

The background art will be described below with reference to the relevant drawings. Not every drawing shows all the reference numerals or symbols of the parts appearing in it, in which case reference is requested to be made to other drawings. For easy understanding, hatching may be omitted.

Typically, an image sensor converts light into electrical signals. To achieve that, as shown in a plan view in FIG. 22, an image sensor dve includes photodiodes pd for detecting light (broken lines g represent the borders between pixels). The larger the amount of light detected by the photodiodes pd is, the higher the sensitivity (performance) of the image sensor dve advantageously is.

However, there is a limit to enlarging the light-receiving portions of photodiodes pd in a small image sensor dve. This is the reason that various image sensors dve have been developed that are provided with microlenses that condense light on photodiodes pd. In FIG. 22, the microlenses are so formed that each of them is approximately as large as one pixel demarcated by broken lines g. Thus, the image sensor dve has cross-sections as shown in FIGS. 23A and 23B (cross-sectional views along lines P-P' and Q-Q' shown in FIG. 22). For the sake of convenience, on the pixel surface, the direction of the longer sides of the pixels is called the longer-side direction ld, and the direction of their shorter sides is called the shorter-side direction sd.

[First Fabrication Method]

The image sensor dve shown in FIGS. 22, 23A, and 23B is fabricated by the use of a mask mk having slits st as shown in FIG. 24 (the slit width is represented by d1). Now, this fabrication method will be described in detail with reference to FIGS. 25A to 25D. FIGS. 25A and 25C show a cross-section along line P-P' shown in FIG. 22 (i.e., these are cross-sectional views of the image sensor dse along the longer-side direction ld, and FIGS. 25B and 25D show a cross-section along line Q-Q' shown in FIG. 22 (i.e., these are cross-sectional views of the image sensor dse along the shorter-side direction sd.

As shown in FIGS. 25A and 25B, the image sensor dve includes a substrate unit scu including photodiodes pd. Over the substrate unit scu, a flattening film 131 is formed, and, further above, a lens material film 132 is formed as the material of microlenses ms (the flattening film 131 and the lens material film 132 are collectively called the microlens unit msu). The flattening film 131 is exposed through the mask mk and is then developed so that ditches (removed ditches) jd are formed in the flattening film 131. As shown in FIGS. 25C and 25D, the lens material film 132 having the removed ditches jd formed in it is then subjected to heat treatment and is thereby softened and melted. This causes the lens material film 132 to flow into the removed ditches jd, and thereby microlenses ms is formed.

However, with this fabrication method, in a case where the longer-side and shorter-side dimensions of each pixel differ, the microlenses ms come to have different curvatures in the longer-side and shorter-side directions ld and sd. This is because the flowing behavior of the lens material film 132 softened and melted depends on the distances over which it flows (i.e., the dimensions of the microlenses ms in the longer-side and shorter-side directions ld and sd).

When the microlenses ms are formed with different curvatures in the longer-side and shorter-side directions ld and sd, for example, a phenomenon as shown in FIGS. 26A and 26B (the optical path diagrams of the image sensor dse shown in FIGS. 23A and 23B) occurs. Superficially, while the light that passes through the curved surface of the microlenses ms corresponding to the longer-side direction ld is condensed on the photodiodes pd, the light that passes through the curved surface of the microlenses ms corresponding to the shorter-side direction sd is condensed in front of the light-receiving surface of the photodiodes pd. When this phenomenon occurs, the amount of light received by the photodiodes pd lowers, and thus the sensitivity of the image sensor dse lowers.

[Second Fabrication Method]

One way to overcome this problem is to adopt a fabrication method that uses a mask mk as shown in FIG. 27 (Patent Document 1). In this mask mk, the slit width d2 corresponding to the intervals between the shorter sides of the pixels is made comparatively large, no slit width is secured that corresponds to the intervals between the longer sides of the pixels, except that cuts ct are formed in the portions of the mask mk corresponding to the corners of the pixels. When the image sensor dse is fabricated by the use of this mask mk, the fabrication process is as shown in FIGS. 28A to 28D.

FIGS. 28A and 28C are cross-sectional views of the image sensor dse along the longer-side direction ld of the pixels, and FIGS. 28B and 28D are cross-sectional views of the image sensor dse along the shorter-side direction sd of the pixels.

As shown in FIG. 28A, the lens material film 132 is exposed to the light that has passed through the slit width d2 and is then developed so that removed ditches jd are formed in the lens material film 132 in the longer-side direction ld of the pixels. The lens material film 132 having the removed ditches jd formed in it is then subjected to heat treatment and is thereby softened and melted so that curved-surfaces are formed in the longer-side direction ld of the pixels (see FIG. 28C).

On the other hand, as shown in FIG. 28B, no removed ditches are formed in the lens material film 132 in the shorter-side direction sd. However, openings (unillustrated) corresponding to the cuts ct in the mask mk are formed in the lens material film 132, and the lens material film 132 flows into those openings; this produces curved surfaces in the shorter-side direction sd of the pixels (see FIG. 28D).

That is, according to the fabrication method of Patent Document 1, by adjusting the slit width d2 and the size of the cuts ct, the flowing behavior of the lens material film 132 in the longer-side and shorter-side directions ld and sd of the microlenses ms, and hence the curvature of the microlenses ms, is adjusted. However, since the slit width d2 is made comparatively large, the longer sides of the microlenses ms are shorter than the longer sides of the pixels. This produces, as shown in FIG. 28C, regions (non-lens regions na) where no microlenses ms are formed on the flattening film 131, and it is difficult to direct the light incident on these regions to the photodiodes pd. Consequently, an image sensor dse fabricated by this method cannot be said to have high sensitivity.

[Third Fabrication Method]

One way to fabricate an image sensor dse without producing non-lens regions is to adopt the fabrication method of Patent Document 2 shown in FIGS. 29A to 29G. According to this fabrication method, first, a resist film 133 having a ditch pattern pt is formed over a flattening film 131 (see FIG. 29A), and then etching is performed so that trenches dh corresponding to the ditch pattern pt are formed in the flattening film 131 (see FIG. 29B; the first patterning).

According to this fabrication method, thereafter, the resist film 133 is removed; then a lens material film 132 is formed over the flattening film 131 and is then exposed by the use of a mask mk having slits st whose width is larger than the width of the ditch pattern pt (it, the width of the trenches dh) (see FIG. 29C). Through development, removed ditches jd are formed in the lens material film 132 so as to correspond to the trenches dh in the flattening film 131 (see FIG. 29D; the second patterning).

What is to be noted here is that, because of the width (slit width) of the slits st, the removed ditches jd have a width larger than that of the trenches dh. Thus, between the bottom of the trenches dh and the surface of the lens material film 132, steps are left that are formed by the side walls of the trenches dh and the surface of the flattening film 131. Then, when the lens material film 132 is softened and melted, how the lens material film 132 in liquid phase flows depends on its surface tension and those steps. As a result, as shown in FIG. 29E, microlenses ms (main microlenses, which are convex lenses) are formed that have their edges on those steps.

Then, to prevent the trenches dh shown in FIG. 29E from producing non-lens regions, a lens material film 132 is formed anew and is then patterned (the third patterning) so that the lens material film 132 is left in the trenches dh (see FIG. 29F). When this lens material film 132 is softened and melted, as shown in FIG. 29G, microlenses ms (sub microlenses, which are concave lenses) are formed also in the trenches dh. Thus, according to the fabrication method of Patent Document 2, an image sensor dse free from non-lens regions is fabricated.

[Fourth Fabrication Method]

Another way to fabricate an image sensor dse without producing non-lens regions is to adopt a fabrication method employing, for example, a mask mk as shown in FIG. 30. In this mask mk, the slit width d4 corresponding to the intervals between the shorter sides of the pixels and the slit width d3 corresponding to the intervals between the longer sides of the pixels are made different (d3<d4). An image sensor dse fabricated by the use of this mask mk is as shown in FIGS. 31A to 31D. FIGS. 31A to 31D are drawn on the same principles of representation as FIGS. 28A to 28D.

As shown in FIGS. 31A and 31B, the lens material film 132 is exposed to the light that has passed through the slit widths d3 and d4 and is then developed so that removed ditches jd corresponding to the longer-side and shorter-side directions ld and sd of the pixels are formed in the lens material film 132. The lens material film 132 having the removed ditches jd formed in it is then subjected to heat treatment and is thereby softened and melted so that curved surfaces are formed in the longer-side and shorter-side directions ld and sd of the pixels (see FIGS. 31C and 31D).

Here, the width of the removed ditches jd formed to correspond to the slit width d3 is so adjusted that, in the longer-side direction ld, the edges of the microlenses ms are continuous, while making contact with the surface of the flattening film 131 (see FIG. 31C). On the other hand, the width of the removed ditches jd formed to correspond to the slit width d4 is so adjusted that, in the shorter-side direction sd, the edges of the microlenses ms are continuous, while being displaced above the surface of the flattening film 131 (see FIG. 31D). Thus, an image sensor dse is fabricated whose microlenses ms have different curvatures in the longer-side and shorter-side directions ld and sd and that is free from non-lens regions.

[Fifth Fabrication Method]

Also by the fabrication method of Patent Document 3, which uses a mask mk as shown in FIG. 32, an image sensor dse is fabricated that has microlenses ms as shown in FIGS. 31C and 31D. That is, an image sensor dse that is free from non-lens regions is fabricated.

[Sixth Fabrication Method]

One way to fabricate an image sensor dse that is free from non-lens regions and that allows fine adjustment of curvatures is to adopt the fabrication method shown in FIG. 33. FIGS. 33A, 33C, and 33E are cross-sectional views of the image sensor dse along the longer-side direction ld of the pixels, and FIGS. 33B, 33D, and 33F are cross-sectional views of the image sensor dse along the shorter-side direction sd of the pixels.

According to this fabrication method, after a photosensitive resist film 133 is formed over the lens material film 132, the lens material film 132 is exposed through the mask shown in FIG. 30, and is then subjected to heat treatment A(see FIGS. 33A and 33B). Thus, as shown in FIGS. 33C and 33D, the resist film 133 is formed into the shape of microlenses. Then, dry etching is performed, with the etching rates for the resist film 133 and the lens material film 132 so adjusted that the selection ratio is approximately "1". This causes the microlens ms shape of the resist film 133 to be transferred to the lens material film 132.

According to this fabrication method, by setting the selection ratio (the ratio between the etching rates for the resist film 133 and the lens material film 132) slightly greater than "1", it is possible to transfer the shape of microlenses ms to the lens material film 132 while varying the curvature of the microlens ms shape of the resist film 133 (see FIGS. 33E and 33F). Thus, also according to this fabrication method, an image sensor dse is fabricated whose microlenses ms have different curvatures in the longer-side and shorter-side directions ld and sd and that is free from a non-lens regions.

[Patent Publication 1] JP-A-H7-113983 (the second fabrication method above)

[Patent Publication 2] JP-A-2000-260970 (the third fabrication method above)

[Patent Publication 3] JP-A-H8-288481 (the fifth fabrication method above)

DISCLOSURE OF THE INVENTION

Problems to be Solved by the Invention

As described above, there are various fabrication methods for fabricating an image sensor dse. In these fabrication methods, the shape of the microlenses ms is determined by, at least, the following parameters:

In the first to fifth fabrication method:
(1) The thickness of the lens material film 132;
(2) The width of the removed ditches jd formed in the lens material film 132;
(3) The conditions (temperature etc.) under which the lens material film 132 is subjected to heat treatment; and
(4) The material of the lens material film 132.

In the sixth fabrication method:
(1) The thickness of the lens material film 132;
(2) The width of the ditches (resist ditches) formed in the lens material film 132;
(3) The conditions (temperature etc.) under which the lens material film 132 is subjected to heat treatment;

(4) The material of the lens material film 132; and
(5) The etching rate.

According to general belief, forming the lens material film 132 thick helps make the curvature of the microlenses ms sharper; reducing the width of the removed ditches jd (in the case of the sixth fabrication method, the resist ditches formed in the resist film 133) helps make the curvature of the microlenses ms gentler.

However, adjusting the curvature of the microlenses ms in a particular direction (e.g., in the longer-side direction ld or the shorter-side direction sd) cannot be coped with otherwise than by adjusting the width of the removed ditches jd (or the resist ditches). This is because the parameters (1) and (3) to (5) listed above simply change the characteristics of the lens material film 132 itself.

Thus, the width of the removed ditches jd (or the resist ditches) needs to be set extremely accurately. For example, in the fourth fabrication method described above, if the width of the removed ditches jd is excessively large as shown in FIG. 34A, there may be left gaps (i.e., non-lens regions na) between the microlenses ms (see FIG. 34C); by contrast, if the width of the removed ditches jd is excessively small as shown in FIG. 34B, the microlenses ms may have so gentle a curvature that the lens surface may be too flat (see FIG. 34D).

In the fabrication of an image sensor dse, slight fabrication errors are inevitable. This may cause the removed ditches jd (or the resist ditches in the resist film 133) to have a width different than desired. Thus, when the curvatures of the microlenses ms in, for example, the longer-side and shorter-side directions ld and sd are adjusted by the fourth to sixth fabrication methods, fabrication errors tend to make it difficult to obtain desired curvatures.

An object of the present invention is to provide a method for fabricating microlenses having desired curvatures. More specifically, it is an object of the present invention
  to provide a method for fabricating microlenses without being much affected by fabrication errors; and
  to provide a method for fabricating microlenses with increased flexibility in the setting of their curvatures, that is, with an increased number of parameters involved in the setting of the curvatures.

Means for Solving the Problem

The present invention offers a method for fabricating microlenses from the portions of a lens layer supported on elevations formed adjoining trenches in the surface of a primary layer supported on a substrate. This fabrication method includes, at least: a microlens formation step in which the portions of the lens layer supported on the elevations are melted by heat so that part of the lens layer flows into the trenches in order to change the shape of the portions of the lens layer supported on the elevations and thereby form the microlenses.

As a result of part of the lens layer flowing into the trenches, the portions of the lens layer supported on the elevations, which have thus far had a uniform thickness, come to have different thicknesses. These differences in thickness form the thus far flat lens layer into curved surfaces (microlenses). Thus, the trenches provide parameters according to which the shape of the microlenses can be controlled.

For example, as the microlenses, convex lenses can be formed on the elevations in the microlens formation step in the following manner: portions of the lens layer located at the surface thereof and forming the edges of the portions thereof supported on the elevations are made to flow into the trenches; thus, the portions of the lens layer supported on the elevations come to have a smaller thickness at the edges thereof than at the center of the surface of the elevations.

In the microlens formation step, it is preferable that the trenches formed in the primary layer have a plurality of different widths. The reason is that, according to the width of the trenches, how the lens layer flows and other factors vary, and the changes in these factors produce microlenses having different curvatures.

For example, suppose that the trenches having the different widths are formed along each other such that the different widths occur alternately. Then, the portions of the lens layer supported on the elevations adjoining the larger and smaller trench widths are formed into microlenses having curvatures depending on the larger and smaller trench widths.

For another example, suppose that, in a direction different from the direction in which the trenches are formed along each other such that the different trench widths occur alternately, trenches having a still different width are formed along each other. Then, the elevations adjoining the larger and smaller trench widths also adjoin the still different trench width. Thus, microlenses having at least three different curvatures are fabricated.

For yet another example, suppose that the trenches having the different widths are grouped into first trenches having one width and second trenches having another width, the first trenches being formed along each other in a first direction and the second trenches being formed along each other in a second direction different from (e.g., in the direction perpendicular to) the first direction. Then, the fabricated microlenses have different curvatures, for example, in different directions that cross each other. Thus, microlenses having different curvatures in different directions that cross each other are fabricated.

In the microlens formation step, it is also preferable that the widths of the trenches be so set that the part of the lens layer that flows into the trenches flows thereinto along the side walls of the trenches toward the center of the bottom of the trench and that the thickness of the lens layer that stays at the center of the bottom is smaller than the thickness of the lens layer that stays at edges of the bottom. This produces, in those trenches, (concave) microlenses that are depressed as seen from the outside.

Other than the trench width, the depth and volume of the trenches affect the shape of the microlenses. Thus, it is preferable that the trenches formed in the primary layer have a plurality of different depths. It is preferable that, moreover, the trenches have different depths according to the different widths thereof. It is also preferable that the trenches formed in the primary layer have a plurality of different volumes.

The edges of the open tops of the trenches may be made to extend toward the center of the surface of the elevations so that the edges of the open tops of the trenches do not overlap with the edges of the portions of the lens layer supported on the elevations. This makes it easy for the lens layer supported on the elevations to flow into the trenches.

Advantages of the Invention

According to the present invention, trenches formed in a primary layer offer new parameters according to which the shape (curvature) of microlenses can be set. This allows increased flexibility in the setting of the shape of microlenses. In addition, the increased number of parameters as compared with those conventionally available allow microlenses to be fabricated without being much affected by fabrication errors.

BRIEF DESCRIPTION OF DRAWINGS

[FIG. 3] A plan view of the mask used in the process for fabricating the microlens unit provided in the CMOS sensor.

[FIG. 4] A plan view of the CMOS sensor.

[FIG. 5A] A cross-sectional view of the CMOS sensor, as seen from one direction.

[FIG. 5B] A cross-sectional view of the CMOS sensor, as seen from a different direction from FIG. 5A.

[FIG. 7] A plan view of a CCD sensor.

[FIG. 12] A plan view of the mask used in the process for fabricating the microlens unit provided in the CCD sensor.

[FIG. 13A] A cross-sectional view showing another example of FIG. 5A.

[FIG. 13B] A cross-sectional view showing another example of FIG. 5B.

[FIG. 17] An optical path diagram of the CMOS sensor shown in FIG. 16.

[FIG. 18A] A detailed cross-sectional view of FIG. 5A.
[FIG. 18B] A detailed cross-sectional view of FIG. 5B.

[FIG. 21A] A cross-sectional view showing another example of FIGS. 8A and 14A.

[FIG. 21B] A cross-sectional view showing another example of FIGS. 8B and 14B.

[FIG. 30] A plan view of a mask different from the one shown in FIG. 27.

Figure 1A:
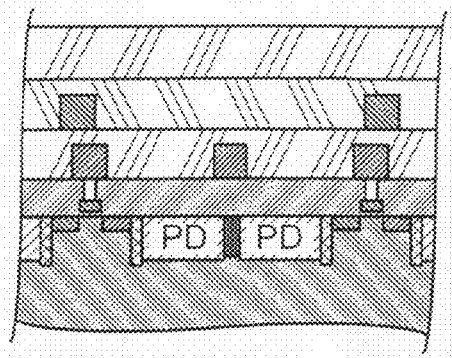
[FIG. 1A] A cross-sectional view showing a step in a process for fabricating a microlens unit provided in a CMOS sensor.

LIST OF REFERENCE SYMBOLS 11 substrate
31 flattening film (primary layer)
32 lens material film (lens layer)
PD photodiodes (light-receiving portions)
MS microlenses
BG elevations
DH trenches
D' trench width
JD removed ditches
MK mask
ST slits
D slit width
SCU substrate unit
MSU microlens unit
DVE image sensor
DVE[CS] CMOS sensor (image sensor)
DVE[CC] CCD sensor (image sensor)
HD horizontal direction (a first direction, or a second direction different from the first direction)
VD vertical direction (a second direction different from a first direction, or the first direction)
LD longer-side direction (a first direction, or a second direction different from the first direction)
SD shorter-side direction (a second direction different from a first direction, or the first direction)
VV vertical direction
E displacement
J margin

BEST MODE FOR CARRYING OUT THE INVENTION

Embodiment 1

An embodiment of the present invention will be described below with reference to the relevant drawings. Not every drawing shows all the reference numerals or symbols of the parts appearing in it, in which case reference is requested to be made to other drawings. For easy understanding, hatching may be omitted.

Various types of image sensor are available, among which the most common are CMOS image sensors employing a COMS (complementary metal-oxide-semiconductor) and CCD image sensors employing a CCD (charge-coupled device). FIG. 4 is a plan view of an image device DVE employing a CMOS (CMOS sensor DVE[CS]). In FIG. 4, broken lines G represents the borders between pixels.

[1. Image Sensor Employing a CMOS]

As shown in FIG. 4, the CMOS sensor DVE[CS] has photodiodes PD one for each of its pixels. The CMOS sensor DVE[CS] also has microlenses MS (unillustrated in FIG. 4) for condensing incoming light on the photodiodes PD. The shape of the microlenses MS is shown, in a form easy to grasp, in FIGS. 5A and 5B, with reference to which a description will now be given of the CMOS sensor DVE[CS].

This CMOS sensor DVE[CS] has one charge detector (unillustrated) for every two photodiodes PD. Accordingly, every two photodiodes PD are arranged closer together. For the sake of convenience, the direction in which photodiodes pd are arranged closer together is called the horizontal direction HD, and the direction perpendicular to it and lying on the pixel surface is called the vertical direction VD.

The dimensions of each pixel in the horizontal and vertical directions HD and VD are 1:1. In the horizontal direction HD, the regions where photodiodes PD are arranged closer together are called the regions DN, and the regions where photodiodes PD are arranged farther from each other are called the regions DW. In the vertical direction VD, the regions where photodiodes PD are arranged farther from each other are called the regions DM.

FIG. 5A is a cross-sectional view along line A-A' shown in FIG. 4, and shows the cross-section of the CMOS sensor DVE[CS] along the horizontal direction HD within the surface of one pixel. FIG. 5B is a cross-sectional view along line B-B' shown in FIG. 4, and shows the cross-section of the CMOS sensor DVE[CS] along the horizontal direction VD within the surface of one pixel.

[1-1. Structure of an Image Sensor Employing a CMOS]

The CMOS sensor DVE[CS] shown in FIGS. 5A and 5B includes: a substrate unit (substrate structure) SCU having a substrate 11 including photodiodes PD; and a microlens unit (multilayer structure) MSU having a flattening film 31 supporting microlenses MS.

[1-1-1. Substrate Unit]

The substrate unit SCU includes a substrate 11, photodiodes PD, transistors, metal conductor layers 21, interlayer insulation films 22 (22a, 22b, and 22c), and a separation insulation film 23.

The substrate 11 is a plate-shaped semiconductor substrate of, for example, silicon. In the substrate 11, for example, an N-type impurity layer is formed by ion injection to form the photodiodes PD. Where two photodiodes PD are arranged closer together, an impurity is injected to form a separation layer 12, in order to thereby prevent contact between those photodiodes PD.

The transistors are, for example, thin-film transistors (TFTs) that act as active devices (switching device) for pixel selection, each transistor including a source electrode 13, a drain electrode 14, and a gate electrode 15. The source electrode 13 and the drain electrode 14 are formed by injection of an impurity such as arsenic; the gate electrode 15 is formed of polysilicon or a silicide of a high-melting-point metal.

The transistors are formed where two photodiodes PD are arranged farther from each other. To prevent contact between those transistors and photodiodes PD, a silicon oxide layer 17 is formed between them (between the transistors and the photodiodes PD).

The metal conductor layers 21 are for transferring various kinds of electric charge, and are formed in a plurality of layers for reasons of layout. To insulate between the metal conductor layers 21, the interlayer insulation films 22 are formed, which are, for example, silicon oxide films or silicon nitride films. Since the metal conductor layers 21 are formed in a plurality of layers, the interlayer insulation films 22 (22a, 22b, and 22c) are also formed in a plurality of layers.

The separation insulation film 23 is an insulation film for separating the interlayer insulation films 22 including the metal conductor layers 21 from the transistors. In at least one layer of the interlayer insulation films 22, contact holes 24 are formed to permit connection between the gate electrodes 15 and the metal conductor layers 21.

[1-1-2. Microlens Unit]

The microlens unit MSU is formed over the substrate unit SCU, and includes a flattening film (primary layer) 31 and a lens material film (lens layer) 32.

The flattening film 31 covers the topmost interlayer insulation film 22c to secure flatness. The flattening film 31, however, has trenches DH formed in it so that the lens material film 32 flows into them. The trenches DH are needed to adjust the shape of the microlenses MS into which the lens material film 32 is formed.

In a case where the CMOS sensor DVE[CS] is for color image sensing, a color filter layer is formed in the flattening film 31. The flattening film 31 is formed of, for example, an organic material such as a non-photosensitive acrylic resin.

The lens material film 32 is a film that is eventually formed into the microlenses MS. Accordingly, the lens material film 32 is formed of a material that can be easily formed into the shape (convex or concave) of the microlenses MS. Used here is, for example, a material (lens material) that is softened and melted when heat is applied to it and that thereby permits easy adjustment of the shape into which it is formed. The lens material film 32 may be exposed and developed, and therefore it is preferable that its material be photosensitive. Out of these consideration, the lens material film 32 is formed of, for example, an organic material such as a photosensitive acrylic resin.

The shape of the microlenses MS changes (is adjusted) according to how the lens material film 32 flows into the trenches DH and other factors; how it flows etc. change according to, in particular, the width of the trenches DH (trench width), the depth of the trenches DH (trench depth), or the volume of the trenches DH. Hence, by changing at least one of the width, depth, and volume of the trenches DH, it is possible to change the shape of the microlenses MS (the lens material film 32 that has been formed into the microlenses MS may be called the microlens array).

Figure 6A:
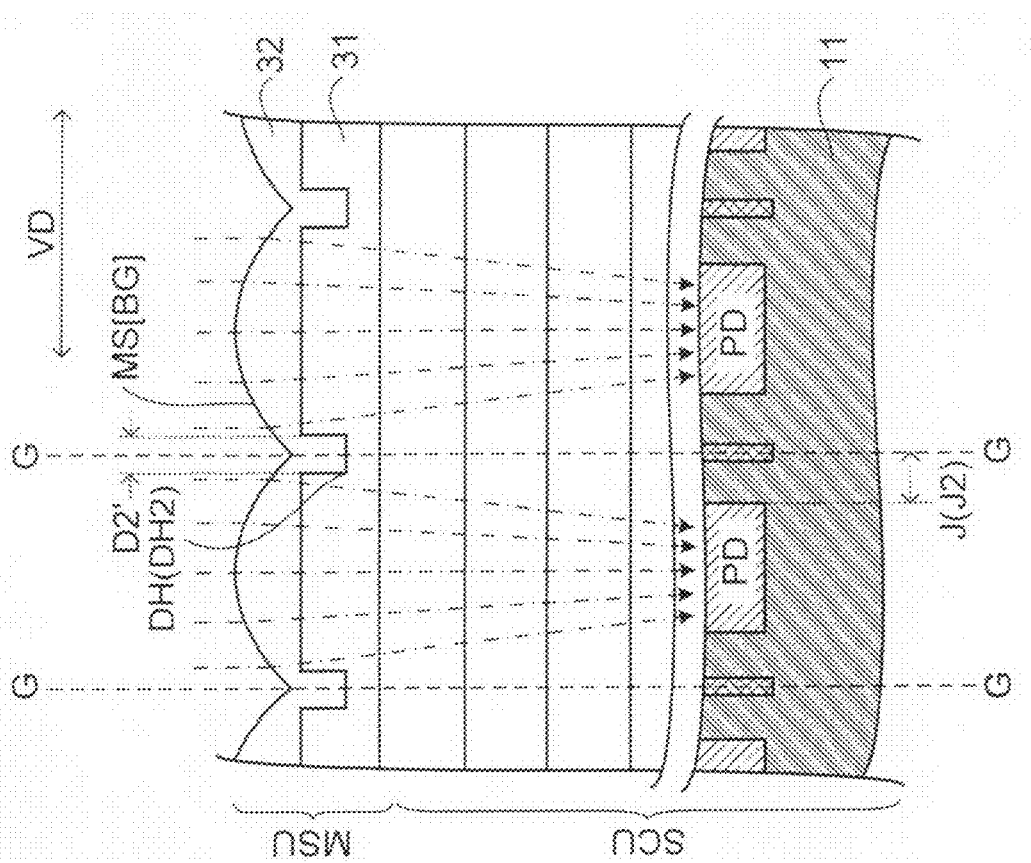
[FIG. 6A] An optical path diagram showing the optical path in the CMOS sensor shown in FIG. 5A.
Figure 6B:
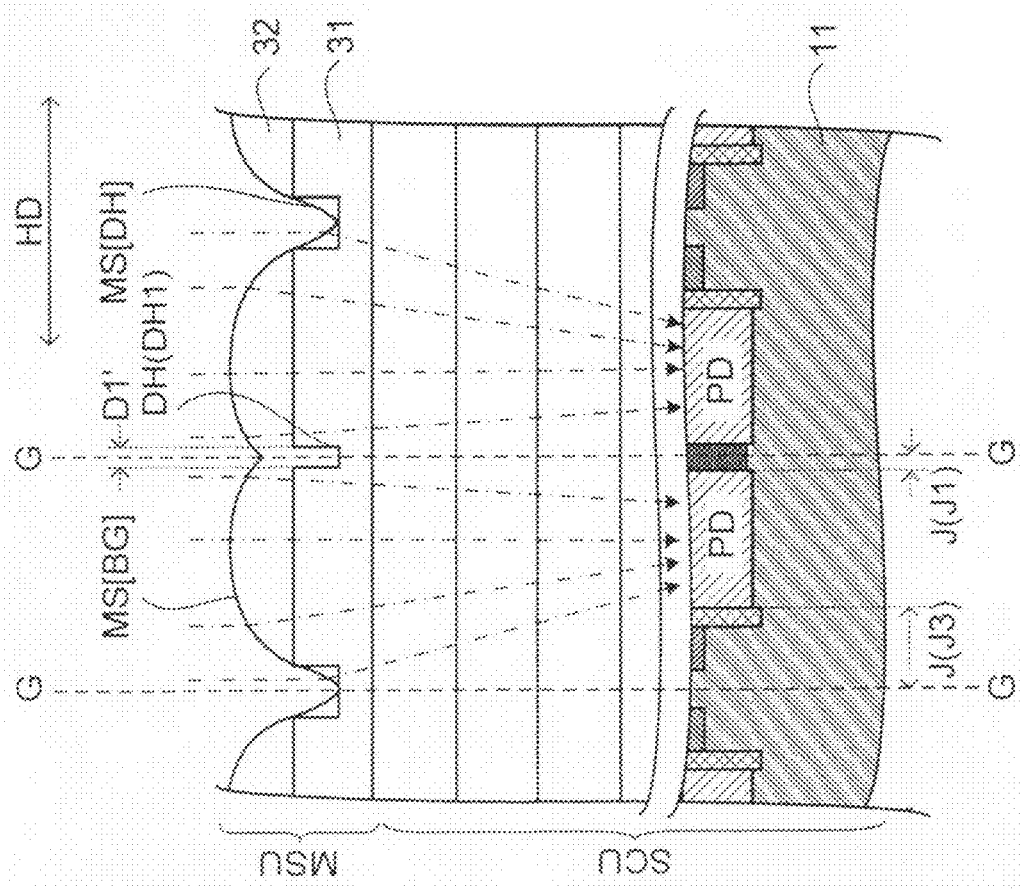
[FIG. 6B] An optical path diagram showing the optical path in the CMOS sensor shown in FIG. 5B.

By appropriately setting the shape (e.g., the curvature of the lens surface) of the microlenses MS, it is possible to direct incoming light (represented by dash-and-dot line arrows) to the light-receiving surfaces of the photodiodes PD (condense the light) as shown in FIGS. 6A and 6B (optical path diagrams corresponding to FIGS. 5A and 5B).

[1-2. Fabrication Method of an Image Sensor Employing a CMOS]

Now, the fabrication method of the CMOS sensor DVE[CS] will be described with reference to FIGS. 1A to 1F and FIG. 2A to 2F. What is particularly dealt with here is a method for fabricating the microlenses MS with a desired curvature by forming trenches DH in the flattening film 31. Accordingly, no description will be given of the fabrication process of the substrate unit SCU itself, and the following description exclusively discusses the fabrication process of the microlens unit MSU.

FIGS. 1A to 1F show a cross-section of the CMOS sensor DVE[CS] along the horizontal direction HD within the surface of one pixel, and correspond to FIG. 5A. On the other hand, FIGS. 2A to 2F show a cross-section of the CMOS sensor DVE[CS] along the vertical direction VD within the surface of one pixel, and correspond to FIG. 5B.

Figure 1B:
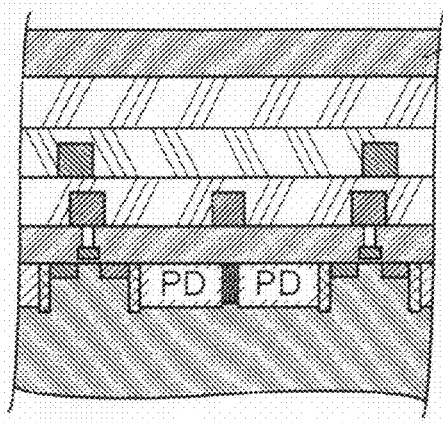
[FIG. 1B] A cross-sectional view showing a step in the process for fabricating the microlens unit provided in the CMOS sensor.
Figure 2A:
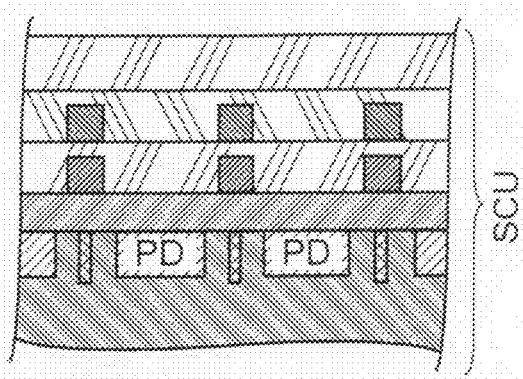
[FIG. 2A] A cross-sectional view, as seen from a different direction from FIG. 1A, showing a step in the process for fabricating the microlens unit provided in the CMOS sensor.
Figure 2B:
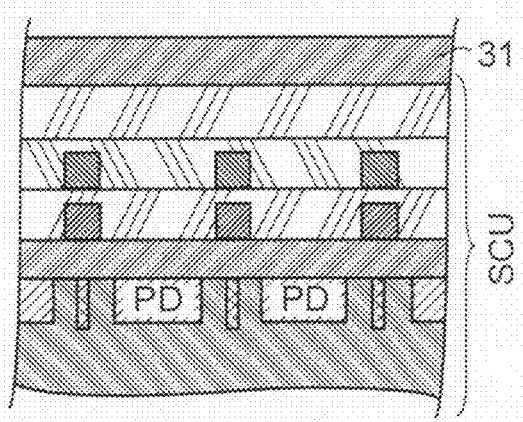
[FIG. 2B] A cross-sectional view, as seen from a different direction from FIG. 1B, showing a step in the process for fabricating the microlens unit provided in the CMOS sensor.

FIGS. 1A and 2A show the substrate unit SCU. As shown in FIGS. 1B and 2B, on the substrate unit SCU (more specifically, the topmost interlayer insulation film 22c), acrylic resin or the like is applied by spin coating or the like, and is then hardened by heat treatment to form the flattening film 31 [flattening film formation step].

Figure 1C:
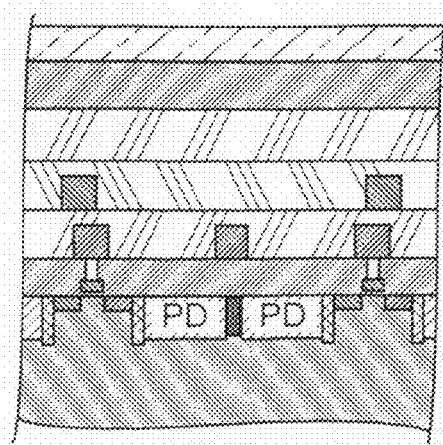
[FIG. 1C] A cross-sectional view showing a step in the process for fabricating the microlens unit provided in the CMOS sensor.
Figure 1D:
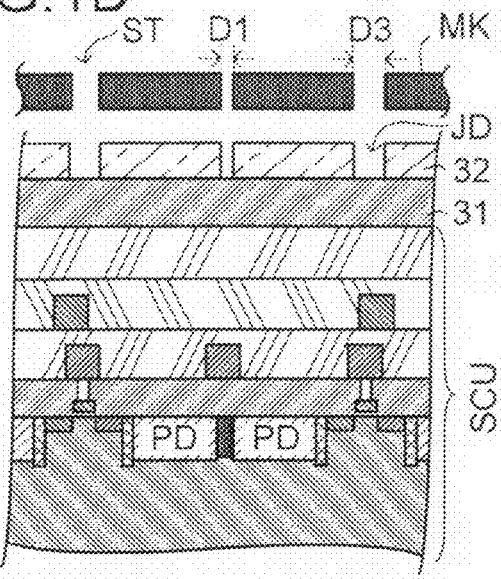
[FIG. 1D] A cross-sectional view showing a step in the process for fabricating the microlens unit provided in the CMOS sensor.
Figure 2C:
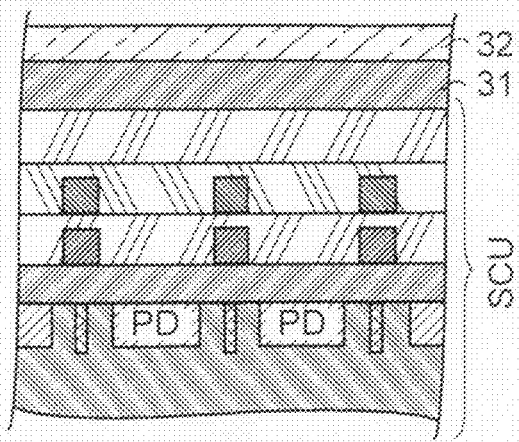
[FIG. 2C] A cross-sectional view, as seen from a different direction from FIG. 1C, showing a step in the process for fabricating the microlens unit provided in the CMOS sensor.
Figure 2D:
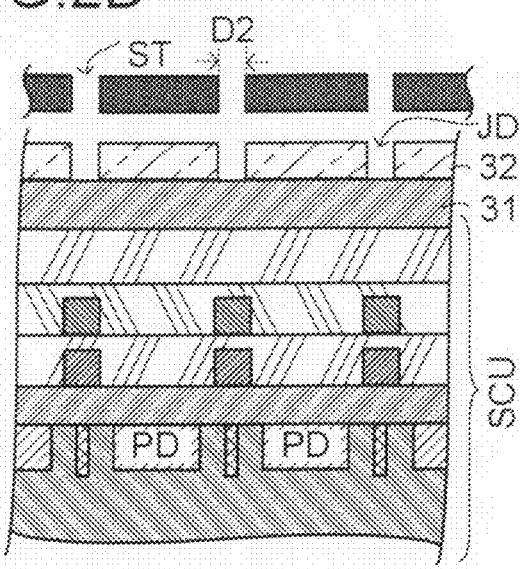
[FIG. 2D] A cross-sectional view, as seen from a different direction from FIG. 1D, showing a step in the process for fabricating the microlens unit provided in the CMOS sensor.

Then, on the flattening film 31, photosensitive acrylic resin or the like is applied by spin coating or the like. Now, as shown in FIGS. 1C and 2C, the lens material film 32 is formed [lens material film formation step]. Thereafter, with a mask MK having slits ST as shown in FIG. 3, exposure and development are performed. Now, as shown in FIGS. 1D and 2D, ditches (removed ditches) JD are formed that have widths corresponding to the widths (slit widths) of the slits ST in the mask MK [removed ditch formation step].

The mask MK has three different slit widths D (D1<D2<D3). In the horizontal direction HD, the region (region DN) of the lens material film 32 located over where photodiodes PD are arranged closer together is irradiated with the light that has passed through the slits ST having the smallest width D1. In the horizontal direction HD, the region (region DW) of the lens material film 32 located over where photodiodes PD are arranged farther from each other is irradiated with the light that has passed through the slits ST having the largest width D3.

On the other hand, in the vertical direction VD, the region (region DM) of the lens material film 32 located over where photodiodes PD are arranged away from each other is irradiated with the light that has passed through the slits ST having the width D2. Thus, in the horizontal direction HD, the mask MK has slits ST with different widths D1 and D3 arranged alternately along each other; in the vertical direction VD, the mask MK has slits ST with an equal width D2 arranged along each other.

Figure 1E:
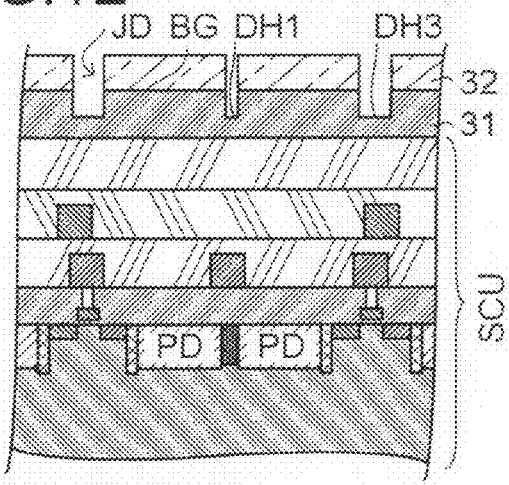
[FIG. 1E] A cross-sectional view showing a step in the process for fabricating the microlens unit provided in the CMOS sensor.
Figure 2E:
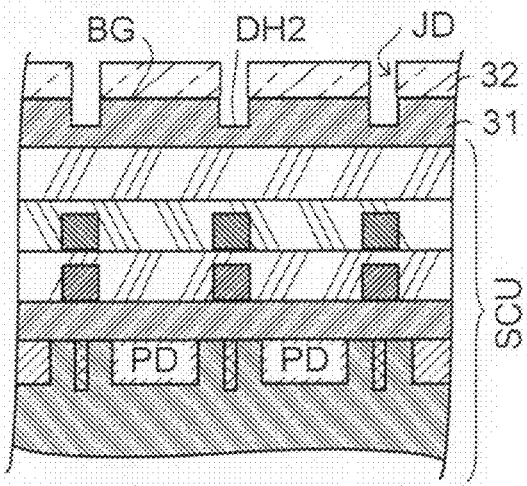
[FIG. 2E] A cross-sectional view, as seen from a different direction from FIG. 1E, showing a step in the process for fabricating the microlens unit provided in the CMOS sensor.

Next, using the lens material film 32 having the removed ditches JD formed in it, dry etching or the like is performed. As shown in FIGS. 1E and 2E, this causes the portions of the flattening film 31 located under the bottom of the removed ditches JD to be etched away, and thus trenches DH (DH1, DH2, and DH3) having widths D1', D2', and D3' corresponding to the slit widths D1, D2, and D3 are formed [trench formation step].

As a result of the trenches DH being formed, the portions elsewhere are left as elevated portions. Thus, the elevated portions left adjoining the trenches DH are called the elevations BG. Now, in this surface of the flattening film 31, the elevations BG and the trenches DH are formed adjoining each other. During dry-etching or the like, part of the lens material film 32 is also etched away; accordingly, the lens material film 32 is given a thickness including an allowance for its part that will be etched away.

When heat is applied to the flattening film 31 having the trenches DH formed in it and the lens material film 32 having the removed ditches JD formed in it (when these are subjected to heat treatment), the lens material film 32 softens and melts, and flows into the trenches DH. Now, as shown in FIGS. 1F and 2F, the portions of the lens material film 32 supported on the elevations BG melt and form the lens shape [microlens formation step].

[1-3. Shape of the Microlenses in a CMOS Sensor]

Now, the shape of the microlenses MS (lens shape) will be described. Typically, the lens material film 32 has a fixed viscosity (about 0.005 to 0.01 Pa·s), and thus gradually flows into the trenches DH toward the center (e.g., in the trench width direction) of their bottom. Thus, where the trench width D' is comparatively large (e.g., in the trenches DH3 with the trench width D3'), the lens material film 32 comes to have different thicknesses between at the center of the bottom of the trenches DH3 and at the edge of the bottom (near the side walls) of the trenches DH3. This is because the lens material, due to its comparatively high viscosity, has difficulty reaching the center of the bottom of the trenches DH3.

Figure 1F:
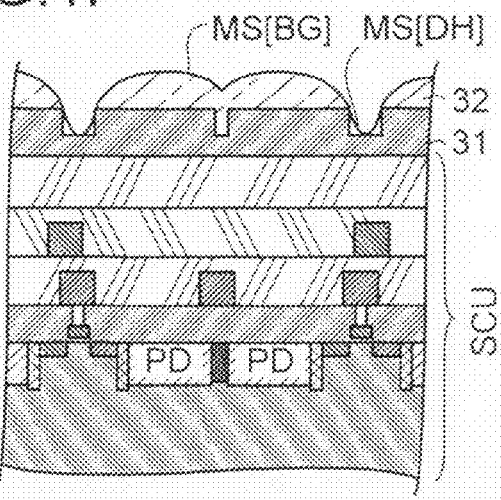
[FIG. 1F] A cross-sectional view showing a step in the process for fabricating the microlens unit provided in the CMOS sensor.
Figure 2F:
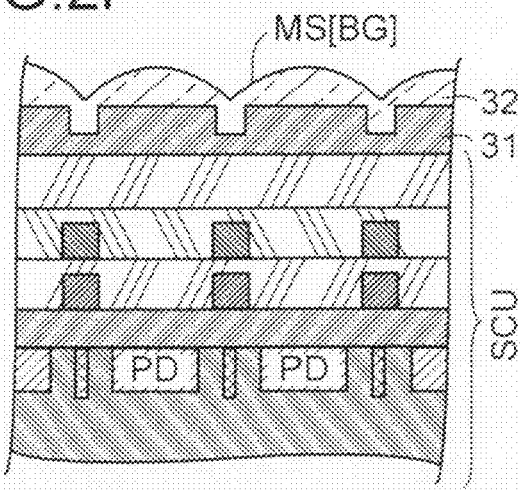
[FIG. 2F] A cross-sectional view, as seen from a different direction from FIG. 1F, showing a step in the process for fabricating the microlens unit provided in the CMOS sensor.

When, with respect to the trenches DH3 shown in FIGS. 1F and 5A, the thicknesses of the lens material film 32 at the center and edge of their bottom are compared, the thickness at the center is smaller than the thickness at the edge. Thus, the portions of the lens material film 32 that have flowed into the trenches DH3 have a shape depressed as seen from the outside (from the direction opposite from the photodiodes PD); that is, they have a concave cross-section along the horizontal direction HD.

The portions of the lens material film 32 supported on the elevations BG soften and melt from their surface. Thus, the peripheral parts of the portions of the lens layer supported on the elevations BG (i.e., the portions of the lens layer forming the side walls of the removed ditches JD; see FIGS. 1E and 2E) are the first to flow into the trenches DH. When, with respect to the elevations BG, the thickness of the lens material film 32 at the center and edge of their surface are compared, the thickness at the center is larger than at the edge. Thus, as shown in FIG. 5A, the portions of the lens material film 32 supported on the elevations BG has a shape elevated toward the outside; that is, they have a convex cross-section along the horizontal direction HD.

In particular, in the trenches DH3 with the comparatively large width D3', if the volume of the lens material film 32 that flows into them is smaller than the volume of the trenches DH3 themselves, the portions of the lens material film 32 that have flowed into the trenches DH3 are separated from the portions of lens material film 32 supported on the BG by the edges of the elevations BG. Thus, the edges, located near the trenches DH3, of the portions of the lens material film 32 supported on the elevations BG overlap with the edges of the elevations BG. Consequently, those edges of the lens material film 32 lie on the surface of the flattening film 31 (more specifically, the surface of the elevations BG).

On the other hand, as shown in FIGS. 1F and 5A, where the trench width D' is comparatively small (e.g., in the trenches DH1 with the trench width D1'), although the lens material gradually flows into the trenches DH1 toward the center of their bottom, no concave lenses are formed in the trenches DH1. This is because the lens material easily reaches the center of the bottom of the trenches DH1, and thus the difference between the thicknesses of the lens material film 32 at the center and edge of the bottom of the trenches DH1 tends to be small. Even then, the portions of the lens material film 32 forming the side walls of the removed ditches JD flow into the trenches DH1, and thus the portions of the lens material film 32 supported on the elevations BG have a shape elevated as seen from the outside; that is, they have a convex cross-section along the horizontal direction HD.

Incidentally, as shown in FIGS. 1F and 5A, where the trench width is comparatively small and thus the volume of the lens material film 32 that flows into the trenches DH is larger than the volume of the trenches DH themselves (e.g., in the trenches DH1 with the trench width D1'), the lens material overflows out of the trenches DH1. Here, the portions of the lens material film 32 that have flowed into the trenches DH1 are not separated from the portions of the lens material film 32 supported on the elevations BG by the edges of the elevations BG. That is, the lens material film 32 that has overflowed out of the trenches DH1 prevents the edges, located near the trenches DH1, of the portions of the lens material film 32 supported on the elevations BG from overlapping with the edges of the elevations BG, and instead make them overlap with somewhere around the center of the bottom of the trenches DH1 and stay displaced above the surface of the elevations BG.

As shown in FIGS. 2F and 5B, even where the trench width D' is comparatively small and thus the volume of the lens material that flows into the trenches DH is larger than their own volume (e.g., in the trenches DH2 with the trench width D2'), no concave lenses are formed in the trenches DH2. On the contrary, as a result of the portions of the lens material film 32 forming the side walls of the removed ditches JD flowing into the trenches DH2, the portions of the lens material film 32 supported on the elevations BG have a shape elevated as seen from the outside; that is, they have a convex cross-section along the vertical direction VD.

Thus, the portions of the lens material film 32 in the trenches DH having the comparatively large width D' are formed into microlenses MS (concave lenses MS[DH]) having a concave cross-section along the horizontal direction HD (see FIG. 5A). On the other hand, the portions of the lens material film 32 supported on the elevations BG are formed into microlenses MS (convex lenses MS[BG]) having a convex cross-section along the vertical direction VD (see FIGS. 5A and 5B).

Here, the edges of the convex lenses MS[BG] have varying heights above (distances from) the surface of the elevations BG (hence the substrate 11). Specifically, near the trenches DH3, the edges of the convex lenses MS[BG] lie on the surface of the elevations BG; near the trenches DH1, the edges of the convex lenses MS[BG] are displaced comparatively far above the surface of the elevations BG; and near the trenches DH2, the edges of the convex lenses MS[BG] are displaced less above the surface of the elevations BG.

In this way, whereas the convex lenses MS[BG] have a fixed axial thickness (the height of the vertices of the microlenses MS above the surface of the elevations BG), they have different thicknesses at their edges. This gives the convex lenses MS[BG] varying curvatures; that is, the microlenses MS have axis-nonsymmetric aspherical surfaces (free-form surfaces) (here, the "axis" denotes the one perpendicular to the surface of a given elevation BG and crossing it at its center). Specifically, let the curvatures (local curvatures) of the convex lenses MS[BG] near the trenches DH1, DH2, and DH3 be RR1, RR2, and RR3, then they fulfill the relationship "RR1<RR2<RR3".

Thus, in the fabrication method described above, as a result of the lens material film 32 flowing into the trenches DH formed in the flattening film 31, the shape (and in particular the curvature) of the microlenses MS formed on the elevations BG (the convex lenses MS[BG]) is adjusted.

Likewise, with respect to the microlenses MS formed in the trenches DH (the concave lenses MS[DH]), their curvature is adjusted by controlling how the lens material film 32 flows into them (which depends on the trench width D', the depth of the trenches DH (trench depth), or the volume of the trenches DH).

[2. Image Sensor Employing a CCD]

Next, an image sensor employing a CCD (a CCD sensor) DVE[CC] will be described. Such parts as find their counterparts in the CMOS sensor DVE[CS] will be identified with common reference numerals and symbols, and their description will not be repeated.

As shown in FIG. 7, the CCD sensor DVE[CC] has photodiodes PD one for each of its pixels. The CCD sensor DVE[CC] also has microlenses MS (unillustrated in FIG. 7) for condensing incoming light on the photodiodes PD. The shape of the microlenses MS is shown, in a form easy to grasp, in FIGS. 8A and 8B, with reference to which a description will now be given of the CCD sensor DVE[CC].

Figure 8B:
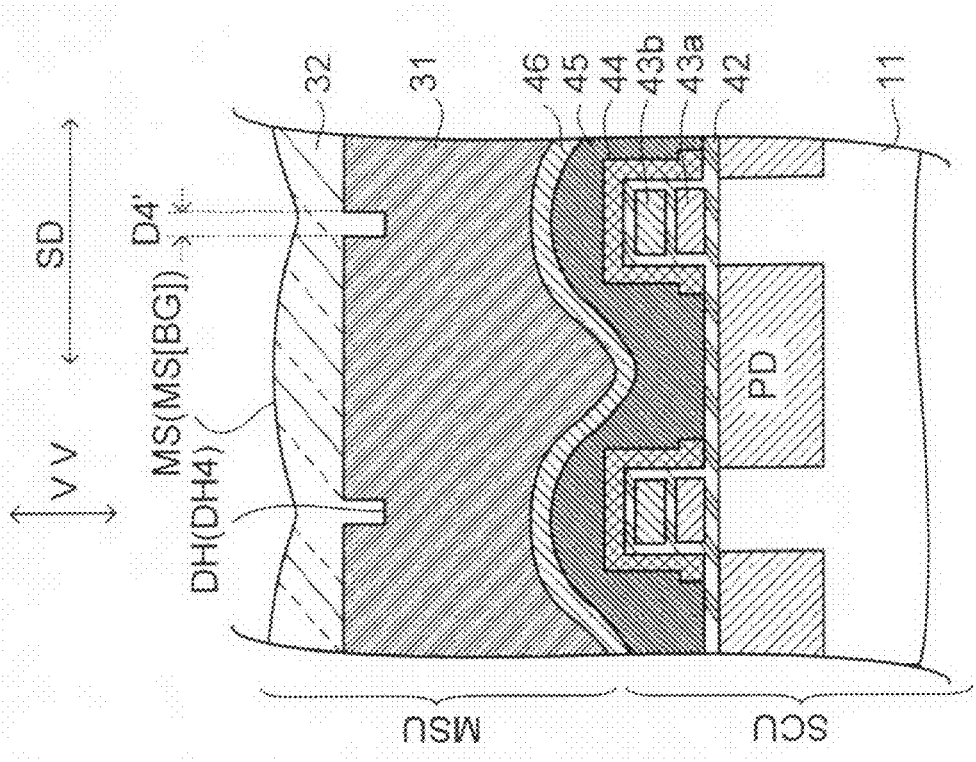
[FIG. 8B] A cross-sectional view of the CCD sensor, as seen from a different direction from FIG. 8A.
Figure 8A:
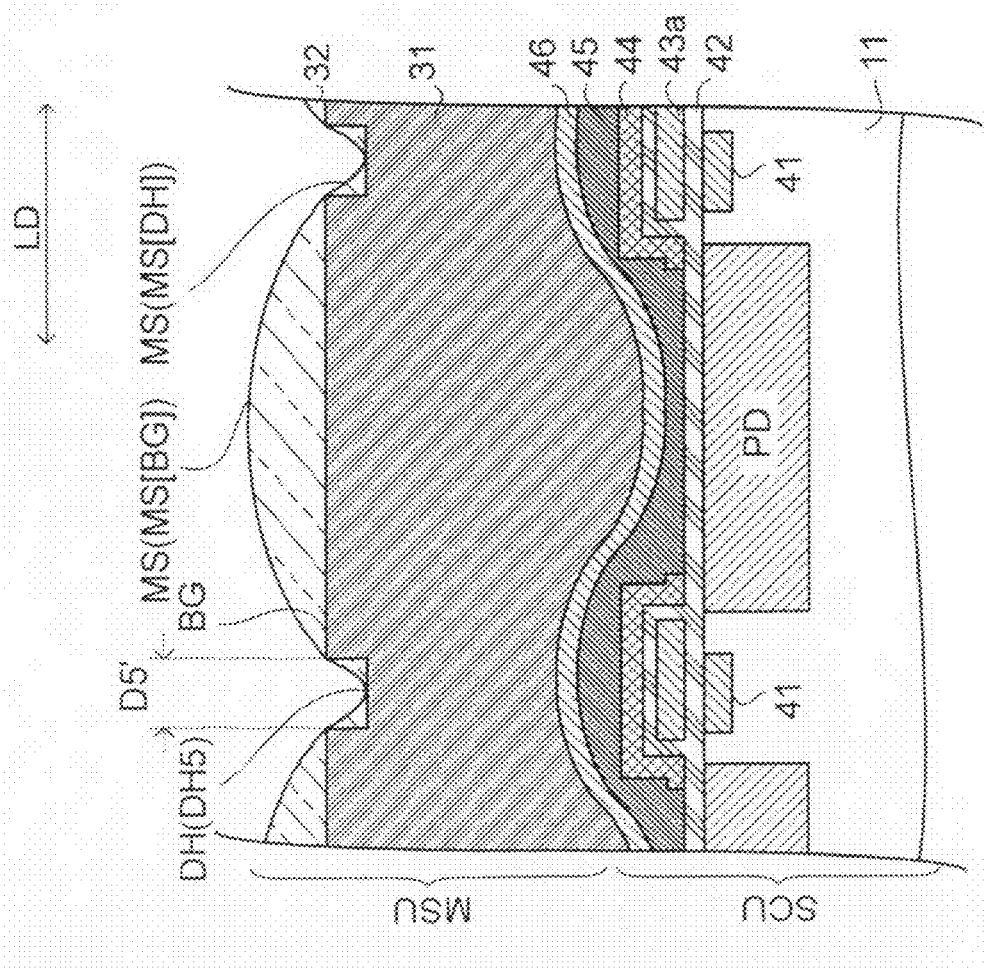
[FIG. 8A] A cross-sectional view of the CCD sensor, as seen from one direction.

FIG. 8A is a cross-sectional view along line C-C' shown in FIG. 7, and shows the cross-section of the CCD sensor DVE[CC] along the longer-side direction LD within the surface of one pixel. FIG. 8B is a cross-sectional view along line D-D' shown in FIG. 7, and shows the cross-section of the CCD sensor DVE[CC] along the shorter-side direction SD (perpendicular to the longer-side direction LD) within the surface of one pixel. Here, needless to say, the dimensions of each pixel in the longer-side and shorter-side directions LD and SD are not 1:1.

[2-1. Structure of an Image Sensor Employing a CCD]

The CCD sensor DVE[CC] shown in FIGS. 8A and 8B includes: a substrate unit (substrate structure) SCU having a substrate 11 including photodiodes PD; and a microlens unit (multilayer structure) MSU having a flattening film 31 supporting microlenses MS.

[2-1-1. Substrate Unit]

The substrate unit SCU includes a substrate 11, photodiodes PD, charge transfer paths 41, a first insulation film 42, first gate electrodes 43a, second gate electrodes 43b, a light-shielding film 44, a primary insulation film 45, and a protection film 46.

The substrate 11 is a plate-shaped semiconductor substrate of, for example, silicon. In the substrate 11, for example, an N-type impurity layer is formed by ion injection to form the photodiodes PD. The photodiodes PD receive light (incoming light) incident on the CCD sensor DVE[CC], and convert it into electric charges. The resulting electric charges are transferred via the charge transfer paths (vertical transfer CCDs) 41 to an unillustrated output circuit. The charge transfer paths 41 are also formed by forming an N-type impurity layer by ion injection.

The first insulation film 42 is formed so as to cover the photodiodes PD and the charge transfer paths 41. In the first insulation film 42, gate electrodes 43 are formed in two layers (the first gate electrodes 43a and the second gate electrodes 43b). The gate electrodes 43 are for applying electric fields for reading electric charges from the photodiodes PD and the charge transfer paths 41, and are formed of polycrystalline silicon (polysilicon). Thus, the first insulation film 42 serves to insulate the charge transfer paths 41, the first gate electrodes 43a, and the second gate electrodes 43b from one another.

The light-shielding film 44 serves to prevent entry of incoming light into the charge transfer paths 41 etc., and accordingly covers elsewhere than where the photodiodes PD are located. The light-shielding film 44 is therefore formed of a reflective material such as tungsten.

The primary insulation film 45 serves as a primary layer on which to form metal conductors laid in a peripheral part of the area of each pixel (the pixel area), and also serves to insulate the conductors from one another. The primary insulation film 45 is therefore formed of, for example, BPSG (boro-phospho-silicate glass)—a material that exhibits a predetermined fluidity (meltability) when heated. Thus, the primary insulation film 45 may be called a silicon oxide film.

The protection film 46 is formed so as to cover the top of the primary insulation film 45, and thus serves to protect the layers below. The protection film 46 is formed by CVD (chemical vapor deposition) or the like using, for example, nitrogen gas. Thus, the protection film 46 may be called a silicon nitride film.

[2-1-2. Microlens Unit]

The microlens unit MSU is formed over the substrate unit SCU, and includes a flattening film (primary layer) 31 and a lens material film (lens layer) 32.

The flattening film 31 covers the protection film 46 to alleviate the influence of its surface irregularities attributable to the gate electrodes 43a and 43b etc. As in the CMOS sensor DVE[CS], however, the flattening film 31 has trenches DH formed in it so that the lens material film 32 flows into them.

In a case where the CCD sensor DVE[CC] is for color image sensing, a color filter layer is formed in the flattening film 31.

The lens material film 32 is formed of an organic material such as a photosensitive acrylic resin. Thus, the shape of the microlenses MS into which the lens material film 32 is formed changes according to how the lens material film 32 flows into the trenches DH and other factors. That is, by changing at least one of the width, depth, and volume of the trenches DH, it is possible to change the shape of the microlenses MS.

As in the fabrication process of the CMOS sensor DVE [CS], the lens material film 32 is subjected to dry-etching or the like. The lens material film 32 is therefore given a thickness including an allowance for its part that will be etched away.

Figure 9A:
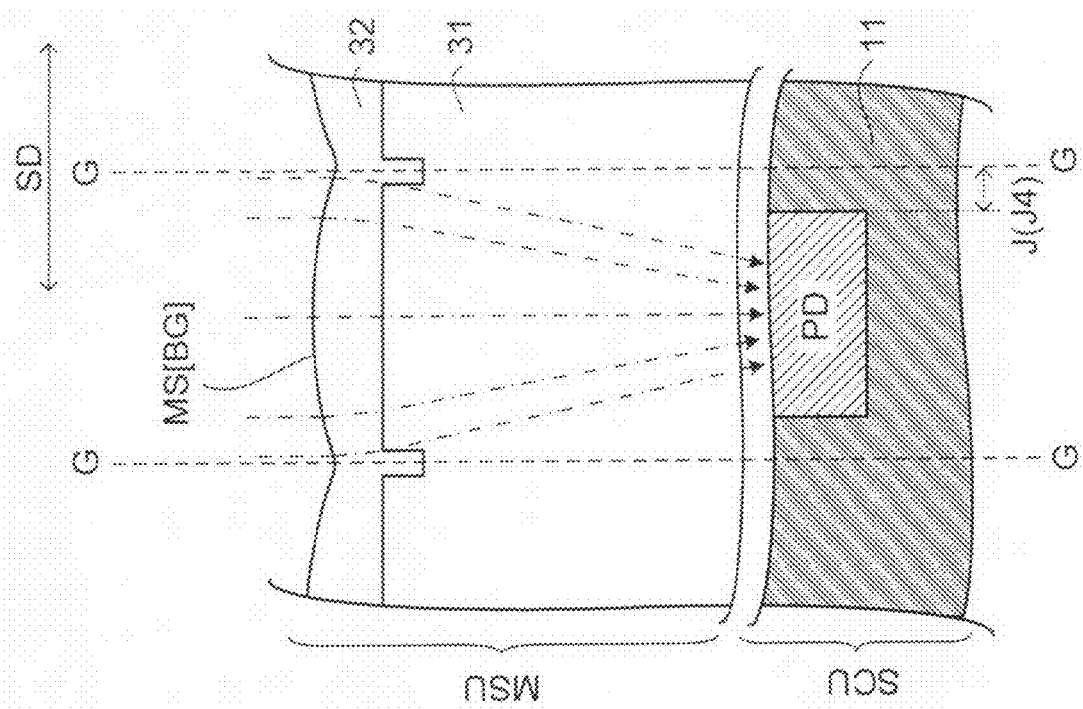
[FIG. 9A] An optical path diagram showing the optical path in the CCD sensor shown in FIG. 8A.
Figure 9B:
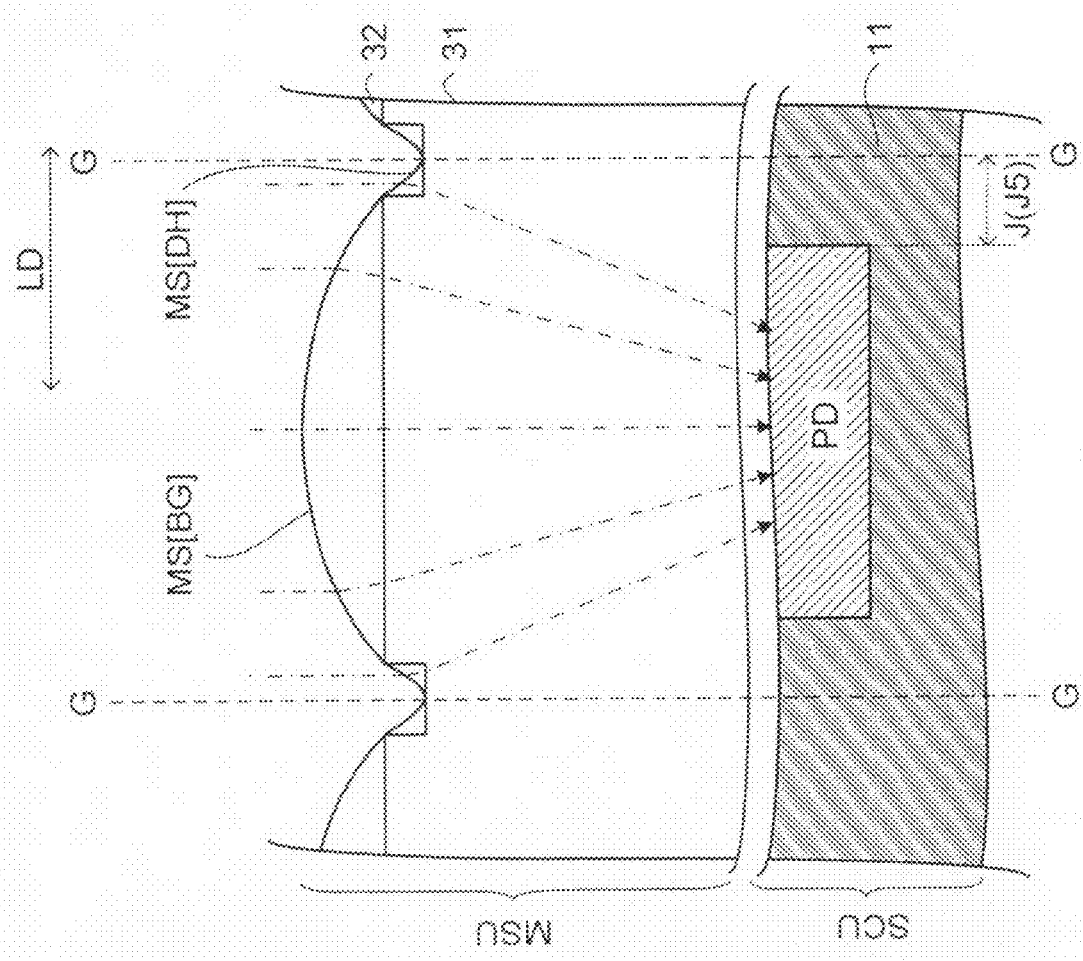
[FIG. 9B] An optical path diagram showing the optical path in the CCD sensor shown in FIG. 8B.

By appropriately setting the shape (e.g., the curvature of the lens surface) of the microlenses MS, it is possible to direct incoming light (represented by dash-and-dot line arrows) to the light-receiving surfaces of the photodiodes PD as shown in FIGS. 9A and 9B (optical path diagrams corresponding to FIGS. 8A and 8B).

[2-2. Fabrication Method of an Image Sensor Employing a CCD]

Now, the fabrication method of the CCD sensor DVE[CC] will be described with reference to FIGS. 10A to 10F and FIGS. 11A to 11F. For the same reason as stated previously, the following description exclusively discusses the fabrication process of the microlens unit MSU.

FIGS. 10A to 10F show a cross-section of the CCD sensor DVE[CC] along the longer-side direction LD within the surface of one pixel, and correspond to FIG. 8A. On the other hand, FIGS. 11A to 11F show a cross-section of the CCD sensor DVE[CC] along the shorter-side direction SD within the surface of one pixel, and correspond to FIG. 8B.

Figure 10A:
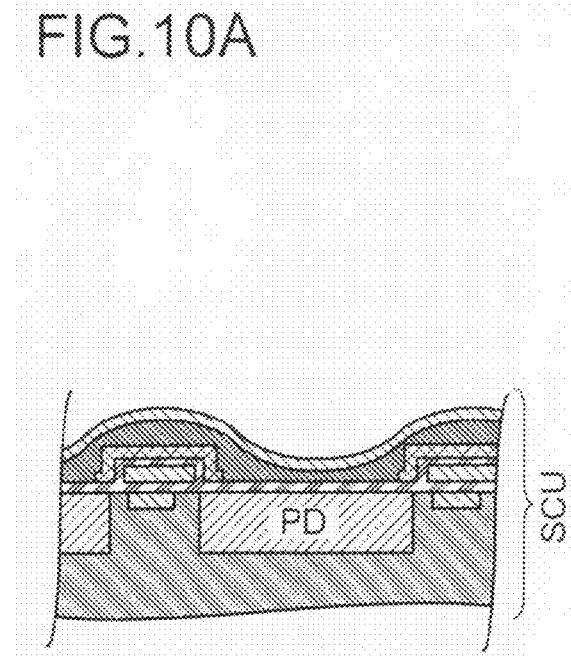
[FIG. 10A] A cross-sectional view showing a step in the process for fabricating the microlens unit provided in the CCD sensor.
Figure 10B:
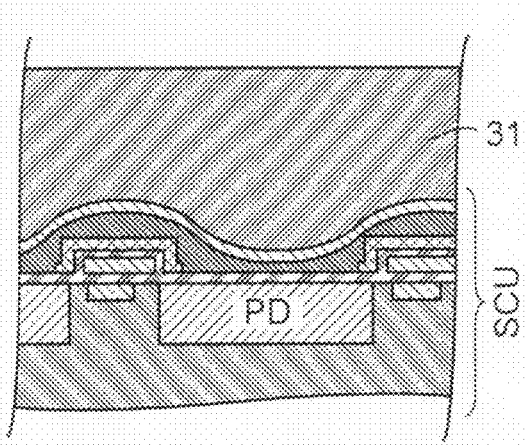
[FIG. 10B] A cross-sectional view showing a step in the process for fabricating the microlens unit provided in the CCD sensor.
Figure 11A:
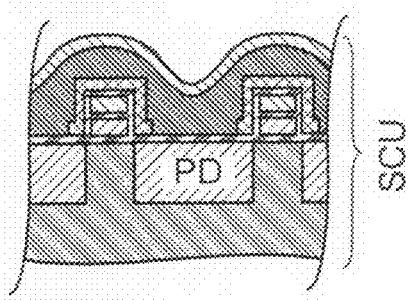
[FIG. 11A] A cross-sectional view, as seen from a different direction from FIG. 10A, showing a step in the process for fabricating the microlens unit provided in the CCD sensor.
Figure 11B:
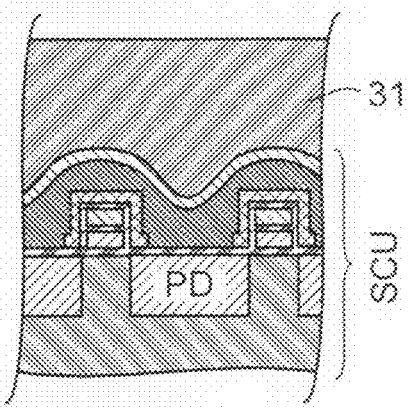
[FIG. 11B] A cross-sectional view, as seen from a different direction from FIG. 10B, showing a step in the process for fabricating the microlens unit provided in the CCD sensor.

FIGS. 10A and 11A show the substrate unit SCU. As shown in FIGS. 10B and 11B, on the substrate unit SCU (more specifically, the protection film 46), acrylic resin or the like is applied by spin coating or the like, and is then hardened by heat treatment to form the flattening film 31 [flattening film formation step].

Figure 10C:
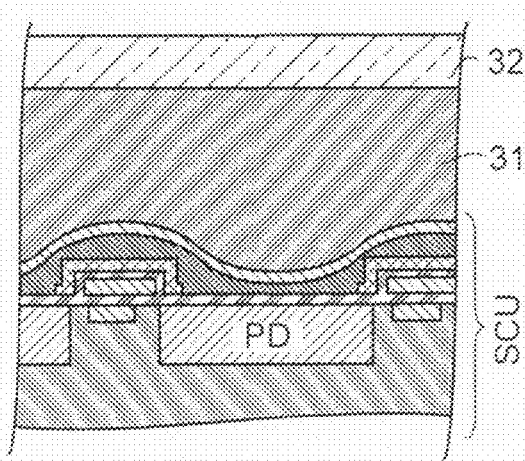
[FIG. 10C] A cross-sectional view showing a step in the process for fabricating the microlens unit provided in the CCD sensor.
Figure 10D:
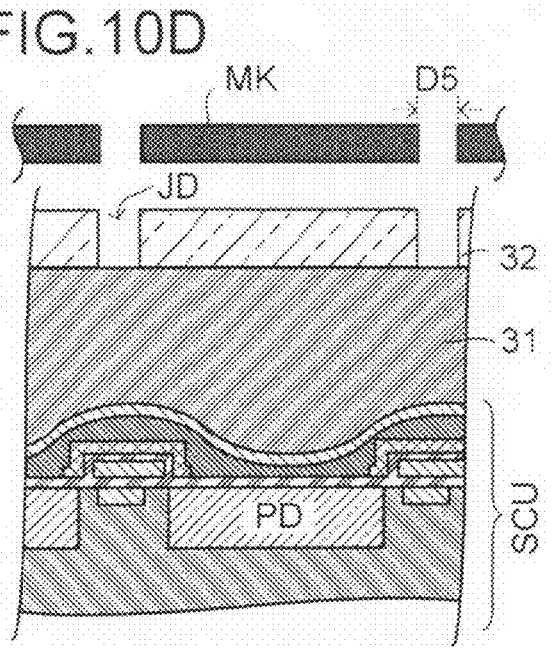
[FIG. 10D] A cross-sectional view showing a step in the process for fabricating the microlens unit provided in the CCD sensor.
Figure 11C:
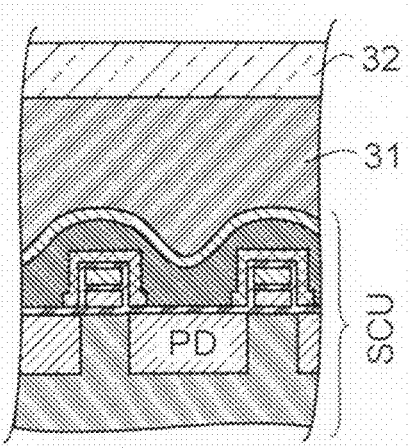
[FIG. 11C] A cross-sectional view, as seen from a different direction from FIG. 10C, showing a step in the process for fabricating the microlens unit provided in the CCD sensor.
Figure 11D:
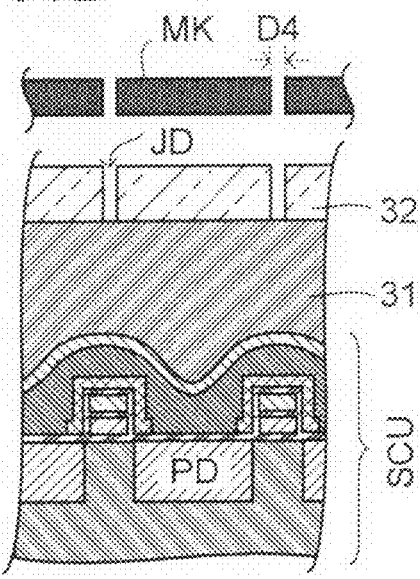
[FIG. 11D] A cross-sectional view, as seen from a different direction from FIG. 10D, showing a step in the process for fabricating the microlens unit provided in the CCD sensor.

Then, on the flattening film 31, photosensitive acrylic resin or the like is applied by spin coating or the like. Now, as shown in FIGS. 10C and 11C, the lens material film 32 is formed [lens material film formation step]. Thereafter, with a mask MK having slits ST as shown in FIG. 12, exposure and development are performed. Now, as shown in FIGS. 10D and 11D, ditches (removed ditches) JD are formed that have widths corresponding to the widths (slit widths) of the slits ST in the mask MK [removed ditch formation step].

In this mask MK, the slits ST corresponding to the intervals between the longer sides of the pixels have a slit width D4, and the slits ST corresponding to the intervals between the shorter sides of the pixels have a slit width D5, the slit widths D4 and D5 fulfilling the relationship D4<D5. Thus, the mask MK has slits with the slit width D4 arranged along each other along a first direction (the longer-side direction LD), and has slits with the slit width D5 arranged along each other along a second direction (e.g., the direction perpendicular to the first direction, i.e., the shorter-side direction SD).

Figure 10E:
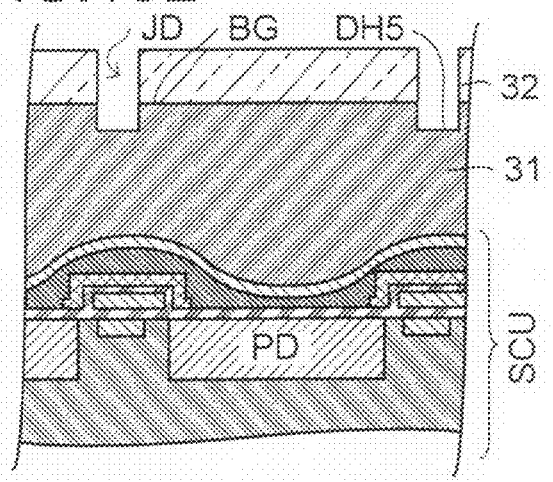
[FIG. 10E] A cross-sectional view showing a step in the process for fabricating the microlens unit provided in the CCD sensor.
Figure 11E:
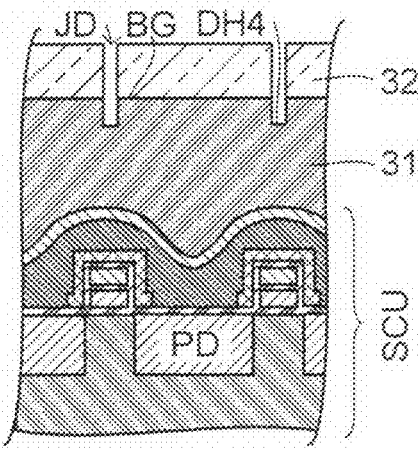
[FIG. 11E] A cross-sectional view, as seen from a different direction from FIG. 10E, showing a step in the process for fabricating the microlens unit provided in the CCD sensor.

Next, using as a pattern mask the lens material film 32 having the removed ditches JD formed in it, dry etching or the like is performed. As shown in FIGS. 10E and 11E, this causes the portions of the flattening film 31 located under the bottom of the removed ditches JD to be etched away, and thus trenches DH (DH4 and DH5) having widths D4' and D5' corresponding to the slit widths D4 and D5 are formed [trench formation step]. As in the CMOS sensor DVE[CS], as a result of the trenches DH being formed, the portions elsewhere are left as elevated portions. Thus, the elevated portions left adjoining the trenches DH are called the elevations BG.

Figure 10F:
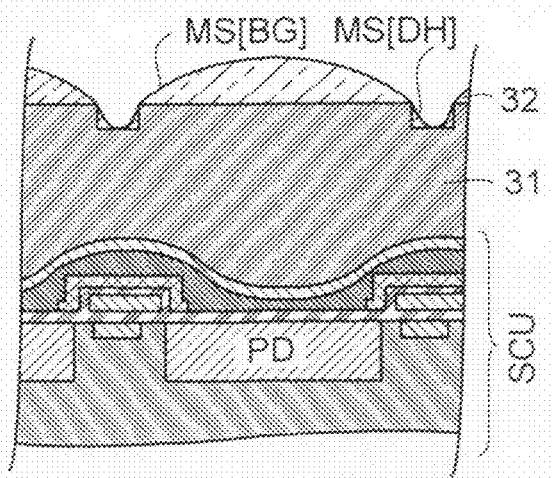
[FIG. 10F] A cross-sectional view showing a step in the process for fabricating the microlens unit provided in the CCD sensor.
Figure 11F:
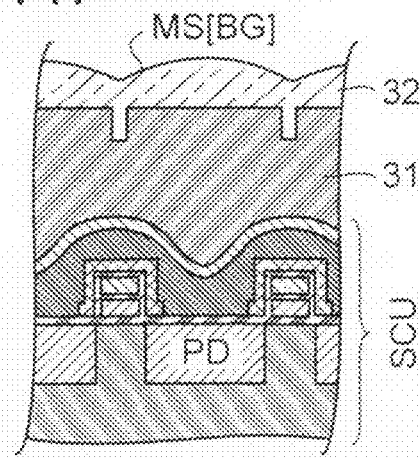
[FIG. 11F] A cross-sectional view, as seen from a different direction from FIG. 10F, showing a step in the process for fabricating the microlens unit provided in the CCD sensor.

When heat is applied to the flattening film 31 having the trenches DH formed in it and the lens material film 32 having the removed ditches JD formed in it, the lens material film 32 softens and melts. In particular, the portions of the lens material film 32 forming the side walls of the removed ditches JD flow into the trenches DH. Thus, as shown in FIGS. 10F and 11F, the portions of the lens material film 32 supported on the elevations BG change their shape [microlens formation step].

[2-3. Shape of the Microlenses in a CCD Sensor]

As in the fabrication method of the CMOS sensor DVE [CS], the lens material gradually flows into the trenches DH toward the center of their bottom. Thus, where the trench width D' is comparatively large (e.g., in the trenches DH5 with the trench width D5'), as shown in FIGS. 8A and 10F, microlenses MS having a concave shape (concave lenses MS[DH]) are formed in the trenches DH5. That is, the portions of the lens material film 32 that have flowed into the trenches DH5 have a shape depressed as seen from the outside; that is, they have a concave cross-section along the longer-side direction LD).

However, as a result of the lens material flowing into the trenches DH5, the portions of the lens material film 32 supported on the elevations BG have a shape elevated toward the outside; that is, they have a convex shape along the longer-side direction LD. In addition, where, as in the trenches DH5 with the comparatively large width D5', the volume of the lens material film 32 that flows into them is smaller than the volume of the trenches DH5 themselves, the edges, located near the trenches DH5, of the portions of the lens material film 32 supported on the elevations BG overlap with the edges of the elevations BG. Consequently, those edges of the lens material film 32 lie on the surface of the elevations BG.

On the other hand, where the trench width D' is comparatively small (e.g., in the trenches DH4 with the width D4'), the portions of the lens material film 32 forming the edges of the lens layer supported on the elevations BG (i.e., forming the side walls of the removed ditches JD) flow into the trenches DH4, and thus the portions of the lens material film 32 supported on the elevations BG are formed into convex microlenses MS (convex lenses MS[BG]).

In particular, where, as shown in FIGS. 8B and 11F, the trench width D' is comparatively small and the volume of the lens material that flows into the trenches DH is larger than the volume of the trenches DH themselves, the lens material overflows out of the trenches DH4. Thus, the edges, located near the trenches DH4, of the portions of the lens material film 32 supported on the elevations BG do not overlap with the edges of the elevations BG, but overlap with somewhere around the center of the bottom of the trenches DH5 and remain displaced above the surface of the elevations BG.

Thus, the portions of the lens material film 32 in the trenches DH with the comparatively large width D' form concave lenses MS[DH] having a concave cross-section along the longer-side direction LD. On the other hand, the portions of the 32 supported on the elevations BG form convex lenses MS[BG] having a convex cross-section along both the longer-side and shorter-side directions LD and SD.

Here, in the cross-section along the longer-side direction LD, the edges of the convex lenses MS[BG] coincide with the edges of the elevations BG. On the other hand, in the cross-section along the shorter-side direction SD, the edges of the convex lenses MS[BG] do not coincide with the edges of the elevations BG but overlap with somewhere around the center of the bottom of the trenches DH and remain displaced above the surface of the elevations BG.

That is, the edges of the convex lenses MS[BG] have different heights above the surface of the elevations BG between in the longer-side and shorter-side directions LD and SD. Thus, the convex lenses MS[BG] have different curvatures between in the longer-side and shorter-side directions LD and SD. That is, the convex lenses MS[BG] have different curvatures in different directions according to whether or not their edges lie on the surface of the elevations BG.

Specifically, let the local curvatures of the microlenses MS near the trenches DH4 and DH5 be RR4 and RR5, then they fulfill the relationship "RR4<RR5". That is, the curvature (RR5) of the convex lenses MS[BG] along the longer-side direction LD is sharper than their curvature (RR4) along the shorter-side direction SD (the portions of the microlenses MS supported on the elevations BG have axis-nonsymmetric aspherical surfaces).

Thus, also in the fabrication method described above, the shape (in particular, the curvature) of the microlenses MS formed on the elevations BG is adjusted as a result of the lens material film 32 flowing into the trenches DH formed in the flattening film 31. Likewise, the curvature of the microlenses MS formed in the trenches DH (the concave lenses MS[DH]) is adjusted according to how the lens material flows into them (which depends on the trench width D', the depth of the trenches DH (trench depth), and the volume of the trenches DH.

[3. Summary]
[3-1. Summary 1]

The CMOS sensor DVE[CS] and the CCD sensor DVE[CC] each include a microlens unit MSU, which includes a lens material film 32 formed into microlenses MS and a flattening film 31 supporting the lens material film 32. The fabrication method of the microlens unit MSU includes several steps as noted below.

Lens Material Film Formation Step—
The step in which the lens material is applied to the flattening film 31 to form the lens material film 32. Since the flattening film 31 is supported by the substrate unit SCU, it may be described as being supported by the substrate 11, which is the main member of the substrate unit SCU.

Removed Ditch Formation Step—
The step in which, through the mask MK with the slits ST, the lens material film 32 is exposed and developed to form the removed ditches JD in the surface of the lens material film 32.

Trench Formation Step—
The step in which the portions of the flattening film 31 located under the removed ditches JD are etched away to form the trenches DH.

Microlens Formation Step—
The step in which, by application of heat, the lens material film 32 is melted to flow into the trenches DH in the flattening film 31 so that the lens material film 32 is formed into the microlenses MS. In this step, the lens material film 32 formed into the microlenses is laid over the elevations BG and the trenches DH that are formed adjoining each other in the surface of the flattening film 31.

Now, a description will be given particularly to the microlens formation step. In the microlens formation step, by application of heat (by heat reflow), the lens material film 32 is softened and melted to be formed into curved surfaces. The shape of the microlenses MS varies according to factors such as how the lens material film 32 flows and the volume of the lens material film 32 that flows (these factors are called the primary factors).

Accordingly, in the microlens formation step, part of the lens material film 32 is made to flow into the trenches DH in such a way that the primary factors can be adjusted. Specifically, in the microlens formation step, the portions of the lens material film 32 supported on the elevations BG is melted by heat so that part of the lens material film 32 flows into the trenches DH; thereby the shape of the portions of the lens material film 32 supported on the elevations BG is so changed to form the microlenses MS.

What is particular here is that the trenches DH are used to give the microlenses MS various shapes. For example, to form the convex lenses MS[BG], in the microlens formation step, the portions of the lens material film 32 that are the first to melt on application of heat—the portions of the lens material film 32 located at its surface and forming the edges of its portions supported on the elevations BG—are made to flow into the trenches DH so that the thickness of the portions of the lens material film 32 supported on the elevations BG as measured at their edges is smaller than the thickness of the lens material film 32 as measured at the center of the surface of the elevations BG.

With this design, while, at the edges of the elevations BG, a comparatively large volume of the lens material film 32 flows into the trenches DH, at the center of the surface of the elevations BG, no part of the lens material film 32 flows into the trenches DH. Thus, the convex lenses MS[BG] are formed on the elevations BG.

In particular, to permit adjustment of the thicknesses of the lens material film 32 at the center of the surface of and at the edges of the elevations BG (that is, to permit adjustment of the curvature of the convex lenses MS[BG]), it is preferable that the trenches DH formed in the flattening film 31 have a plurality of widths D'.

For example, suppose that, as shown in FIGS. 5A and 5B, the trenches DH1, DH2, and DH3 have an equal depth but have different widths D' (D1'<D2'<D3'). Then, where the trench width D' is comparatively large (e.g., D3'), part of the lens material film 32 supported on the elevations BG adjoining the trenches DH3 flows into the trenches DH3. Thus, as the lens material film 32 flows in, the shape of the portions of the lens material film 32 supported on the elevations BG changes from flat to curved. Thus, the microlenses MS are formed on the elevations BG, and the edges of these microlenses MS have the curvature (local curvature RR3) that depends on the primary factors controlled with the trenches DH3.

On the other hand, where the trench width D' is comparatively small (e.g., D1' and D2'), the lens material first gradually flows into but then overflows out of the trenches DH1 and DH2; thus no concave lenses are formed in the trenches DH1 and DH2. Although the lens material overflows out of the trenches DH1 and DH2, since the lens material film 32 is now liquid, the shape of its portions supported on the elevations BG changes from flat to curved. As a result, the microlenses MS are formed on the elevations BG, and the edges of these microlenses MS have the curvatures (local curvatures RR1 and RR2) that depend on the primary factors controlled with the trenches DH1 and DH2.

The comparatively large trench width D' (e.g., D3') is so set that the lens material film 32 flows into the trenches DH3 along their side walls and then toward the center of their bottom such that the thickness of the lens material film 32 that stays at the center of the bottom is smaller than the thickness of the lens material film 32 that stays at the edges of the bottom.

With this design, while a comparatively large volume of the lens material film 32 attaches at the edges of the bottom of the trenches DH3, a comparatively small volume of the lens material film 32 attaches at the center of the bottom of the trenches DH3. Thus, concave microlenses MS (concave lenses MS[DH]) are formed in the trenches DH3. Thus, the concave lenses MS[DH] are formed according to the primary factors controlled with the trenches DH3.

The above description applies equally to the example shown in FIGS. 8A and 8B. Specifically, even when the trenches DH4 and DH5 have an equal depth, if they have different widths D' (D4'<D5'), where the trench width D' is comparatively large (e.g., D5'), concave microlenses MS (concave lenses MS[DH]) are formed in the trenches DH5. This is because the width D5' of the trenches DH5 also is so set that the lens material film 32 flows into the trenches DH5 along their side walls and then toward the center of their bottom such that the thickness of the lens material film 32 that stays at the center of the bottom is smaller than the thickness of the lens material film 32 that stays at the edges of the bottom.

Thus, as the lens material film 32 flows into the trenches DH5, the portions of the lens material film 32 supported on the elevations BG are formed into convex lenses MS[BG], and the edges of these convex lenses MS[BG] have the curvature (local curvature RR5) according to the primary factors controlled with the trenches DH5.

On the other hand, where the trench width D' is comparatively small (e.g., D4'), no concave lenses are formed in the trenches DH4. However, since the lens material is now fluid, the portions of the lens material film 32 supported on the elevations BG are formed into convex lenses MS[BG]. The edges of these convex lenses MS[BG] have the curvature (local curvature RR4) according to the primary factors controlled with the trenches DH4.

From the foregoing, it will be understood that the trenches DH provide parameters according to which the primary factors can be controlled. Thus, the microlens formation step offers new parameters in the adjustment of the shape (curvature) of the microlenses MS.

In the flattening film 31, the trenches DH may be formed along each other so that the different trench widths D' occur alternately. For example, as in the CMOS sensor DVE[CS] shown in FIG. 5A, the trenches DH1 and DH3 may be formed along each other along the horizontal direction HD. With this design, the microlenses MS have different curvatures (local curvature RR1 and RR3) in the horizontal direction HD.

In addition, in the CMOS sensor DVE[CS] shown in FIG. 5B, the trenches DH2 are also formed along each other along the vertical direction VD. Thus, the microlenses MS have a curvature (local curvature RR2) in the vertical direction VD. As a result, in the CMOS sensor DVE[CS], the microlenses MS have curved-surfaces (free-form surfaces) that mixedly have different curvatures (local curvatures RR1, RR2, and RR3).

As in the flattening film 31 in the CCD sensor DVE[CC] shown in FIGS. 8A and 8B, trenches DH4 (first trenches) and DH5 (second trenches) with different widths D4' and D5' may be formed so as to cross each other. That is, trenches DH4 may be formed along each other in a first direction (along the shorter-side direction SD), with trenches DH5 formed along each other in a second direction (along the longer-side direction LD) different from the first direction.

With this design, on the elevations BG surrounded by the trenches DH4 and DH5, microlenses MS are formed that have a curvature (the local curvature RR4) ascribable to the trenches DH4 and a curvature (the local curvature RR5) ascribable to the trenches DH5. That is, the microlenses MS has curved surfaces having a comparatively gentle curvature (the local curvature RR4) in the shorter-side direction SD and a comparatively sharp curvature (the local curvature RR5) in the longer-side direction LD.

Figure 14B:
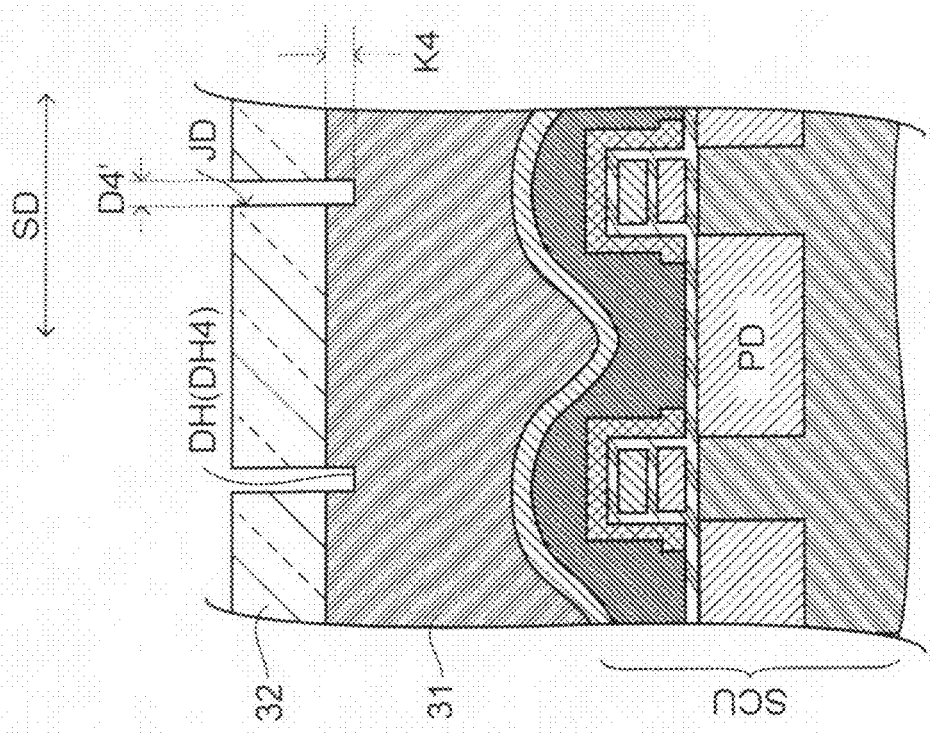
[FIG. 14B] A cross-sectional view showing another example of FIG. 8B.
Figure 14A:
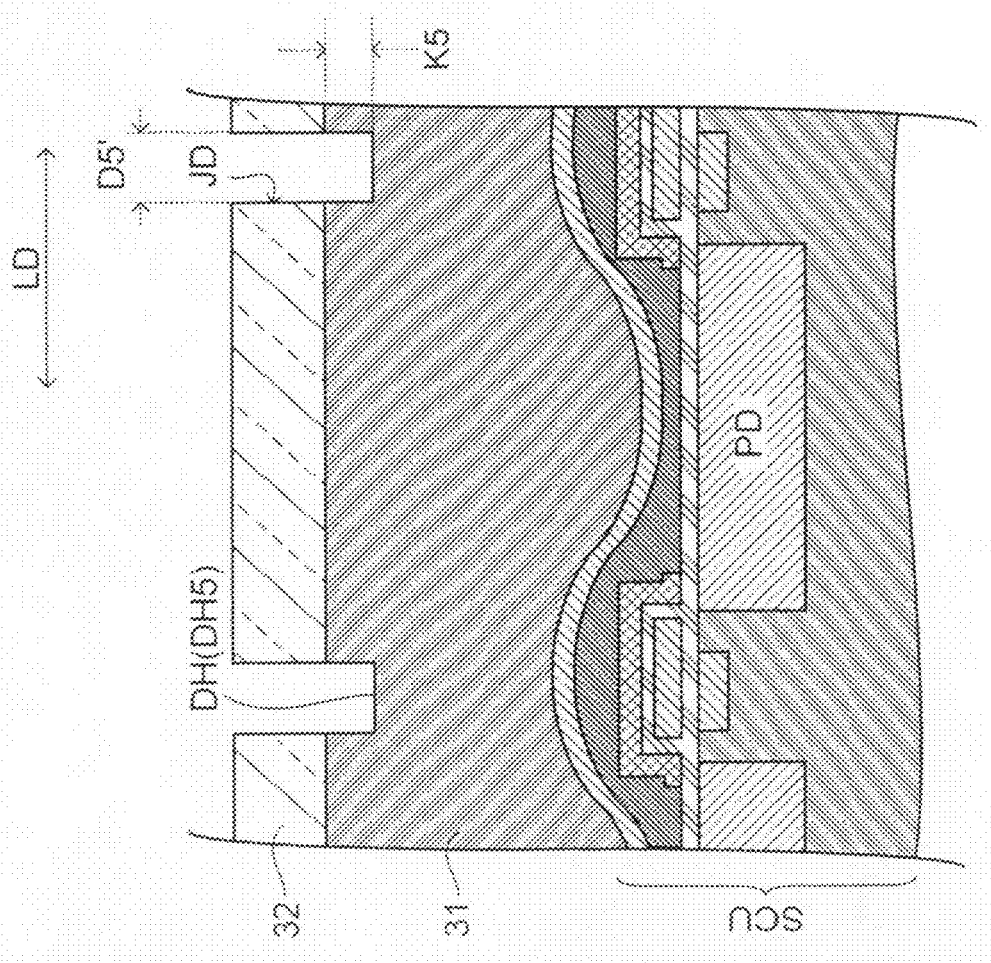
[FIG. 14A] A cross-sectional view showing another example of FIG. 8A.

As shown in FIGS. 13A and 13B (corresponding to FIGS. 5A and 5B) showing cross-sections of the CMOS sensor DVE[CS] and in FIGS. 14A and 14B (corresponding to FIGS. 8A and 8B) showing cross-sections of the CCD sensor DVE [CC], the trenches DH formed in the flattening film 31 may have a plurality of depths K. With this design, the primary factors can be controlled also according to the trenches DH.

The depth of the trenches DH may differ among trenches DH having an equal trench width D', or may differ according to the varying widths D' of the trenches DH as shown in FIGS. 13A and 13B and FIGS. 14A and 14B (K1<K2<K3, K4<K5). With this design, the trenches DH formed in the flattening film 31 have a plurality of volumes.

To give the trenches DH formed in the flattening film 31a plurality of widths D', in the removed ditch formation step, a mask MK is used that has slits ST having a plurality of widths (D1 to D5) (see FIGS. 3 and 12). To give the trenches DH formed in the flattening film 31 a plurality of depths, the etching rate is changed among the trenches DH.

[3-2. Summary 2]

Figure 15:
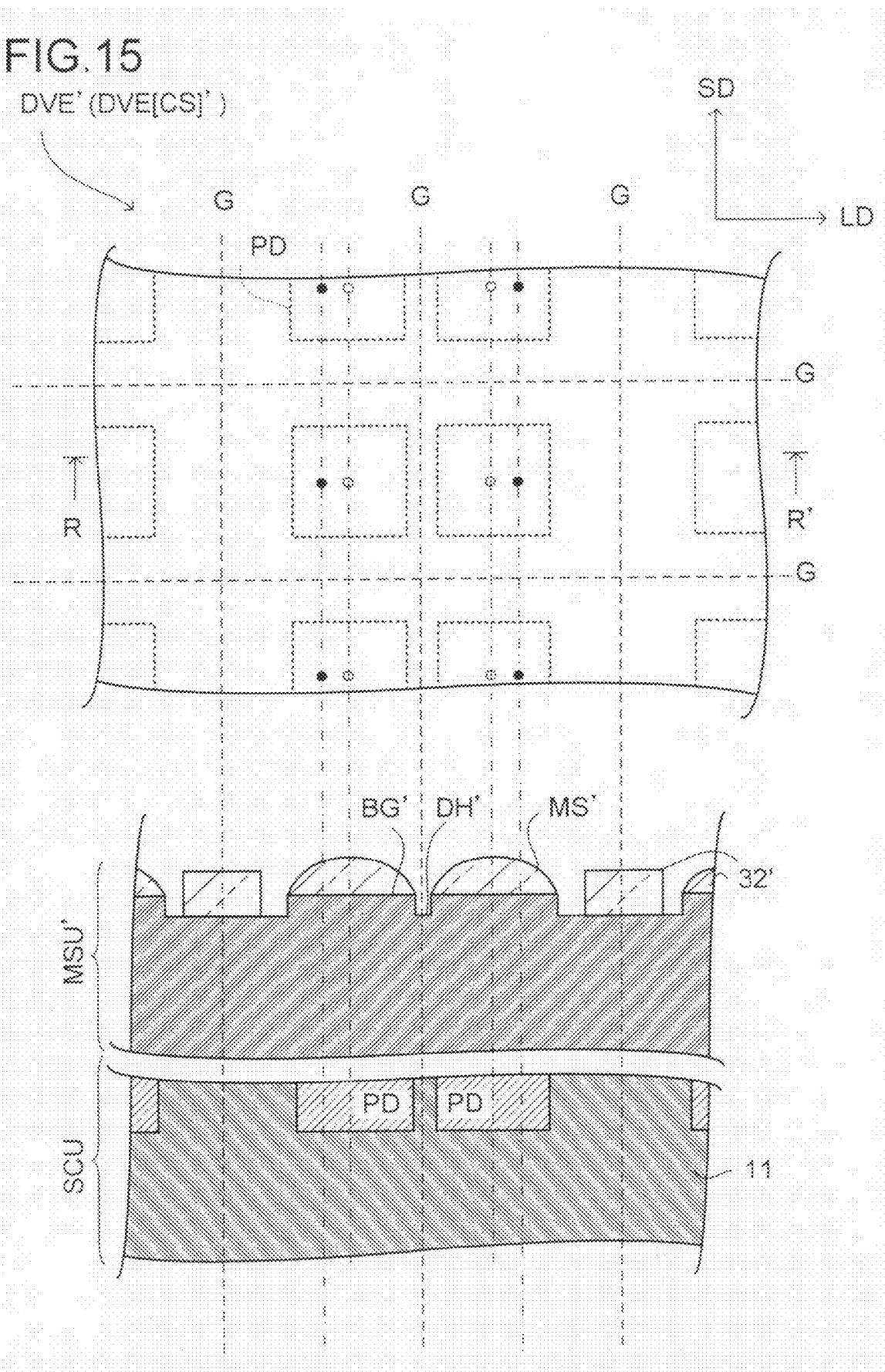
[FIG. 15] A plan view and a cross-sectional view of a CMOS sensor in a case where no lens material film is made to flow into trenches with an extremely small width.

As shown in a plan view in FIG. 15, in a CMOS sensor DVE' (DVE[CS]') in which two photodiodes PD are arranged closer together for one charge detector (unillustrated), the light-receiving surface centers (indicated by hollow circles) of the photodiodes PD do not coincide with the cell centers (indicated by solid black circles) of the pixels. Thus, unless microlenses MS' are so formed that their surface centers (microlens centers) coincide with the light-receiving surface centers of the photodiodes PD, light cannot be directed to the photodiodes PD.

Thus, in a microlens unit MSU' in which the portions of the lens material film 32' supported on the elevations BG' are not made to flow into the trenches DH' but instead another lens material film 32' is separately formed in the trenches DH' (e.g., a microlens unit MSU' fabricated by the fabrication method of Patent Document 2), if the microlens centers are made to coincide with the light-receiving surface centers (indicated by hollow circles), then, as shown in a cross-sectional view (along line R-R') in FIG. 15, the trenches DH' formed where photodiodes PD are arranged closer together have an extremely small width. This makes it impossible to form microlenses in these trenches DH'. Thus, a CMOS sensor DVE' (DVE[CS]') is fabricated that has non-lens regions.

Figure 16:
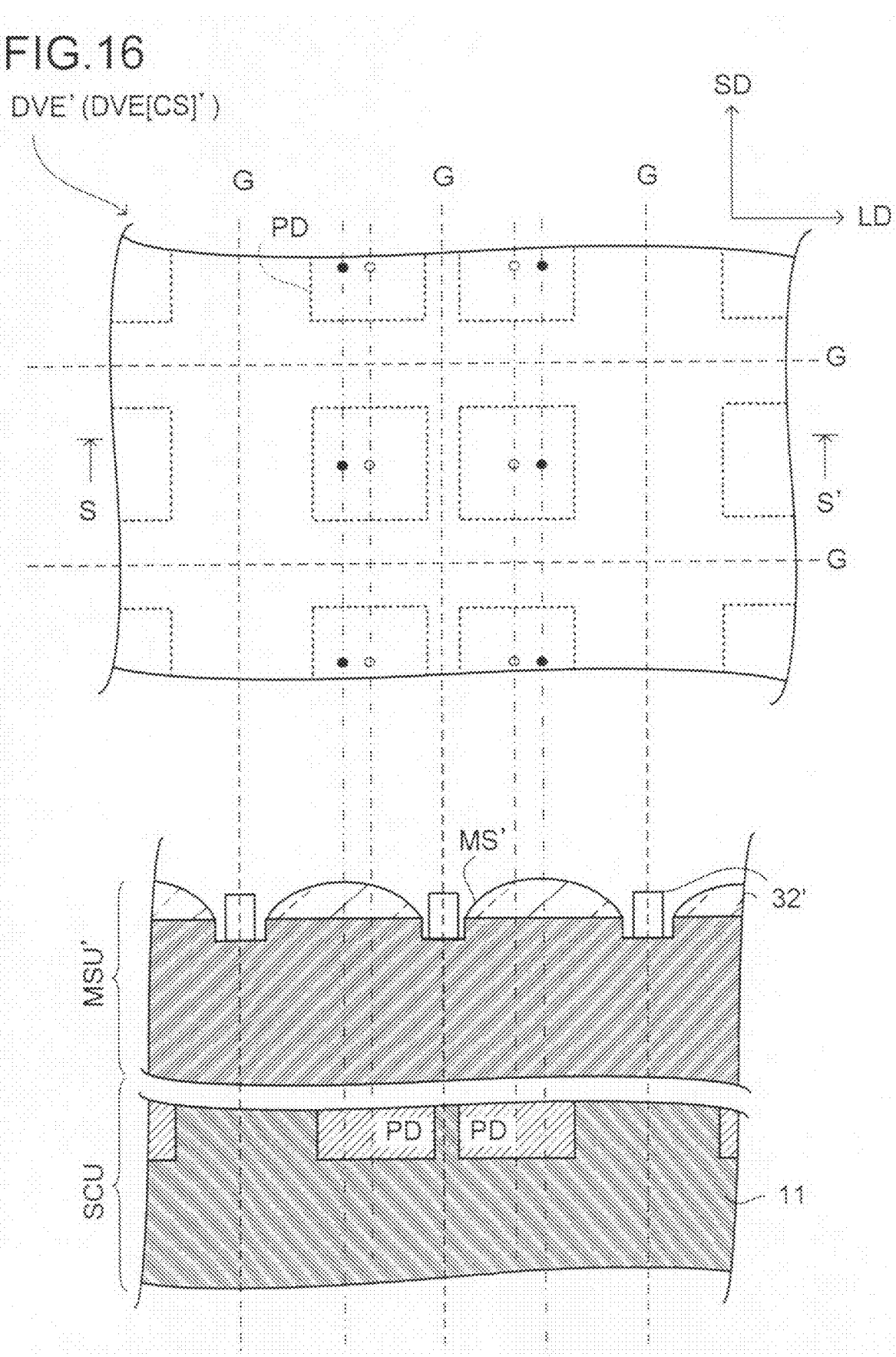
[FIG. 16] A plan view and a cross-sectional view of a CMOS sensor different from the CMOS sensor shown in FIG. 15.

On the other hand, as shown in a plan view and a cross-sectional view (along line S-S') in FIG. 16, when the microlens centers are made to coincide with the cell centers (indicated by solid black circles), then the microlens centers do not coincide with the light-receiving surface centers (indicated by hollow circles). Thus, as shown in FIG. 17, it is difficult for the microlenses MS' to direct incoming light in such a way that the light is condensed at the center of the light-receiving surface of the photodiodes PD.

However, as shown in FIGS. 5A, 5B, and 8B, in the microlens unit MSU, at least part of the edges of the microlenses MS supported on the elevations BG (the convex lenses MS[BG]) overlap with the trenches DH as seen from the direction VV perpendicular to the surface of the flattening film 31.

With this microlens unit MSU, since the edges of the microlenses MS are so located as to overlap with the trenches DH (DH1, DH2, and DH4), the trenches DH are fully filled by the lens material film 32. Thus, for example, even when the trenches have an extremely small width (see FIG. 15), they do not produce a region where no microlenses exist (a non-lens region) (incidentally, since the concave lenses MS[DH] exist in the trenches DH3 and DH5, these trenches produce no non-lens region).

In addition, in a cross-section including the direction of the width D' of the trenches DH and the direction VV perpendicular to the surface of the flattening film 31, the distance from the edges of the microlenses MS supported on the elevations BG to the substrate 11 (the displacement E) varies as the width D' of the trenches DH varies.

More specifically, in a case where a plurality of trenches DH are formed, and these trenches DH have different widths D', in a cross-section including the direction of the trench widths D' and the direction VV perpendicular to the surface of the flattening film 31, let the distance from the edges of the microlenses MS supported on the elevations BG adjoining the trenches DH to the substrate 11 be called the displacement E, then the displacement differs from one place to another in reverse proportion to the different widths.

An example of this relationship is illustrated in FIGS. 18A and 18B (detailed cross-sectional views corresponding to FIGS. 5A and 5B). As shown in these diagrams, let the displacement of the edges of the microlenses MS supported on the elevations BG adjoining the trenches DH1 from the substrate 11 be E1, and let the displacement of the edges of the microlenses MS supported on the elevations BG adjoining the trenches DH2 from the substrate 11 be E2, then the displacements E1 and E2 fulfill the relationship "E1>E2", which is reverse to the relationship (D1'<D2') between the trench widths D'.

Moreover, as shown in FIG. 18A, let the displacement of the edges of the microlenses MS supported on the elevations BG adjoining the trenches DH1 from the substrate 11 be E1, and let the displacement of the edges of the microlenses MS supported on the elevations BG adjoining the trenches DH3 from the substrate 11 be E3, then the displacements E1 and E3 fulfill the relationship "E1>E3", which is reverse to the relationship (D1'<D3') between the trench widths D'.

In addition, as shown in FIGS. 18A and 18B, let the displacement of the edges of the microlenses MS supported on the elevations BG adjoining the trenches DH2 from the substrate 11 be E2, and let the displacement of the edges of the microlenses MS supported on the elevations BG adjoining the trenches DH3 from the substrate 11 be E3, then the displacements E2 and E3 fulfill the relationship "E2>E3", which is reverse to the relationship (D2'<D3') between the trench widths D'.

Figure 19A:
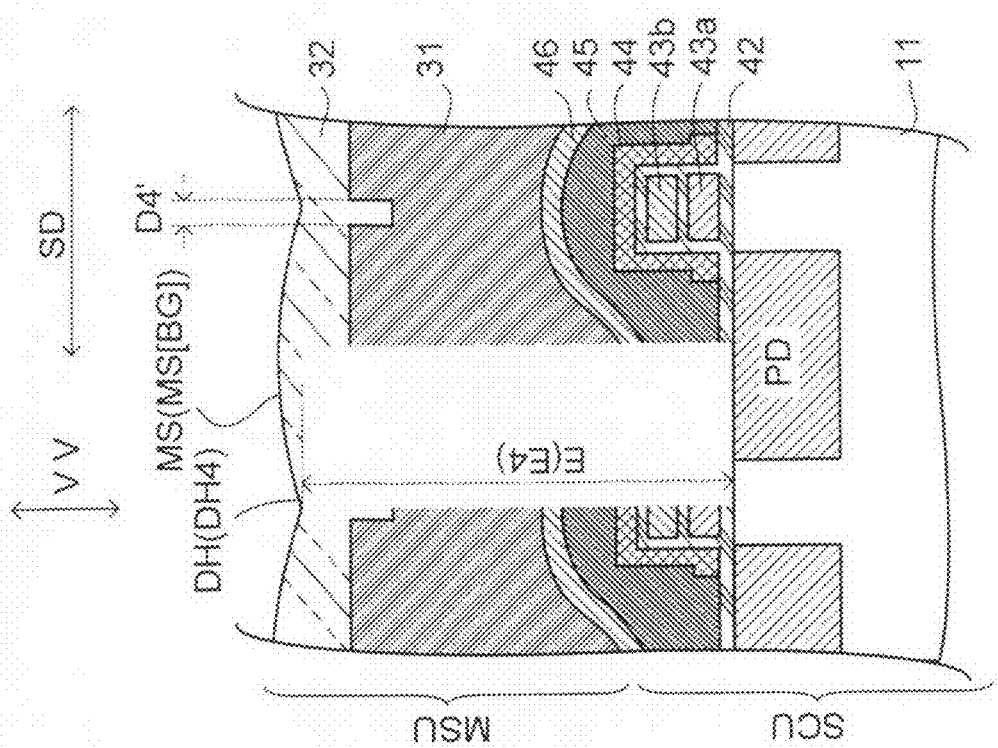
[FIG. 19A] A detailed cross-sectional view of FIG. 8A.
Figure 19B:
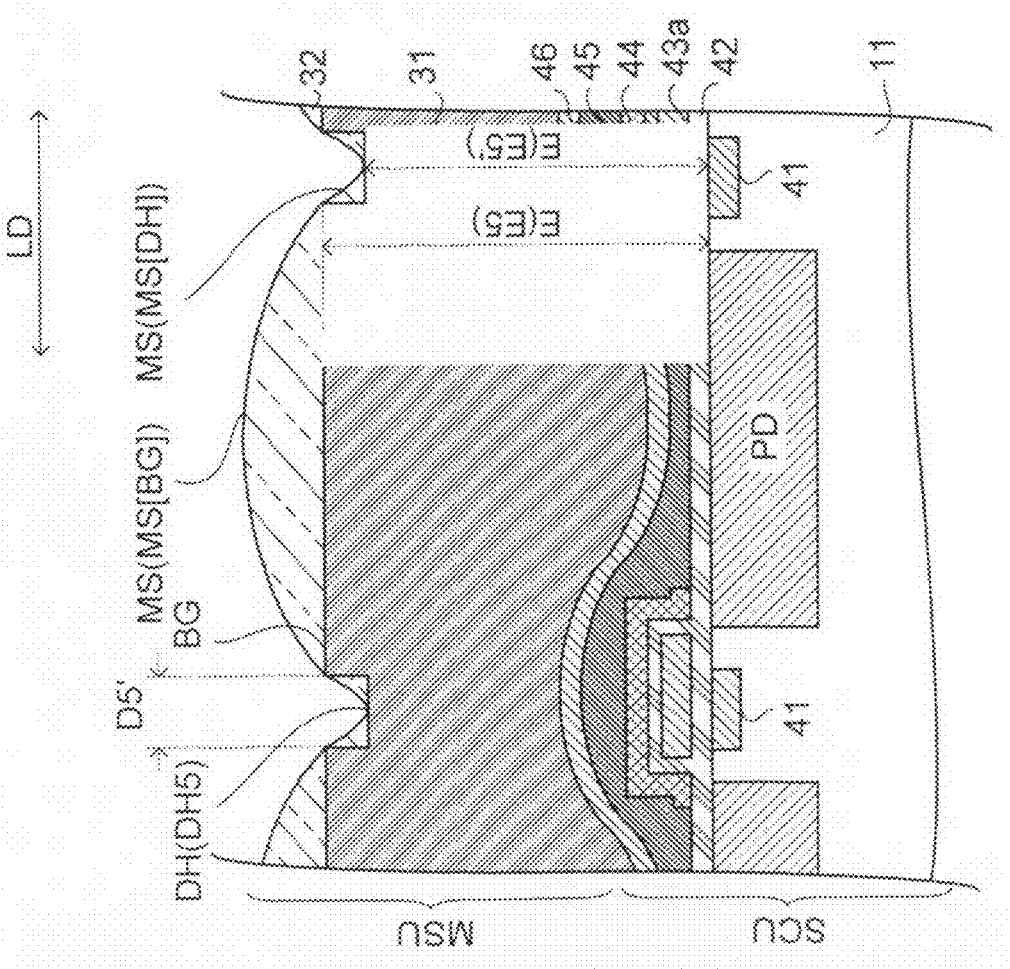
[FIG. 19B] A detailed cross-sectional view of FIG. 8B.

An example of the above relationship, in the case of the CCD sensor DVE[CC], is illustrated in FIGS. 19A and 19B (detailed cross-sectional views corresponding to FIGS. 8A and 8B). As shown in these diagrams, let the displacement of the edges of the microlenses MS supported on the elevations BG adjoining the trenches DH4 from the substrate 11 be E4, and let the displacement of the edges of the microlenses MS supported on the elevations BG adjoining the trenches DH5 from the substrate 11 be E5, then the displacements E4 and E5 fulfill the relationship "E4>E5", which is reverse to the relationship (D4'<D5') between the trench widths D'.

With this design, the microlenses MS have edges with varying heights above the substrate 11—the reference level. That is, even though the microlenses MS have a fixed axial thickness, they have a plurality of different thicknesses at their edges at different places. Accordingly, the microlenses MS have a plurality of curvatures in their curved surfaces; thus, by exploiting these different curvatures, the microlenses MS can direct light to desired positions (the photodiodes PD) (e.g., see FIGS. 6A and 6B and 9A and 9B). That is, the microlens unit MSU have desired curvatures.

Moreover, in a cross-section including the direction of the trench widths D' and the direction VV perpendicular to the surface of the flattening film 31, let the distance from the border planes (represented by broken lines G) between the pixels provided one for each of the microlenses MS supported on the elevations BG to the photodiodes PD be called the margin J.

For example, with reference to FIGS. 6A and 6B, the margin J is described as follows. In FIG. 6A, let the margin from the pixel borders G overlapping with the trenches DH1 to the photodiodes PD be J1, and let the margin from the pixel borders G overlapping with the trenches DH3 to the photodiodes PD be J3; in FIG. 6B, let the margin from the pixel borders G overlapping with the trenches DH2 to the photodiodes PD be J2. Then, these margins J1, J2, and J3 fulfill the relationship "J1<J2<J3".

For another example, with reference to FIGS. 9A and 9B, the margin J is described as follows. In FIG. 9A, let the margin from the pixel borders G overlapping with the trenches DH5 to the photodiodes PD be J5; in FIG. 9B, let the margin from the pixel borders G overlapping with the trenches DH4 to the photodiodes PD be J4. Then, these margins J4 and J5 fulfill the relationship "J4<J5".

The relationship here affects the optical power (refractive power, the reciprocal of the focal length) of the microlenses MS. This is because, where the margin J is small (e.g., J1), the microlenses MS have only to refract light comparatively weakly but, where the margin J is large (e.g., J2), the microlenses MS have to refract light comparatively strongly. In general, so long as the microlenses MS have a fixed axial thickness, the thicker they are at their edges, the gentler the curvature of their curved surfaces (low-powered curved surfaces); the thinner they are at their edges, the sharper the curvature of their curved surfaces (high-powered curved surfaces). That is, a large displacement E (e.g., E1; see FIG. 18A) forms a curved surface with a comparatively weak curvature, and a small displacement E (e.g., E2; see FIG. 18B) forms a curved surface with a comparatively strong curvature.

Thus, a comparatively small margin J combined with a comparatively large displacement E produces a low-powered curved surface that refracts light weakly, and a comparatively large margin J combined with a comparatively small displacement E produces a high-powered curved surface that refracts light strongly. Accordingly, in a case where there are different margins (e.g., J1<J2<J3, or J4<J5), it is preferable that there be different displacements fulfilling the relationship (e.g., E1>E2>E3, or E4>E5) reverse to that between the margins.

In the microlens unit MSU, the elevations BG are so formed as to surround the trenches DH having different trench widths D'. With this design, the trenches DH adjoining the edges of the elevations BG have different widths D', and thus microlenses MS have different thicknesses at their edges at different places. As a result, the fabricated microlenses have a plurality of curvatures.

For example, in the CMOS sensor DVE[CS] shown in FIGS. 5A and 5B, along the edges of the elevations BG run the trenches DH1, DH2, and DH3 with the widths D1', D2', and D3'.

What is particular about the CMOS sensor DVE[CS] is that, in the flattening film 31, the trenches DH1 and DH3 are formed with the different widths D1' and D3' occurring alternately and thereby the elevations BG are formed (see FIG. 5A). More specifically, in the flattening film 31, along a first direction (the horizontal direction HD), the trenches DH1 and DH3 are formed with the alternately occurring different widths D1' and D3', and, along a second direction (the vertical direction VD), the trenches DH2 are formed with the width D2'; thereby the elevations BG are formed (see FIG. 5B).

As a result, the elevations BG adjoin the trenches DH1 and DH3, which run along the surface and along each other and which have the different widths D1' and D3'. In addition, the elevations BG also adjoin the trenches DH2, which run along the surface and with an inclination (of 90 degrees) relative to the trenches DH1 and DH3 and which have the width D2', which differs from the widths D1' and D3' of the trenches DH1 and DH3.

On the other hand, in the CCD sensor DVE[CC] shown in FIGS. 8A and 8B, along the edges of the elevations BG supporting the microlenses MS run the trenches DH4 and DH5 with the widths D4' and D5'.

What is particular about the CCD sensor DVE[CC] is that, in the flattening film 31, the trenches DH4 with the widths D4' are formed along a first direction (the shorter-side direction SD) (see FIG. 8B), and the trenches DH5 with the width D5' are formed along a second direction (longer-side direction LD) different from the first direction; thereby the elevations BG are formed (see FIG. 8A).

As a result, the elevations BG adjoin the trenches DH4 (first trenches), which run along the surface and along each other and which have an equal width, and with the trenches DH5 (second trenches), which run along the surface and with an inclination (of 90 degrees) relative to the trenches DH4 and which have the width D5', which is different from the width D4' of the trenches DH4.

In a case where, in this way, the trenches DH adjoining the elevations BG have different widths D', the displacement E of the edges of the microlenses MS from the substrate 11 is larger where the trench width D' is small than where the trench width D' is large. This is because, the larger the trench widths D', the easier it is for the edges of the portions of the lens material film 32 supported on the elevations BG to flow into the trenches DH.

Accordingly, in the CMOS sensor DVE[CS], as shown in FIG. 18A, the displacement E1 of the edges of the convex lenses MS[BG] overlapping with the trenches DH1 having the smaller width D1' is larger than the displacement E3 of the edges of the convex lenses MS[BG] overlapping with the trenches DH3 having the larger width D3'.

Hence, when the curvature (local curvature RR1) of the portions overlapping with the trenches DH1 is compared with the curvature (local curvature RR3) of the portions overlapping with the trenches DH3, the local curvature RR1 is gentler than the local curvature RR3. Thus, in the horizontal direction HD, the microlenses MS have different curvatures (the local curvatures RR1 and RR3).

Moreover, as shown in FIGS. 18A and 18B, the displacement E1 of the edges of the convex lenses MS[BG] overlapping with the trenches DH1 having the smaller width D1' is larger than the displacement E2 of the edges of the convex lenses MS[BG] overlapping with the trenches DH2 having the larger width D2'.

Hence, when the curvature (local curvature RR1) of the portions overlapping with the trenches DH1 is compared with the curvature (local curvature RR2) of the portions overlapping with the trenches DH2, the local curvature RR1 is gentler than the local curvature RR2. Thus, in the horizontal direction HD and the vertical direction VD, the microlenses MS have different curvatures (the local curvatures RR1 and RR2).

As a result, in the CMOS sensor DVE[CS], the microlenses MS (convex lenses MS[BG]) have curved surfaces that have two different curvatures (local curvature RR1 and RR3) in the horizontal direction HD and one curvature (local curvature RR2) in the vertical direction.

On the other hand, in the CCD sensor DVE[CC], as shown in FIGS. 19A and 19B, the displacement E4 of the edges of the convex lenses MS[BG] overlapping with the trenches DH4 having the smaller width D4' from the substrate 11 is larger than the displacement E5 of the edges of the convex lenses MS[BG] overlapping with the trenches DH5 having the smaller width D5' from the substrate 11.

Hence, when the curvature (local curvature RR4) of the portions overlapping with the trenches DH4 is compared with the curvature (local curvature RR5) of the portions overlapping with the trenches DH5, the local curvature RR4 is gentler than the local curvature RR5. Thus, in the longer-side direction LD and the shorter-side direction SD, the microlenses MS have different curvatures (the local curvatures RR4 and RR5).

How easily the edges of the portions of the lens material film 32 supported on the elevations BG flow into the trenches DH varies not only according to the trench width D' but also according to the depth or volume of the trenches DH. Thus, also within the scope of the present invention is a microlens unit in which, in a cross-section including the direction of the width D' of the trenches DH and the direction vertical to the surface of the flattening film 31, the displacement E of part of the edges of the microlenses MS from the substrate 11 varies according to the depth of the trenches DH. That is, by arranging the elevations BG adjoining a plurality of trenches DH having different depths, it is possible to give the microlenses MS a plurality of curvatures.

Also within the scope of the present invention is a microlens unit in which, in a cross-section including the direction of the width D' of the trenches DH and the direction vertical to the surface of the flattening film 31, the displacement E of part of the edges of the microlenses MS from the substrate 11 varies according to the volume of the trenches DH. That is, by arranging the elevations BG adjoining a plurality of trenches DH having different volumes, it is possible to give the microlenses MS a plurality of curvatures.

[Modifications and Variations]

The present invention may be practiced in any manner other than specifically described above, and allows many modifications and variations within its spirit.

For example, in the microlens unit MSU of the CMOS sensor DVE[CS] and the CCD sensor DVE[CC], convex lenses MS[BG] and concave lenses MS[DH] are formed. Here, the curved surface of the concave lenses MS[DH] and the curved surface of the convex lenses MS[BG] are partly similar, since they both act to direct incoming light to the photodiodes PD.

Specifically, the shapes of the convex lenses MS[BG] and the concave lenses MS[DH] near the side walls of the trenches DH (DH3 and DH5) are similar to each other. Thus, the curved surface of the concave lenses MS[DH] corresponding to the region from the center of the bottom of the trenches DH to their edges (the side walls of the trenches DH) may be regarded as continuous with the curved surface of the convex lenses MS[BG] (i.e., the concave lenses MS[DH] form the skirts of the convex lenses MS[BG]).

Thus, the edges of the microlenses (convex lenses MS[BG]) supported on the elevations BG adjoining the trenches DH spread to the center of the concave lenses MS[DH]. Hence, the displacement E of the convex lenses MS[BG] whose skirts (the part of the curved surface of the convex lenses MS[BG] near their bottom) are formed by the concave lenses MS[DH] in the trenches DH3 and DH5 is as shown in FIGS. 18A and 19A.

Specifically, the distance (displacement E3') from the edges of the microlenses MS supported on the elevations BG adjoining the trenches DH3 to the substrate 11 is the distance from the bottom of the trenches DH3 to the substrate 11, and the distance (displacement E5') from the edges of the microlenses MS supported on the elevations BG adjoining the trenches DH5 is the distance from the bottom of the trenches DH5 to the substrate 11.

Thus, the edges of the microlenses MS supported on the elevations BG adjoining the trenches DH 3 and DH5 may overlap with the edges of the elevations BG, or may overlap with the center of the bottom of the trenches DH. Accordingly, the displacement E of the edges of the microlenses MS supported on the elevations BG adjoining the trenches DH3 may be E3 or E3'; the displacement E of the edges of the microlenses MS supported on the elevations BG adjoining the trenches DH5 may be E5 or E5'.

When the displacements E3' and E5' are compared with the displacements E3 and E5, their relationship fulfills "E3'>E3" and "E5'>E5". Thus, the relationship between the displacement E and the trench width D' may be expressed as follows:
When the trench widths D' fulfill the relationship "D1'<D3'",
    the displacements E fulfill the relationship "E1>E3'";
When the trench widths D' fulfill the relationship "D2'<D3'",
    the displacements E fulfill the relationship "E2>E3'"; and
When the trench widths D' fulfill the relationship "D4'<D5'",
    the displacements E fulfill the relationship "E4>E5'".

Figure 20B:
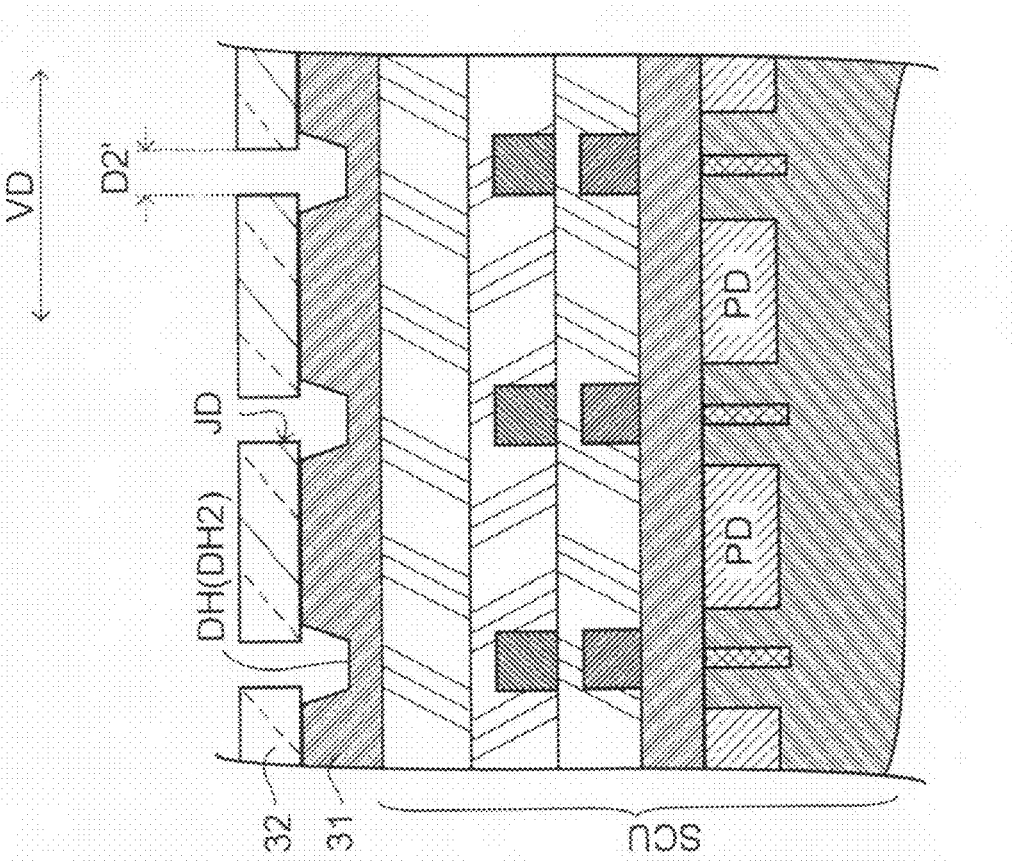
[FIG. 20B] A cross-sectional view showing another example of FIGS. 5B and 13B.
Figure 20A:
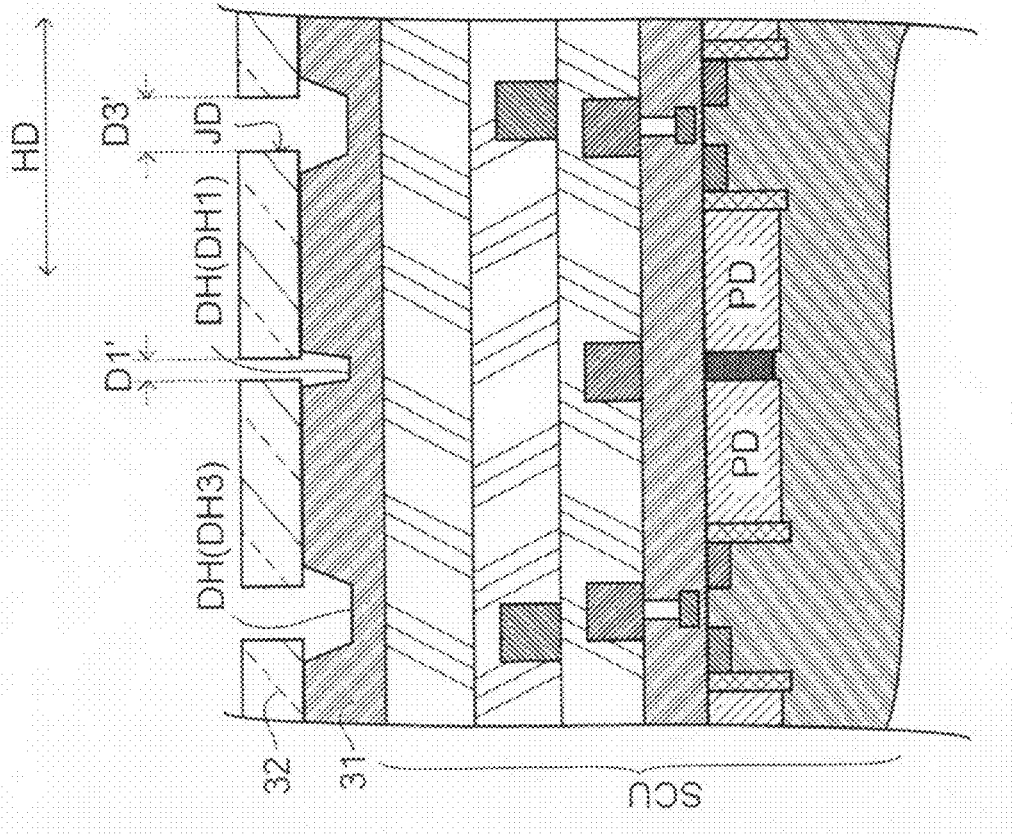
[FIG. 20A] A cross-sectional view showing another example of FIGS. 5A and 13A.
Figure 22:
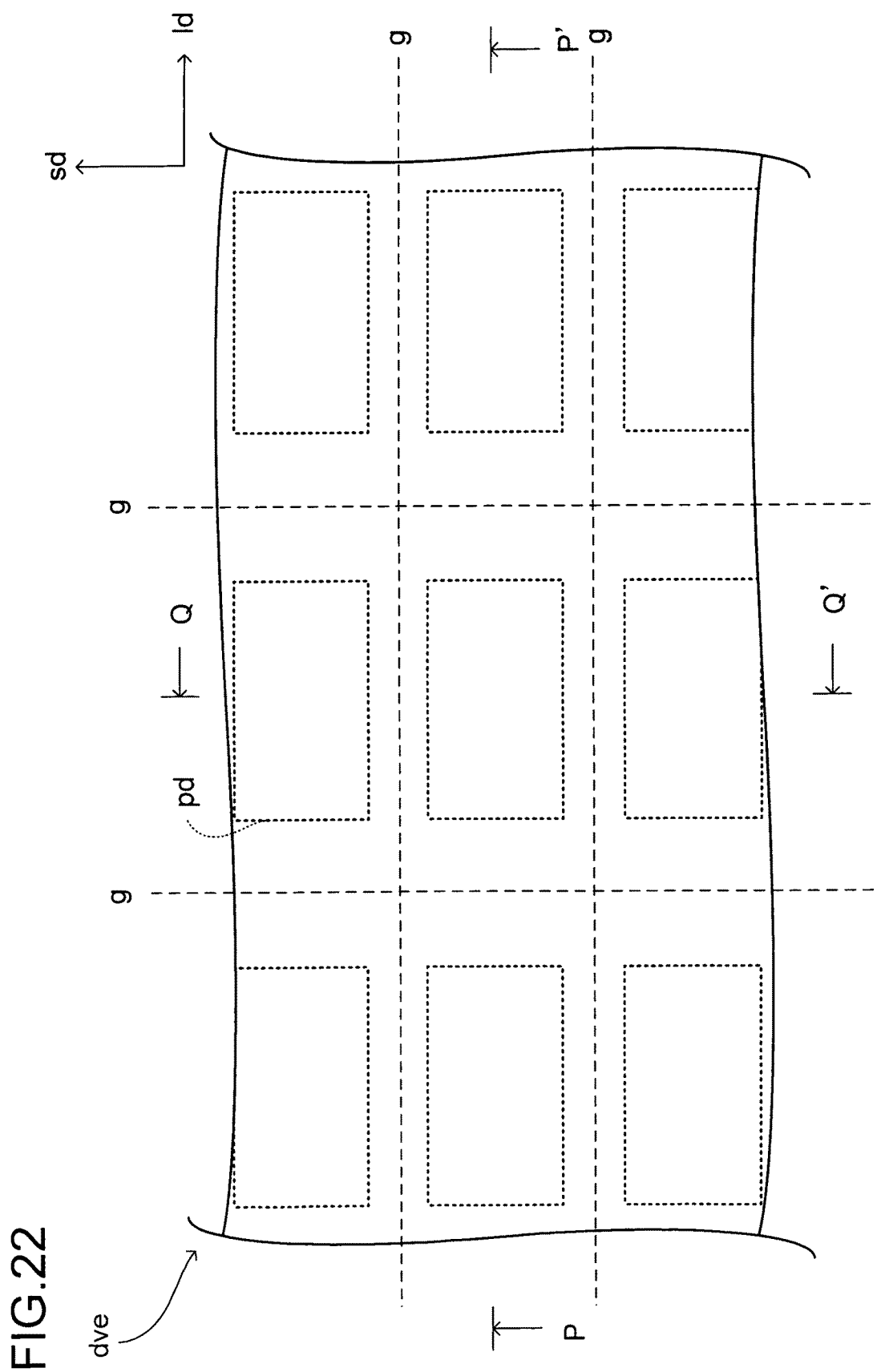
[FIG. 22] A plan view of a conventional image sensor.
Figure 23B:
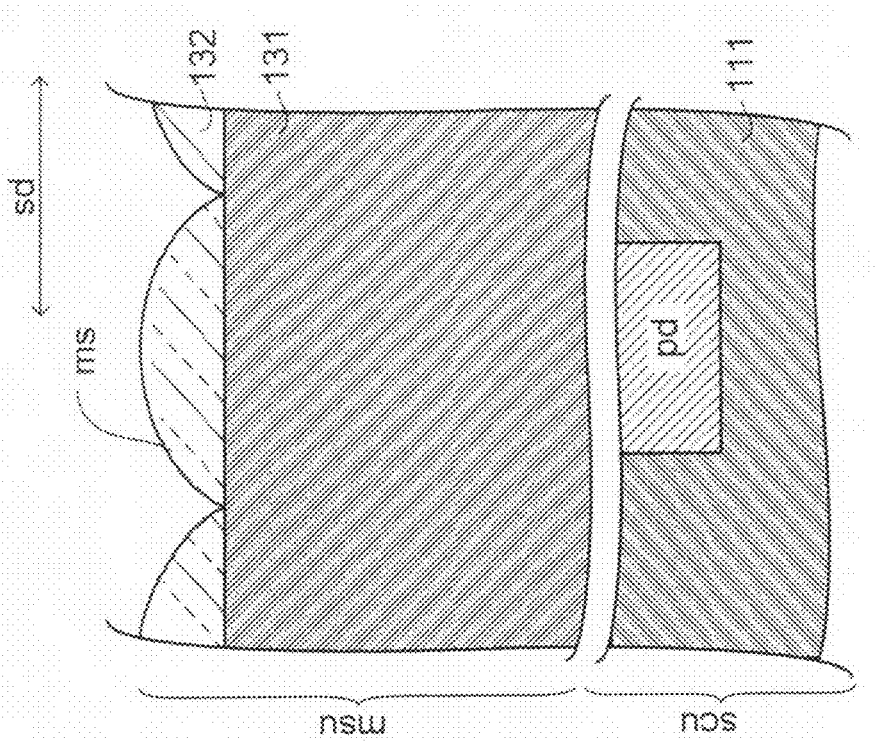
[FIG. 23B] A cross-sectional view of the image sensor shown in FIG. 22, as seen from a different direction from FIG. 23A.
Figure 23A:
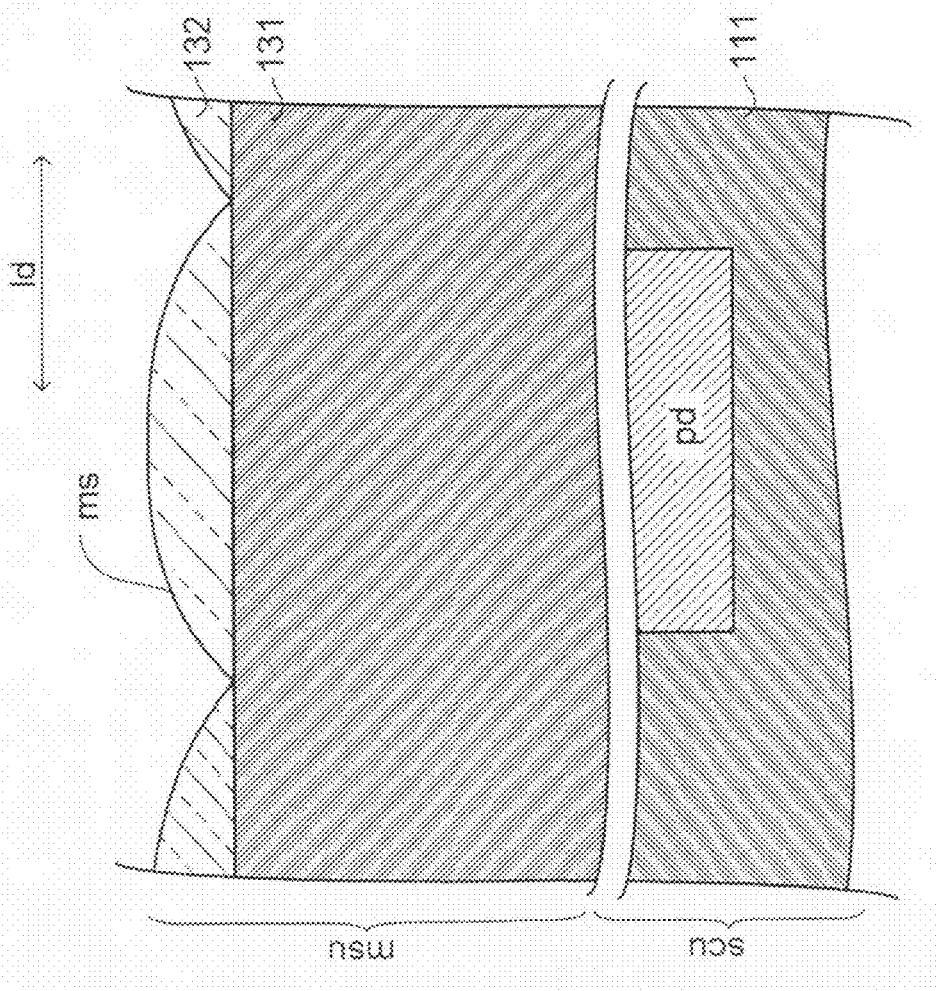
[FIG. 23A] A cross-sectional view of the image sensor shown in FIG. 22, as seen from one direction.
Figure 24:
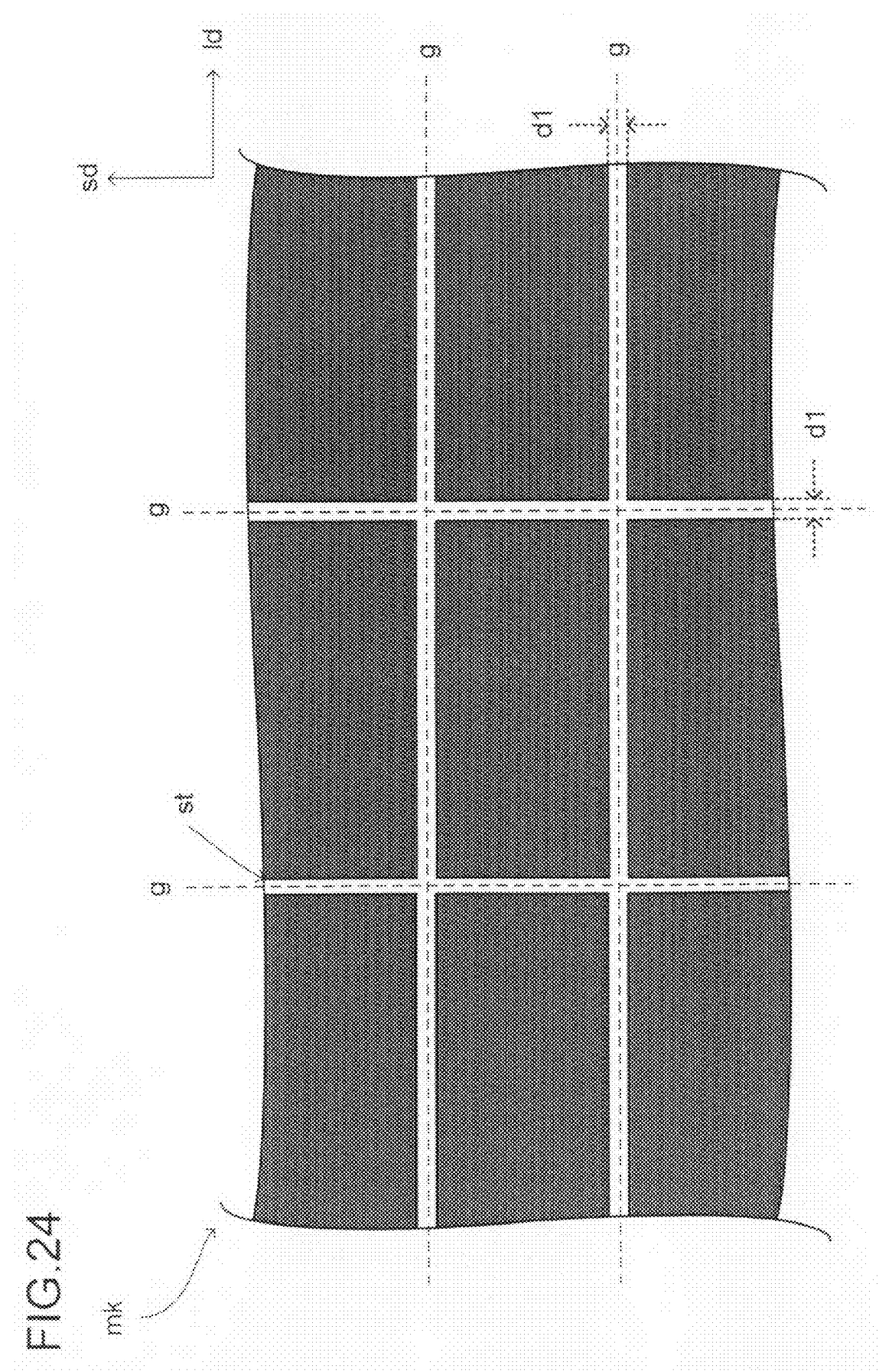
[FIG. 24] A plan view of the mask used in the process for fabricating the image sensor shown in FIG. 22.
Figure 25A:
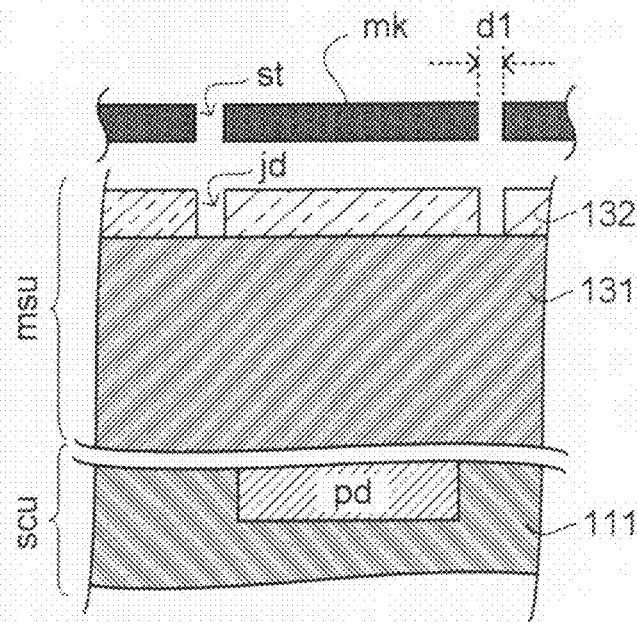
[FIG. 25A] A cross-sectional view showing the process for fabricating the image sensor shown in FIG. 22, with the image sensor seen from the same direction as FIG. 23A.
Figure 25B:
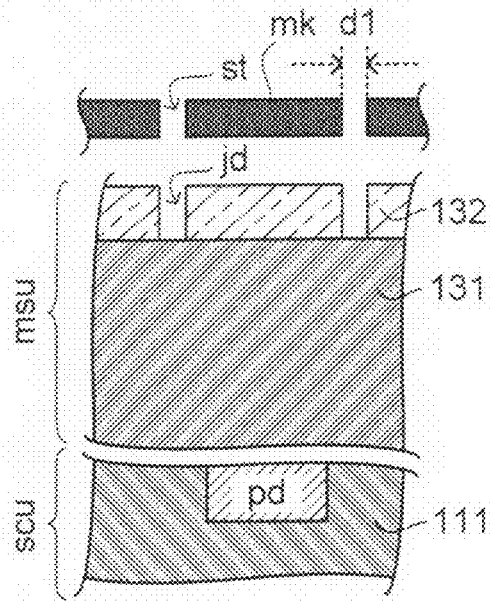
[FIG. 25B] A cross-sectional view showing the process for fabricating the image sensor shown in FIG. 22, with the image sensor seen from the same direction as FIG. 23B.
Figure 25C:
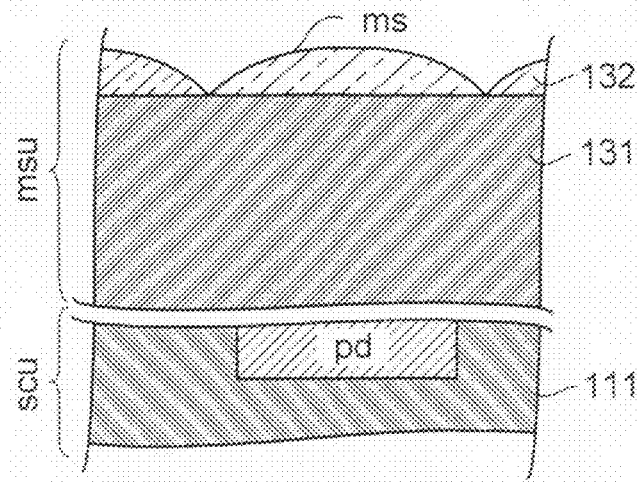
[FIG. 25C] A cross-sectional view showing the process for fabricating the image sensor shown in FIG. 22, with the image sensor seen from the same direction as FIG. 23A.
Figure 25D:
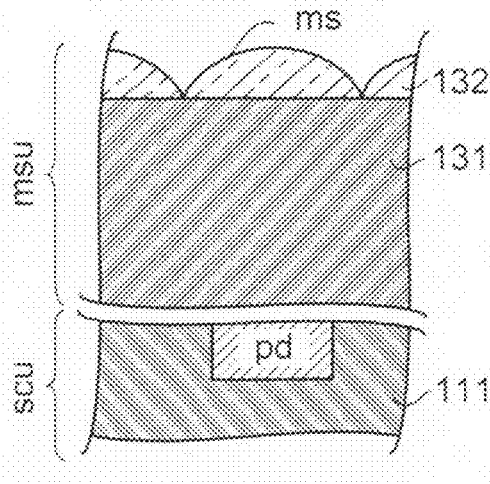
[FIG. 25D] A cross-sectional view showing the process for fabricating the image sensor shown in FIG. 22, with the image sensor seen from the same direction as FIG. 23B.
Figure 26B:
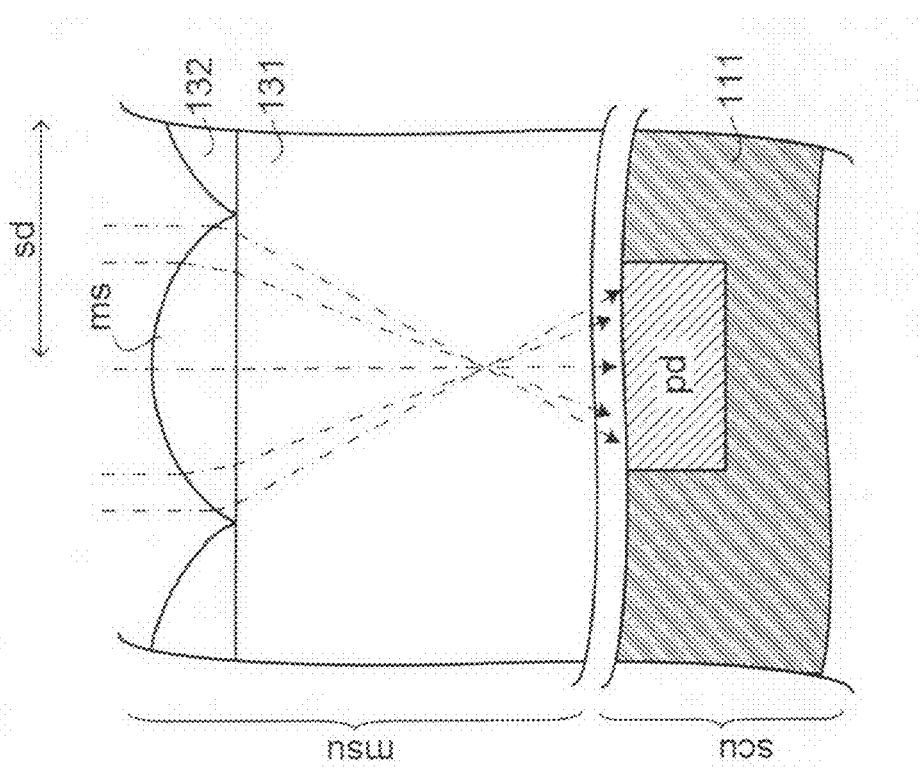
[FIG. 26B] An optical path diagram showing the optical path in the image sensor shown in FIG. 22, with the image sensor seen from the same direction as FIG. 23B.
Figure 26A:
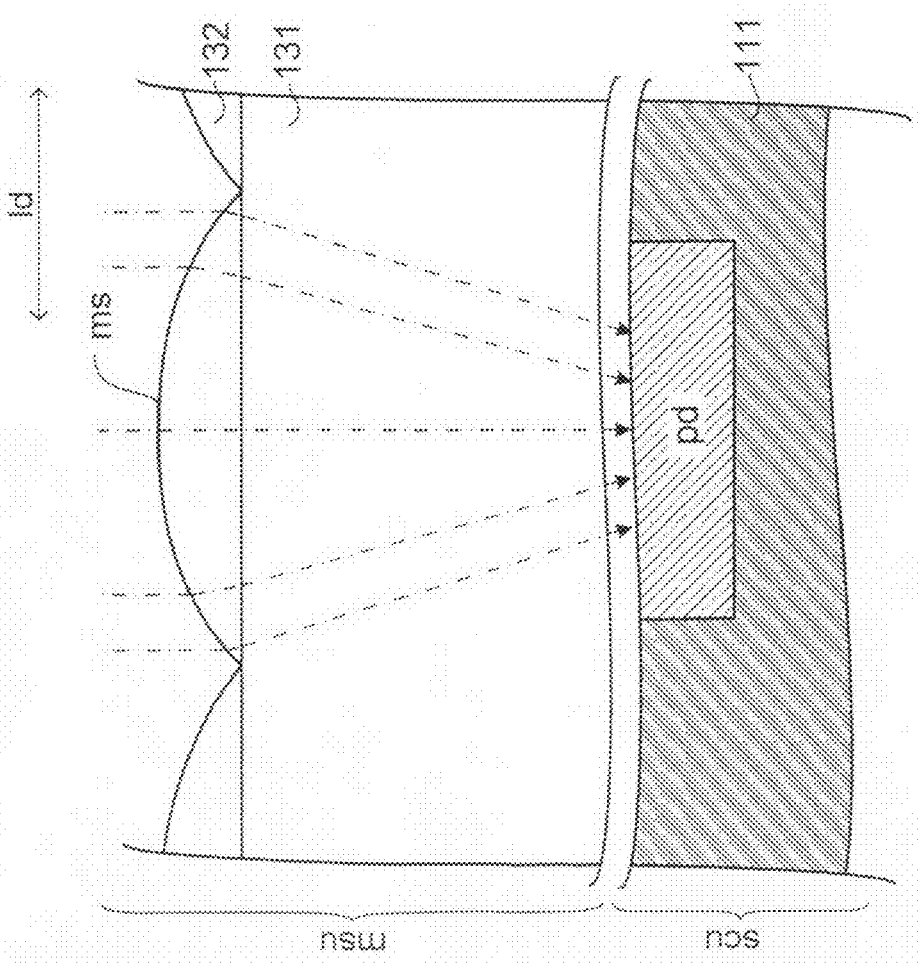
[FIG. 26A] An optical path diagram showing the optical path in the image sensor shown in FIG. 22, with the image sensor seen from the same direction as FIG. 23A.
Figure 27:
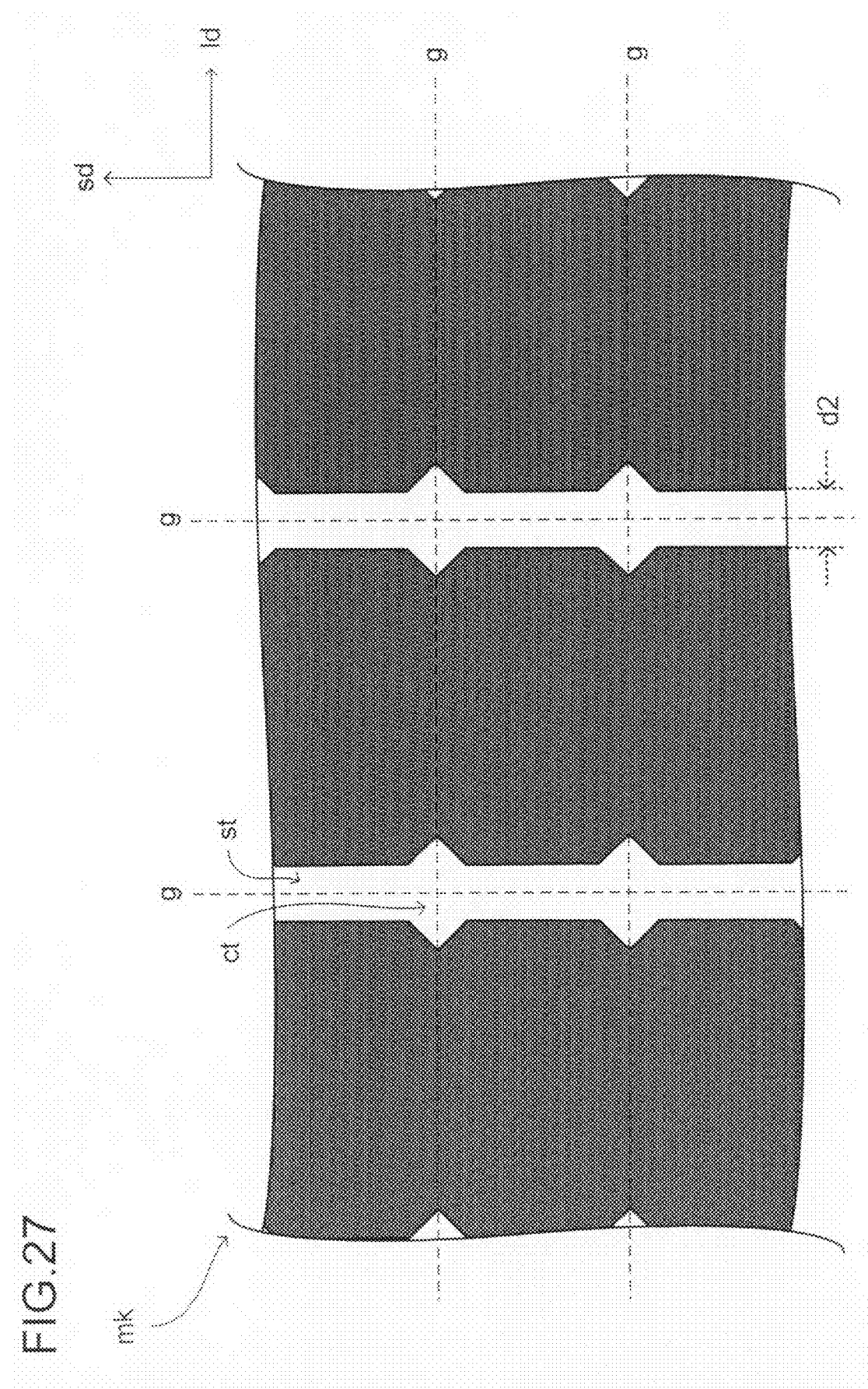
[FIG. 27] A plan view of the mask used in the process for fabricating a conventional image sensor.
Figure 28A:
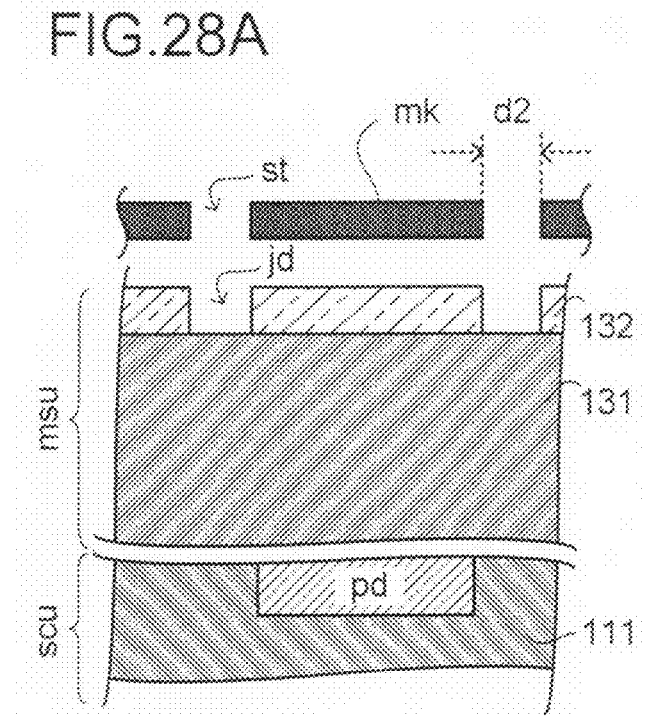
[FIG. 28A] A cross-sectional view showing the process for fabricating the image sensor using the mask shown in FIG. 27, with the image sensor seen from one direction.
Figure 28B:
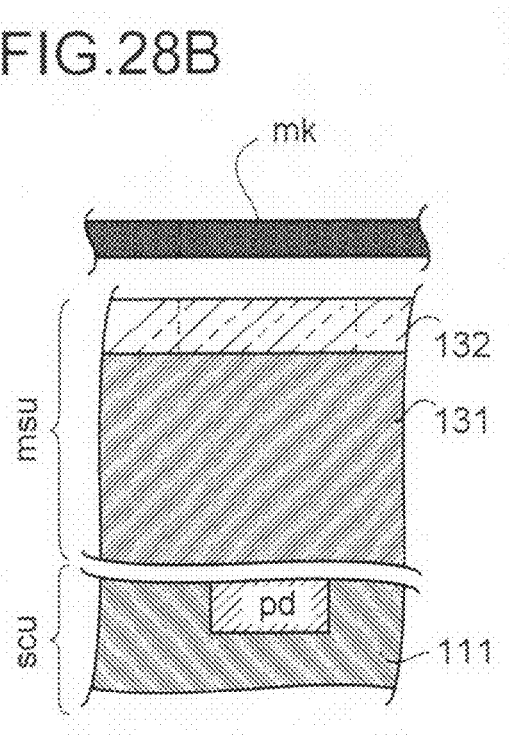
[FIG. 28B] A cross-sectional view showing the process for fabricating the image sensor using the mask shown in FIG. 27, with the image sensor seen from a different direction from FIG. 28A.
Figure 28C:
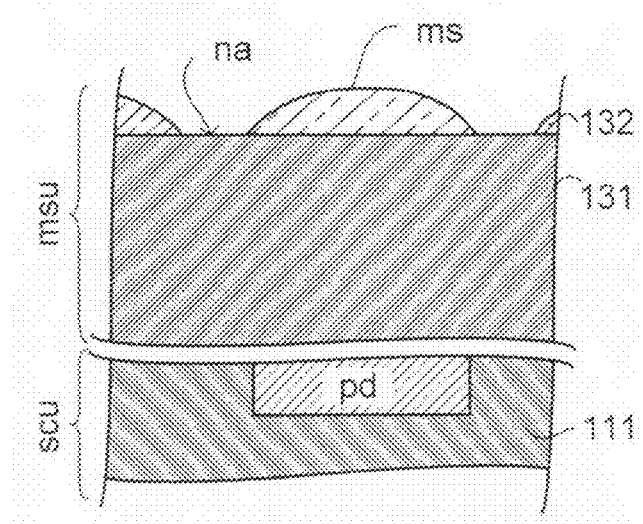
[FIG. 28C] A cross-sectional view showing the process for fabricating the image sensor using the mask shown in FIG. 27, with the image sensor seen from one direction.
Figure 28D:
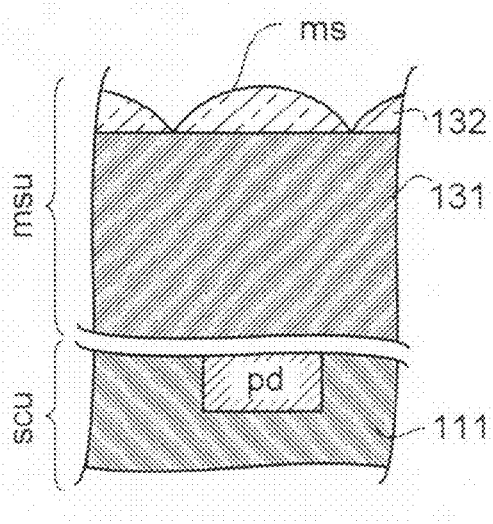
[FIG. 28D] A cross-sectional view showing the process for fabricating the image sensor using the mask shown in FIG. 27, with the image sensor seen from a different direction from FIG. 28C.
Figure 29A:
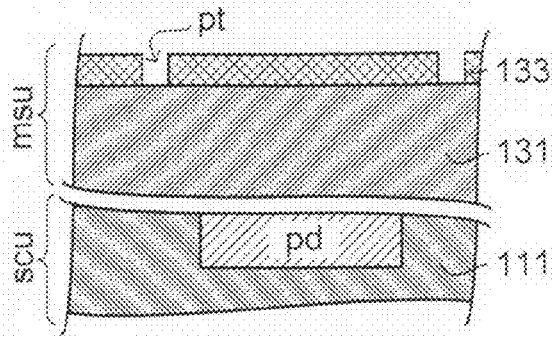
[FIG. 29A] A cross-sectional view showing a step in a conventional process for fabricating an image sensor.
Figure 29B:
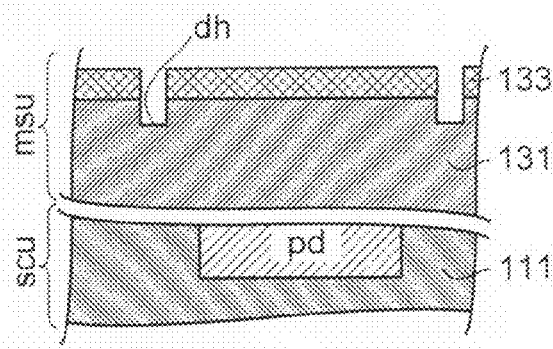
[FIG. 29B] A cross-sectional view showing a step in the conventional process for fabricating an image sensor.
Figure 29C:
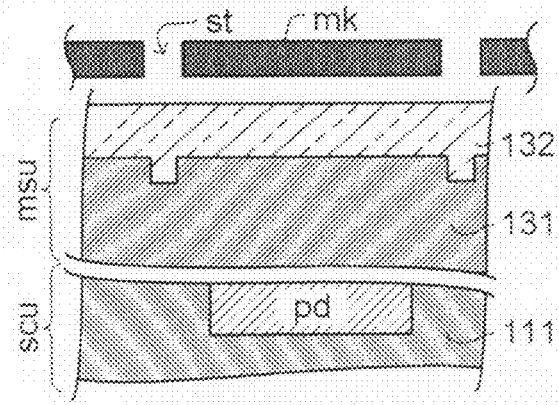
[FIG. 29C] A cross-sectional view showing a step in the conventional process for fabricating an image sensor.
Figure 29D:
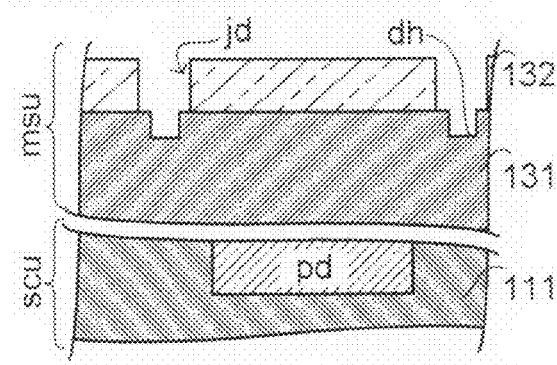
[FIG. 29D] A cross-sectional view showing a step in the conventional process for fabricating an image sensor.
Figure 29E:
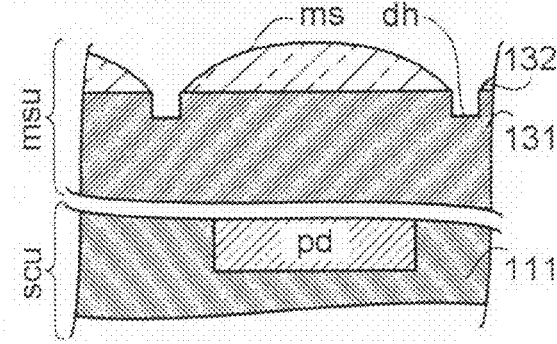
[FIG. 29E] A cross-sectional view showing a step in the conventional process for fabricating an image sensor.
Figure 29F:
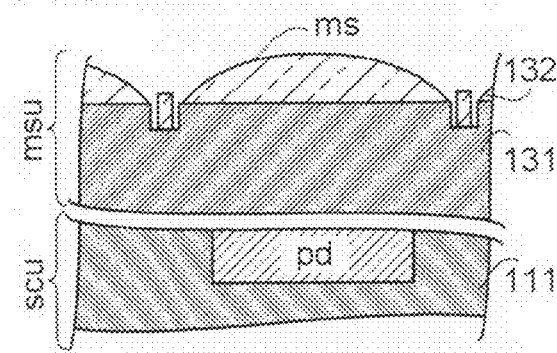
[FIG. 29F] A cross-sectional view showing a step in the conventional process for fabricating an image sensor.
Figure 29G:
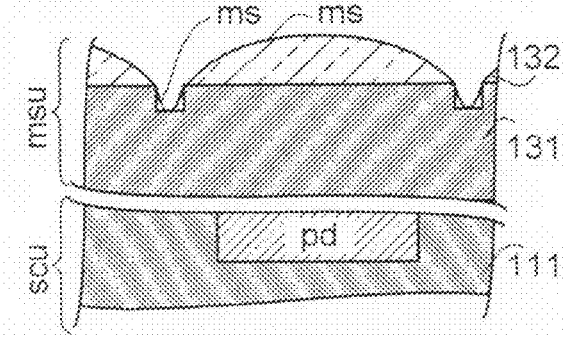
[FIG. 29G] A cross-sectional view showing a step in the conventional process for fabricating an image sensor.
Figure 31A:
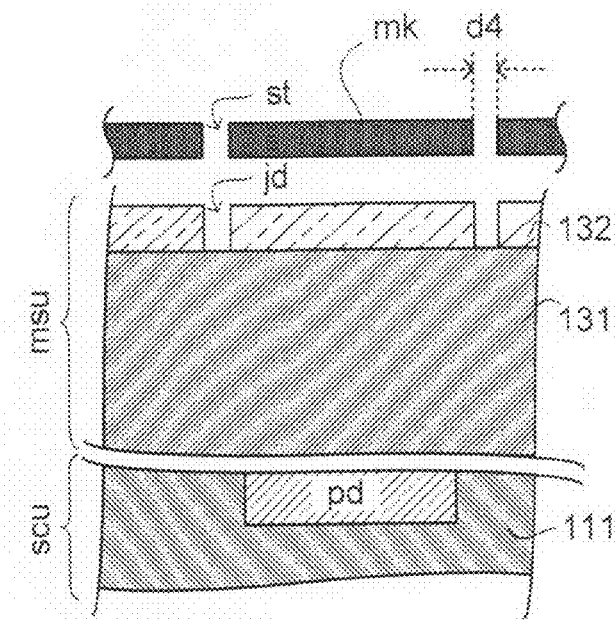
[FIG. 31A] A cross-sectional view showing the process for fabricating the image sensor using the mask shown in FIG. 30, with the image sensor seen from one direction.
Figure 31B:
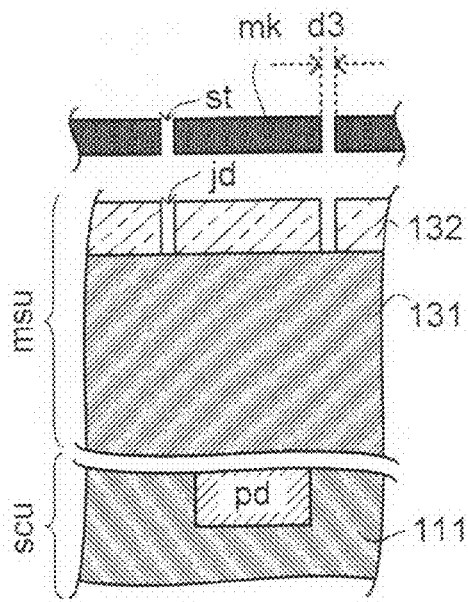
[FIG. 31B] A cross-sectional view showing the process for fabricating the image sensor using the mask shown in FIG. 30, with the image sensor seen from a different direction from FIG. 31A.
Figure 31C:
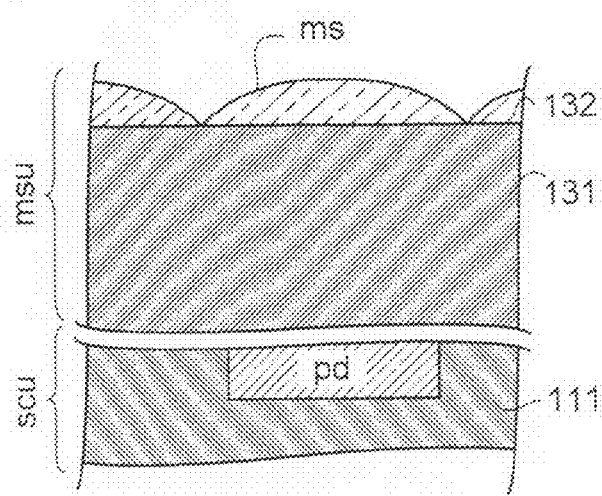
[FIG. 31C] A cross-sectional view showing the process for fabricating the image sensor using the mask shown in FIG. 30, with the image sensor seen from one direction.
Figure 31D:
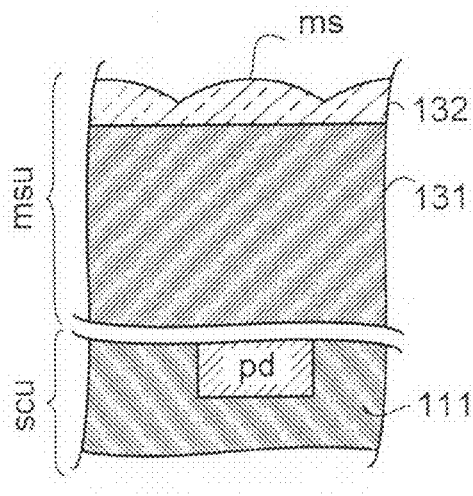
[FIG. 31D] A cross-sectional view showing the process for fabricating the image sensor using the mask shown in FIG. 30, with the image sensor seen from a different direction from FIG. 31C.
Figure 32:
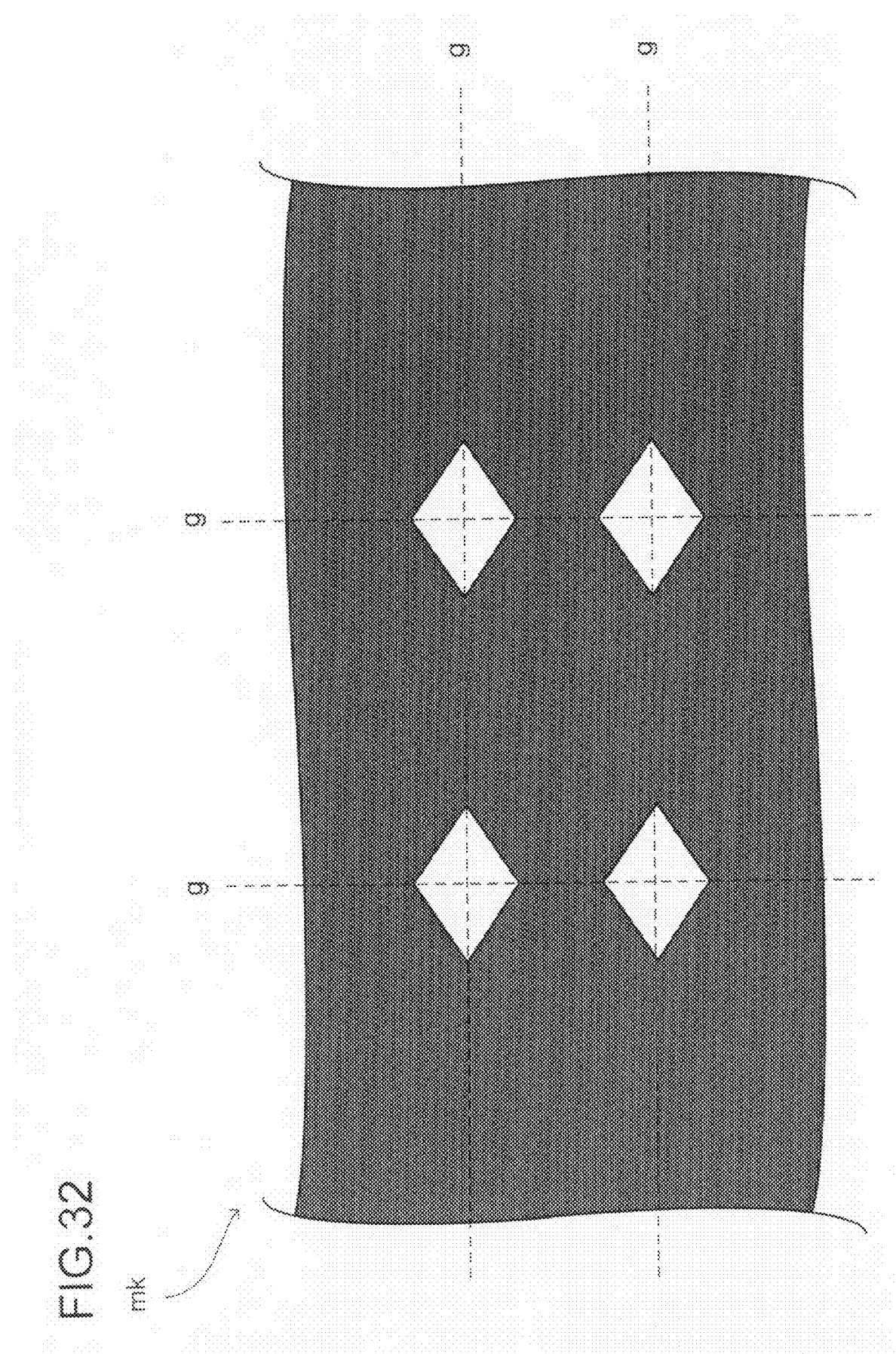
[FIG. 32] A plan view of the mask used in a conventional fabrication process different from the one shown in FIG. 31.
Figure 33A:
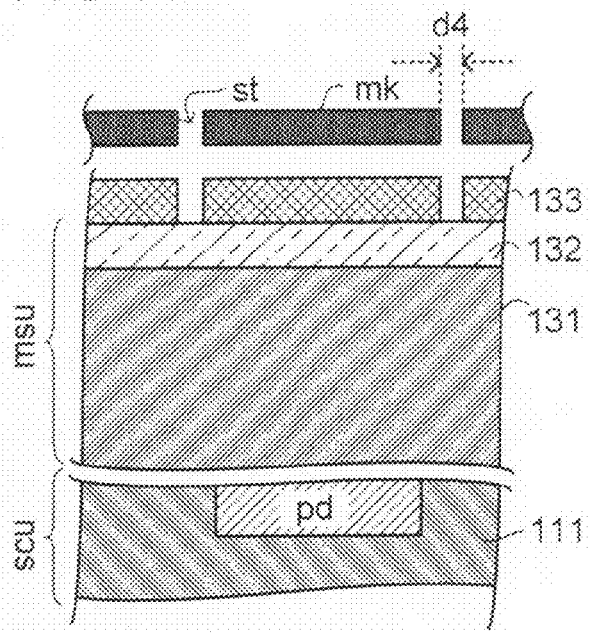
[FIG. 33A] A cross-sectional view showing a step in yet another conventional process for fabricating an image sensor.
Figure 33B:
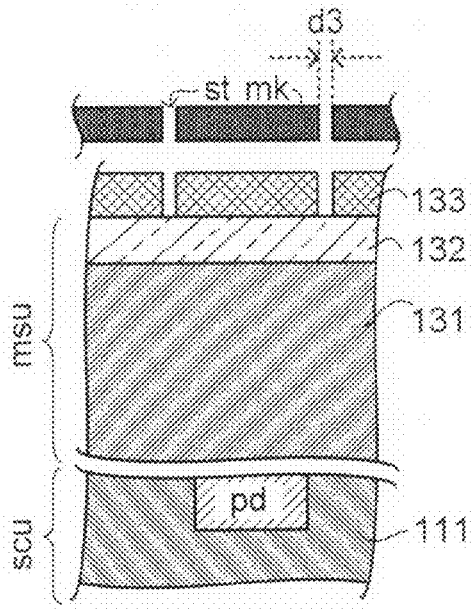
[FIG. 33B] A cross-sectional view showing a step in the conventional process for fabricating an image sensor.
Figure 33C:
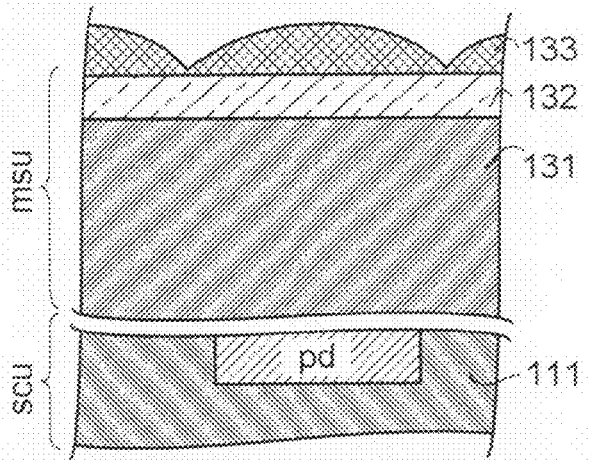
[FIG. 33C] A cross-sectional view showing a step in the conventional process for fabricating an image sensor.
Figure 33D:
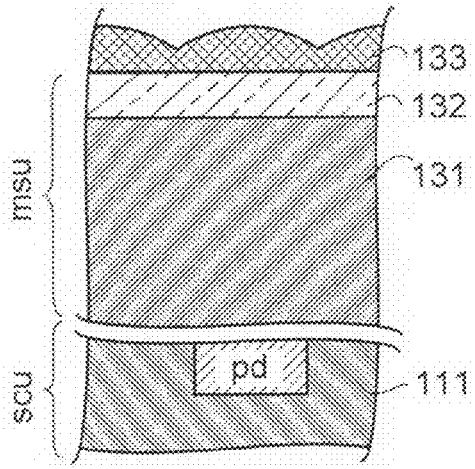
[FIG. 33D] A cross-sectional view showing a step in the conventional process for fabricating an image sensor.
Figure 33E:
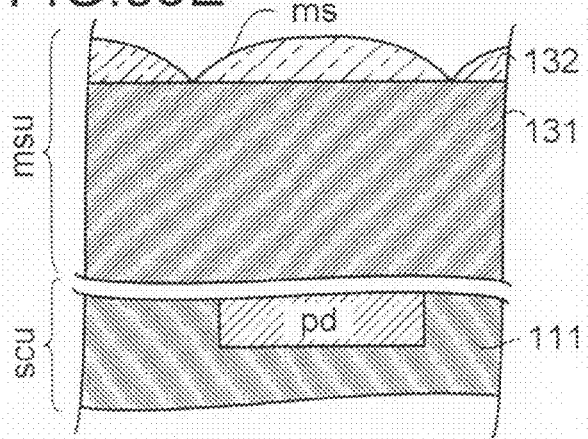
[FIG. 33E] A cross-sectional view showing a step in the conventional process for fabricating an image sensor.
Figure 33F:
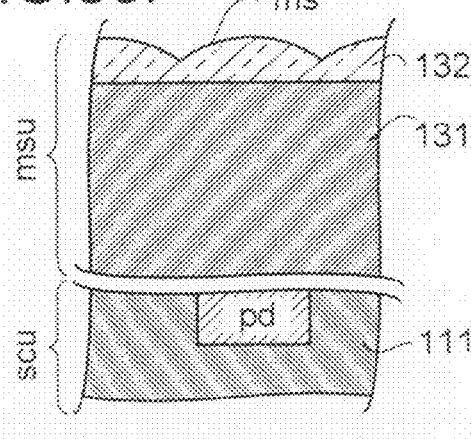
[FIG. 33F] A cross-sectional view showing a step in the conventional process for fabricating an image sensor.
Figure 34A:
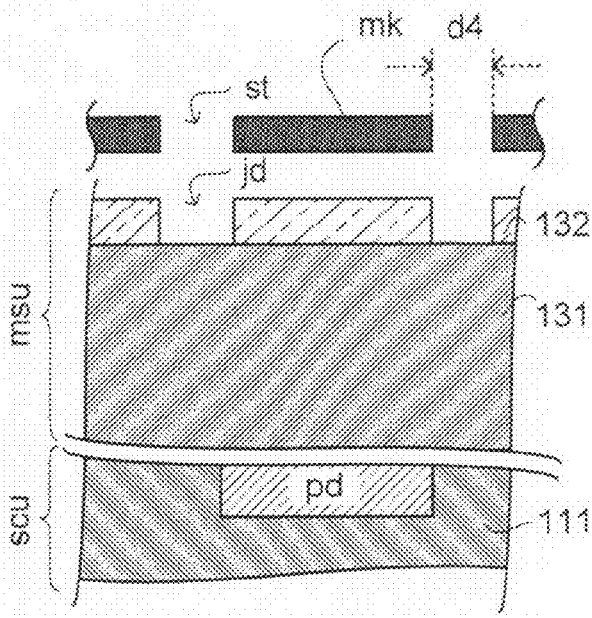
[FIG. 34A] A cross-sectional view showing a case where the slits in the mask shown in FIG. 30 is excessively large.
Figure 34B:
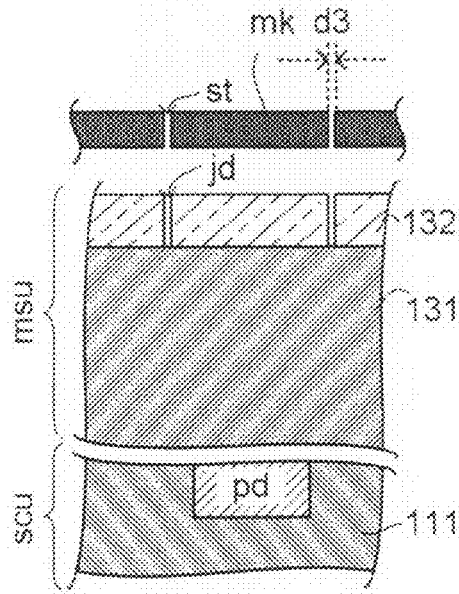
[FIG. 34B] A cross-sectional view showing a case where the slits in the mask shown in FIG. 30 is excessively small.
Figure 34C:
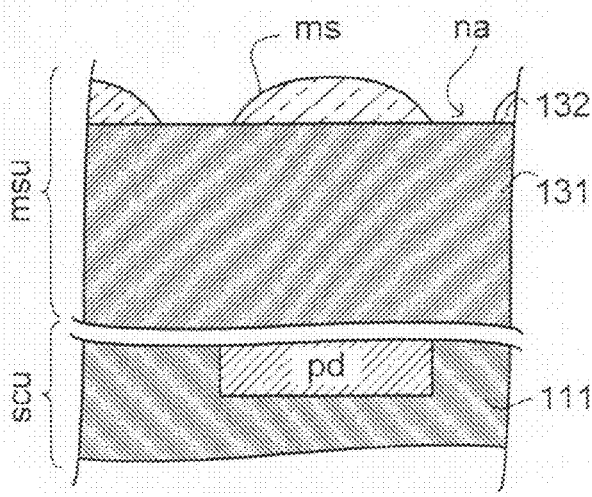
[FIG. 34C] A cross-sectional view showing the fabrication process using the mask shown in FIG. 34A.
Figure 34D:
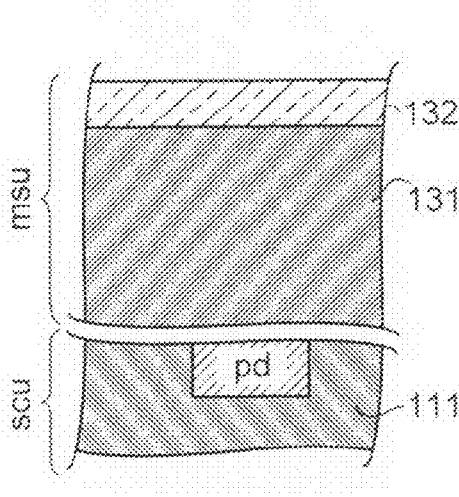
[FIG. 34D] A cross-sectional view showing the fabrication process using the mask shown in FIG. 34B.

For example, as shown in FIGS. 20A and 20B (corresponding to FIGS. 5A and 5B) and in FIGS. 21A and 21B (corresponding to FIGS. 8A and 8B), in the flattening film 31, trenches DH may be formed that have different areas at their bottom and at their open top. Taper-shaped trenches (tapered trenches) DH like these can be formed by performing isotropic etching in the trench formation step in which the flattening film 31 is etched. That is, by isotropic etching, the trenches DH are so formed that their width at their open top is larger than the width of the removed ditches JD and in addition larger than the width of the trenches DH at their bottom.

With this design, the edges of the trenches DH at their open top do not overlap with the edges of the portions of the lens material film 32 supported on the elevations BG, and the edges of the trenches DH at their open top extend (protrude) toward the center of the surface of the elevations BG. Thus, when the edges of the portions of the lens material film 32 supported on the elevations BG are melted in the microlens formation step, they readily flow into the trenches DH. This ensures that the lens material film 32 flows into the trenches DH.

Since the thus fabricated microlenses MS (e.g., convex lenses) are arrayed, a method for fabricating microlenses that involves a microlens formation step may be called a method for fabricating a microlens array. Also, a method for fabricating a microlens unit MSU including microlenses MS and a flattening film 31 (and hence a method for fabricating an image sensor DVE) includes a microlens formation step. Thus, the following can be said.

A method for fabricating a microlens unit having a lens material film formed into microlenses and a flattening film supporting the lens material film includes: a lens material film forming step in which a lens material is applied to the flattening film to form the lens material film; a removed ditch formation step in which, through a mask with slits, the lens material film is exposed and developed to form removed ditches in the surface of the lens material film; a trench formation step in which the portions of the flattening film located under the removed ditches are etched away to form trenches; and a microlens formation step in which, by application of heat, the lens material film is melted to flow into the trenches in the flattening film so that the lens material film is formed into microlenses.

In the removed ditch formation step, it is preferable to use a mask having slits with a plurality of widths (see FIGS. 3 and 12).

Moreover, in the removed ditch formation step, it is preferable that the mask have the slits formed along each other such that different slit widths occur alternately (see the horizontal direction HD in FIG. 3). In addition, in the removed ditch formation step, in a direction different from the direction in which the slits having the different widths are formed along each other such that the different slit widths occur alternately, slits having a still different slit width may be formed along each other (see the horizontal direction HD and the vertical direction VD in FIG. 3).

Moreover, in the removed ditch formation step, it is preferable that the mask have slits having a first slit width formed along each other in a first direction and have slits having a second slit width different from a first slit width formed along each other in a second direction different from the first direction (see FIG. 12).

In the trench formation step, the trenches in the flattening film may be given different depths. In addition, in the trench formation step, the trenches may be given the different depths according to their varying trench widths (see FIGS. 13A and 13B and FIGS. 14A and 14B). In the trench formation step, the trenches in the flattening film may be given different volumes (see FIGS. 5A and 5B and FIGS. 8A and 8B).

In the trench formation step, by isotropic etching, trenches may be formed with a width larger than the width of the removed ditches in the lens material film (see FIGS. 20A and 20B and FIGS. 21A and 21B).

A microlens unit in which a lens layer having microlenses is formed over elevations and trenches formed adjoining each other in the surface of a primary layer supported on a substrate can also be expressed as follows. In such a microlens unit, at least part of the edges of the microlenses supported on the elevations can be said to overlap with the trenches in the direction perpendicular to the surface of the primary layer In this microlens unit, the trenches are sufficiently filled by the lens layer. Thus, even if the trenches are extremely narrow, they do not produce a region where no microlenses exist (a non-lens region).

In particular, it is preferable that the trenches have different widths, and that, as measured in a cross-section including the direction of the widths of the trenches and the direction perpendicular to the surface of the primary layer, the displacements of the edges of the microlenses supported on the elevations adjoining the trenches from the substrate differ in reverse proportion to the different widths. That is, where the trenches have different widths, it is preferable that the displacements of part of the edges of the microlenses from the substrate be increasingly large as the trench widths are increasingly small.

With this design, the microlenses have their edges located at different heights above the substrate, which provides the reference level; thus, the microlenses have a plurality of curvatures. With these curvatures, the microlenses can direct light to desires positions (light-receiving portions or the like). That is, since the lens layer surely flows into the trenches in the primary layer, no non-lens regions are formed in the microlens unit; thus, the fabricated microlenses have desired curvatures to condense incoming light at desired positions.

The trenches in the primary layer may have different depths according to the different widths thereof. Alternatively, it is preferable that the trenches have different depths, and that, as measured in a cross-section including the direction of the widths of the trenches and the direction perpendicular to the surface of the primary layer, the displacements of the edges of the microlenses supported on the elevations adjoining the trenches from the substrate differ in reverse proportion to the different depths.

Alternatively, it is preferable that the trenches have different volumes, and that, as measured in a cross-section including the direction of the widths of the trenches and the direction perpendicular to the surface of the primary layer, the displacements of the edges of the microlenses supported on the elevations adjoining the trenches from the substrate differ in reverse proportion to the different volumes.

Also within the scope of the present invention is an image sensor provided with microlenses as described above and light-receiving portions provided one for each of the microlenses supported on elevations.

In this image sensor, it is preferable that, if, as measured in a cross-section including the direction of the widths of the trenches and the direction perpendicular to the surface of the primary layer, the margins from the border planes between the pixels corresponding to the microlenses supported on the elevations to the light-receiving portions differ, the displacements differ in reverse proportion to the different margins.

The margins affect the refractive power (optical power) that the microlenses need to have in order to condense light incident on the pixels toward the light-receiving portions. Where the margins are comparatively small, the microlenses have only to refract light comparatively weakly; where the margins are comparatively large, the microlenses have to refract light comparatively strongly.

On the other hand, the displacements affect the curvature of the microlenses. So long as the microlenses have a fixed axial thickness, the larger the displacements, the gentler the curvature of the curved surfaces (low-powered curved surfaces); the smaller the displacements, the sharper the curvature of the curved surfaces (high-powered curved surfaces).

Thus, in a case where the margins differ among them, the displacements are made to differ in reverse proportion to the margins. Then, where the margins are comparatively small, the displacements are comparatively large, and thus low-power curved surfaces are formed that refract light weakly; where the margins are comparatively large, the displacements are comparatively small, and thus high-power curved surfaces are formed that refract light strongly. Consequently, the image sensor efficiently directs incoming light to the light-receiving portions.

It is preferable that the trenches having the different widths be formed along each other such that the different widths occur alternately. With this design, the portions of the lens layer supported on the elevations adjoining the larger and smaller trench widths are formed into microlenses having curvatures depending on the larger and smaller trench widths.

It is also preferable that, in a direction different from (e.g., in the direction perpendicular to) the direction in which the trenches having the different widths are formed along each other such that the different widths occur alternately, trenches having a still different width be formed along each other. With this design, the elevations adjoining the larger and smaller trench widths also adjoin the still different trench width. In this way, microlenses having at least three different curvatures are fabricated.

Alternatively, it is preferable that the trenches having the different widths be grouped into first trenches having one width and second trenches having another width, the first trenches being formed along each other in a first direction and the second trenches being formed along each other in a second direction different from (e.g., in the direction perpendicular to) the first direction. Then, the fabricated microlenses have different curvatures, for example, in different directions that cross each other. In this way, microlenses having different curvatures in different directions that cross each other are fabricated.

The invention claimed is:

1. A process for producing an image sensor, comprising, at least:
   a lens material film formation step in which a lens material is applied to a primary layer supported on a substrate to form a lens material film;
   a removed ditch formation step in which removed ditches are formed in the lens material film;
   a trench formation step in which etching is performed on the lens material film by using the lens material film having the removed ditches formed therein as a pattern mask to thereby form in the primary layer trenches corresponding to the removed ditches; and
   a microlens formation step in which portions of the lens material film supported on elevations, the elevations being portions of the primary layer in which the removed ditches are not formed, are melted by heat so that part of the lens material film flows along side walls of the trenches into the trenches to change a shape of the portions of the lens material film supported on the elevations and thereby form microlenses.

2. The process for producing an image sensor according to claim 1 wherein the lens material is an acrylic organic material.

3. The process for forming an image sensor according to claim 1,
   wherein, in the microlens formation step, portions of the lens material film located at a surface thereof and forming edges of the portions thereof supported on the elevations are made to flow along the side walls of the trenches into the trenches so that the portions of the lens material film supported on the elevations have a smaller thickness at the edges thereof than at a center of a surface of the elevations.

4. The process for producing an image sensor according to claim 1,
   wherein the trenches formed in the primary layer have a plurality of different widths; and
   wherein the trenches having the different widths are formed along each other such that the different widths occur alternately.

5. The process for producing an image sensor according to claim 4,
   wherein, in a direction different from a direction in which the trenches are formed along each other such that the different trench widths occur alternately, trenches having a still different width are formed along each other.

6. The process for producing an image sensor according to claim 1,
- wherein the trenches formed in the primary layer have a plurality of different widths; and
- wherein the trenches having the different widths are grouped into first trenches having one width and second trenches having another width, the first trenches being formed along each other in a first direction and the second trenches being formed along each other in a second direction different from the first direction.

7. The process for producing an image sensor according to claim 1,
- wherein, in the microlens formation step, the widths of the trenches are so set that the part of the lens material film that flows into the trenches flows thereinto along side walls of the trenches toward a center of a bottom of the trench and that a thickness of the lens material film that stays at the center of the bottom is smaller than a thickness of the lens material film that stays at edges of the bottom.

8. The process for producing an image sensor according to claim 4,
- wherein the trenches formed in the primary layer have different depths that are proportional to the different widths thereof.

9. The process for producing an image sensor according to claim 1,
- wherein the trenches formed in the primary layer have a plurality of different depths.

10. The process for producing an image sensor according to claim 1,
- wherein the trenches formed in the primary layer have a plurality of different volumes.

11. The process for producing an image sensor according to claim 1,
- wherein edges of open tops of the trenches are made to extend toward a center of a surface of the elevations so that the edges of the open tops of the trenches do not overlap with edges of the portions of the lens material film supported on the elevations.

* * * * *